United States Patent
Guhathakurta et al.

(10) Patent No.: US 11,545,614 B2
(45) Date of Patent: Jan. 3, 2023

(54) IONIC POLYMER COMPOSITIONS

(71) Applicant: Sabic Global Technologies, B.V., Bergen Op Zoom (NL)

(72) Inventors: Soma Guhathakurta, Bangalore (IN); Anantharaman Dhanabalan, Bangalore (IN); Venkata Ramanarayanan Ganapathy Bhotla, Bangalore (IN); Yogesha Subbaiah, Bangalore (IN)

(73) Assignee: Sabic Global Technologies, B.V., Bergen op Zoom (NL)

(*) Notice: Subject to any disclaimer, the term of this patent is extended or adjusted under 35 U.S.C. 154(b) by 734 days.

(21) Appl. No.: 16/458,514

(22) Filed: Jul. 1, 2019

(65) Prior Publication Data

US 2020/0013945 A1    Jan. 9, 2020

Related U.S. Application Data

(60) Provisional application No. 62/693,624, filed on Jul. 3, 2018.

(51) Int. Cl.
| | |
|---|---|
| *H01L 41/193* | (2006.01) |
| *H01L 41/113* | (2006.01) |
| *H01L 41/45* | (2013.01) |
| *C08F 20/14* | (2006.01) |
| *C08K 5/52* | (2006.01) |
| *C08K 5/55* | (2006.01) |
| *C08K 5/098* | (2006.01) |
| *G06F 3/044* | (2006.01) |
| *F03G 7/00* | (2006.01) |
| *G06F 3/01* | (2006.01) |

(52) U.S. Cl.
CPC ........... *H01L 41/193* (2013.01); *C08F 20/14* (2013.01); *C08K 5/098* (2013.01); *C08K 5/5205* (2013.01); *C08K 5/55* (2013.01); *H01L 41/1132* (2013.01); *H01L 41/45* (2013.01); *F03G 7/005* (2013.01); *G06F 3/016* (2013.01); *G06F 3/044* (2013.01)

(58) Field of Classification Search
CPC ... H01L 41/193; H01L 41/1132; H01L 41/45; C08F 20/14; C08K 5/5205; C08K 5/098; C08K 5/55; F03G 7/005
See application file for complete search history.

(56) References Cited

U.S. PATENT DOCUMENTS

| | | |
|---|---|---|
| 7,411,716 B2 | 8/2008 | Oh et al. |
| 8,790,537 B2 | 7/2014 | Ahmad et al. |
| 8,915,975 B2 | 12/2014 | Le Bideau et al. |
| 2012/0211732 A1* | 8/2012 | Haik .................. H01L 51/0067 257/E51.027 |

FOREIGN PATENT DOCUMENTS

| | | |
|---|---|---|
| JP | 2011009499 A | 1/2011 |
| JP | 2011009568 A | 1/2011 |
| JP | 2011009569 A | 1/2011 |
| WO | 2017072650 A1 | 5/2017 |

OTHER PUBLICATIONS

Susan et al., JACS, 2005 vol. 127, pp. 4976-4983 (Year: 2005).*
Of Wang et al., Ionic liquid induced ferroelectric polarization in poly(vinylidene fluoride) thin films, Applied Physics Letters 100, Jun. 29, 2003 (2012) (Year: 2012).*
Filing Receipt and Specification for provisional patent application entitled "Ionic Polymer Compositions," by Soma Guhathakurta, et al., filed Jul. 3, 2018 as U.S. Appl. No. 62/693,624.
Airimioaei, M., et al., "Effect of particle size and volume fraction of BaTiO$_3$, powders on the functional properties of BaTiO$_3$/poly($\varepsilon$-caprolactone) composites," Materials Chemistry and Physics, 2016, pp. 246-255, vol. 182, Elsevier, B.V.
Song, Yu, et al., "Improving the dielectric constants and breakdown strength of polymer composites: effects of the shape of the BaTiO$_3$, nanoinclusions, surface modification and polymer matrix," Journal of Materials Chemistry, 2012, pp. 16491-16498, vol. 22, The Royal Society of Chemistry.
Stewart, M., et al., "Ferroelectric Hysteresis Measurement & Analysis," NPL Report CMMT(A) 152, May 1999, 57 pages, Crown.
Susan, Md. Abu Bin Hasan, et al., "Ion Gels Prepared by in Situ Radical Polymerization of Vinyl Monomers in an Ionic Liquid and Their Characterization as Polymer Electrolytes," Journal of the American Chemical Society, Mar. 11, 2005, pp. 4976-4983, vol. 127, No. 13, American Chemical Society.
Wang, Feipeng, et al., "Ionic-liquid-induced ferroelectric polarization in poly(vinylidene fluoride) thin films," Applied Physics Letters, Feb. 8, 2012, vol. 100, Jun. 29, 2003, 4 pages, American Institute of Physics.

* cited by examiner

*Primary Examiner* — Robert D Harlan
(74) *Attorney, Agent, or Firm* — Rodney B. Carroll; Conley Rose, P.C.

(57) ABSTRACT

A dielectric polymeric composition comprising a polymeric matrix comprising structural units derived from a polymerizable vinyl monomer; an ionic liquid comprising an organic cation and a balancing anion, wherein the ionic liquid is miscible or partially miscible with the polymerizable vinyl monomer, and wherein the concentration of ionic liquid in dielectric polymeric composition ranges from 0.5 to 30 wt. %; and less than 10 ppm of unreacted polymerizable vinyl monomer, based on the total weight of the composition, wherein an amount of unreacted polymerizable vinyl monomer in the composition is measured via HPLC. The polymeric matrix further comprises structural units derived from a polymerizable co-monomer comprising a functional group that has the ability to form hydrogen bonds within the polymeric matrix. The polymeric matrix further comprises a crosslinking agent, and wherein the polymeric matrix comprises covalent crosslinks between the crosslinking agent and the structural units derived from the polymerizable vinyl monomer.

18 Claims, 12 Drawing Sheets

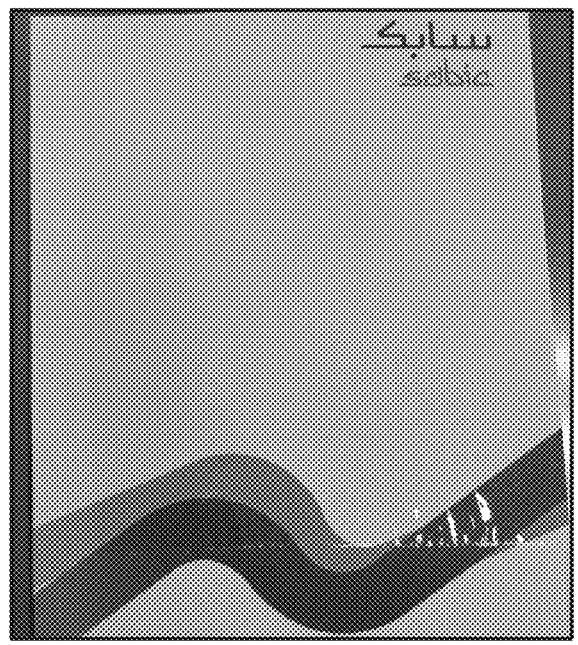
FIG. 2A1
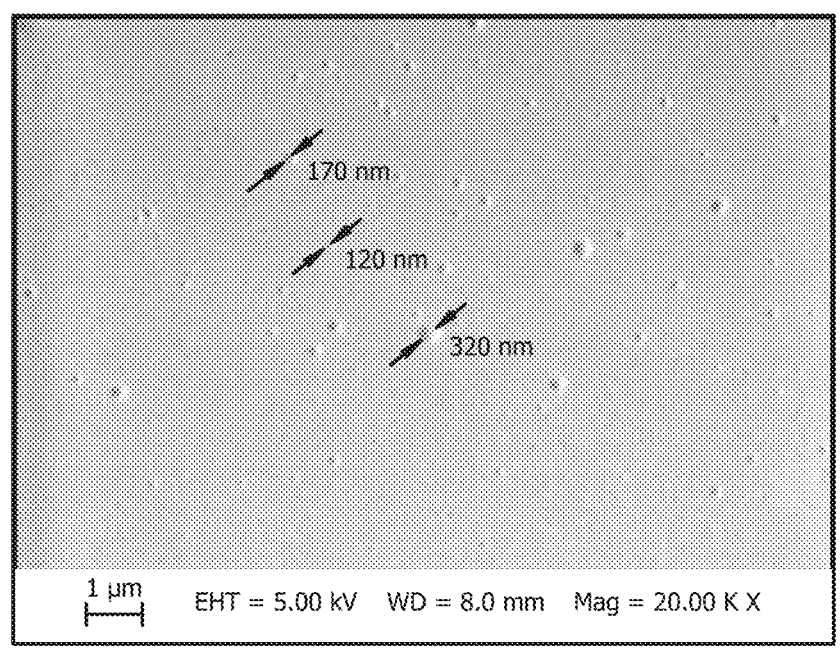
FIG. 2A2

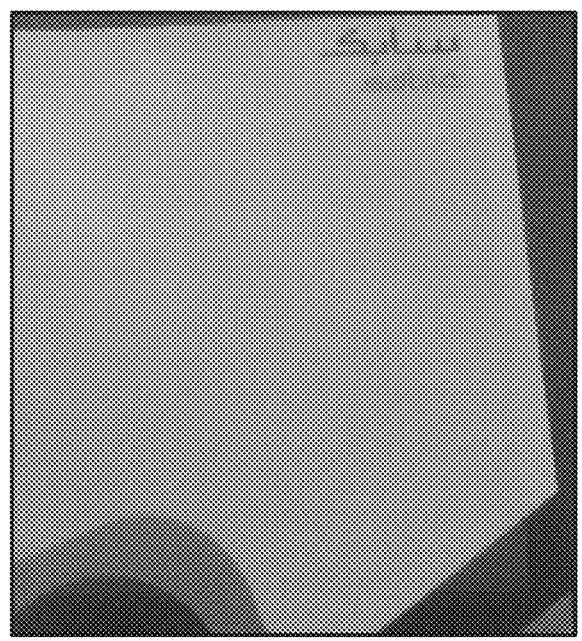
FIG. 2B1
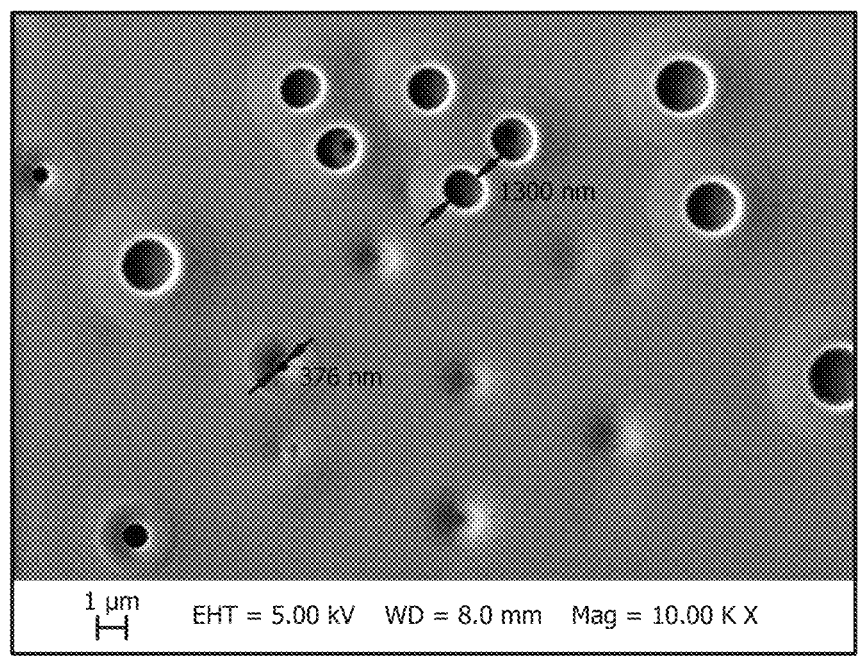
FIG. 2B2

IONIC POLYMER COMPOSITIONS

CROSS REFERENCE TO RELATED APPLICATIONS

This application claims the benefit of U.S. Provisional Application No. 62/693,624 filed Jul. 3, 2018, entitled "Ionic Polymer Compositions," which is incorporated by referenced herein in its entirety.

TECHNICAL FIELD

The present disclosure relates to dielectric materials, more specifically ferroelectric composite materials and methods of making same.

BACKGROUND

Piezoelectric materials are key components of electromechanical transducers (sensors and actuators) for automatic control systems, as well as measurement and monitoring systems. Ferroelectric materials (a subset of piezoelectric materials) can be found in a wide range of applications, such as sensors actuators, transducers, and electronic devices (e.g., nonvolatile memory); which in turn connects the use of ferroelectric materials to industry segments such as consumer electronics, healthcare, transportation (e.g., aviation), etc. As a result, ferroelectricity has been the focus of research over last several decades and continues to dominate the material research world. Most commercial applications of ferroelectric materials are based on inorganic piezoceramics (e.g., lead zirconate titanate (PZT), barium titanate), despite the fact that these inorganic piezoceramics are heavy, brittle and pose a variety of challenges, such as lead toxicity, low achievable strain under external electric field, as well as difficult and expensive processability. In addition, severe processing conditions, such as high temperatures (>500° C.) used to process inorganic ferroelectric materials into thin layers onto substrates, limits the choice of substrate materials. These high processing temperatures can further cause serious issues for certain applications, such as degradation of data retention characteristics in ferroelectric memory. Further, inorganic piezoceramics are difficult and expensive to produce on a commercial scale.

Ferroelectric polymers can offer several advantages, which include mechanical flexibility, light weight, low processing temperatures, and ease of processing to achieve complex shapes. Despite such advantages over ceramic materials, the ferroelectric polymers generally suffer from lower ferroelectric response compared to inorganic piezoceramics, and further require a high electric field. Examples of ferroelectric polymers are polyvinylidene fluoride (PVDF) and its copolymers and terpolymers. PVDF is a semicrystalline polymer; which is polymorphic in nature, having four crystal phases ($\alpha$, $\beta$, $\gamma$, $\delta$), out of which the polar $\beta$ phase is responsible for ferroelectricity and piezoelectricity. In the case of a free standing PVDF film, the $\beta$ phase can be obtained by mechanical stretching, which cannot be used in conjunction with film deposition on a substrate. The use of polar solvents for casting thin films on a substrate could lead to the PVDF $\beta$ phase; however, such films are only stable at low drying temperatures (<50° C.), and such low drying temperatures lead to porous films with poor electrical properties. Vinylidene fluoride based piezoelectric polymers can solve some of the problems posed by the inorganic piezoceramics by offering mechanical flexibility and ease of processing. However, vinylidene fluoride based piezoelectric polymers are also limited owing to their low piezoelectric response and requirement for high input voltage.

Ionic liquids have been used in polymer matrices for developing polymer electrolytes that operate in the electronically conducting region.

Ionic electroactive polymers (EAP) (conductive polymers) based on ion gels have been used in ionic EAP actuators, owing to low input voltage requirement. While ionic EAPs need low voltage for activation (e.g., 1 to 2 V), they suffer in response speed due to the migration of ions.

The use of ionic liquids in polymers with the purpose of producing ferroelectric polymers has led to materials with a high polarization loss (leakage). Thus, there is an ongoing need for the development of ferroelectric materials with improved ferroelectric properties and methods of making and using same.

BRIEF SUMMARY

Disclosed herein is a dielectric polymeric composition comprising (a) a polymeric matrix, wherein the polymeric matrix comprises structural units derived from at least one polymerizable vinyl monomer, (b) an ionic liquid, wherein the ionic liquid comprises an organic cation and a balancing anion, wherein the ionic liquid is miscible or partially miscible with the at least one polymerizable vinyl monomer, and wherein the concentration of the ionic liquid in the dielectric polymeric composition ranges from about 0.5 wt. % to about 30 wt. %, and (c) less than about 10 ppm of unreacted polymerizable vinyl monomer, based on the total weight of the dielectric polymeric composition, wherein an amount of unreacted polymerizable vinyl monomer in the dielectric polymeric composition is measured via high performance liquid chromatography (HPLC).

Further disclosed herein is a dielectric polymeric composition comprising (a) a polymeric matrix, wherein the polymeric matrix comprises structural units derived from at least one polymerizable vinyl monomer and a polymerizable co-monomer, and wherein the polymerizable co-monomer comprises at least one functional group that has the ability to form hydrogen bonds within the polymeric matrix, and (b) an ionic liquid, wherein the ionic liquid comprises an organic cation and a balancing anion, wherein the ionic liquid is miscible or partially miscible with the at least one polymerizable vinyl monomer, wherein the ionic liquid is miscible or partially miscible with the polymerizable co-monomer, and wherein the concentration of the ionic liquid in the dielectric polymeric composition ranges from about 0.5 wt. % to about 30 wt. %.

Also disclosed herein is a dielectric polymeric composition comprising (a) a crosslinked polymeric matrix, wherein the polymeric matrix comprises a crosslinking agent and structural units derived from at least one polymerizable vinyl monomer, and wherein the polymeric matrix comprises covalent crosslinks between the crosslinking agent and the structural units derived from at least one polymerizable vinyl monomer, and (b) an ionic liquid, wherein the ionic liquid comprises an organic cation and a balancing anion, wherein the ionic liquid is miscible or partially miscible with the at least one polymerizable vinyl monomer, and wherein the concentration of the ionic liquid in the dielectric polymeric composition ranges from about 0.5 wt. % to about 30 wt. %.

Also disclosed herein is a dielectric polymeric composition comprising (a) a polymeric matrix; wherein the polymeric matrix comprises structural units derived from at least one polymerizable vinyl monomer; wherein the polymeric matrix comprises a crosslinking agent, structural units derived from a polymerizable co-monomer, or both a crosslinking agent and structural units derived from a polymerizable co-monomer; wherein the crosslinking agent covalently crosslinks the polymeric matrix; and wherein the polymerizable co-monomer comprises at least one functional group that has the ability to form hydrogen bonds within the polymeric matrix, (b) an ionic liquid, wherein the ionic liquid comprises an organic cation and a balancing anion, wherein the ionic liquid is miscible or partially miscible with the at least one polymerizable vinyl monomer, wherein the ionic liquid is miscible or partially miscible with the polymerizable co-monomer, and wherein the concentration of the ionic liquid in the dielectric polymeric composition ranges from about 0.5 wt. % to about 30 wt. %, and (c) less than about 10 ppm of unreacted polymerizable vinyl monomer and unreacted polymerizable co-monomer, based on the total weight of the dielectric polymeric composition, wherein an amount of unreacted polymerizable vinyl monomer and unreacted polymerizable co-monomer in the dielectric polymeric composition is measured via high performance liquid chromatography (HPLC).

Also disclosed herein is a method for making a dielectric polymeric composition, the method comprising (a) subjecting a mixture comprising an ionic liquid and a polymerizable precursor comprising at least one polymerizable vinyl monomer to in situ polymerization conditions to form a precursor dielectric polymeric composition, wherein the ionic liquid comprises an organic cation and a balancing anion, wherein the precursor dielectric polymeric composition comprises a polymeric matrix, the ionic liquid, and unreacted polymerizable vinyl monomer, wherein the polymeric matrix comprises polymerized vinyl monomer, and wherein the ionic liquid is compatible or partially compatible with the polymeric matrix, and (b) removing at least a portion of the unreacted polymerizable vinyl monomer from the precursor dielectric polymeric composition to form the dielectric polymeric composition; wherein the dielectric polymeric composition comprises the polymeric matrix, the ionic liquid, and less than about 10 ppm of unreacted polymerizable vinyl monomer, based on the total weight of the dielectric polymeric composition, wherein an amount of unreacted polymerizable vinyl monomer in the dielectric polymeric composition is measured via high performance liquid chromatography (HPLC); and wherein the concentration of the ionic liquid in the dielectric polymeric composition ranges from about 0.5 wt. % to about 30 wt. %.

Also disclosed herein is a method for making a dielectric polymeric composition, the method comprising subjecting a mixture comprising an ionic liquid and a polymerizable precursor to in situ polymerization conditions to form a dielectric polymeric composition; wherein the ionic liquid comprises an organic cation and a balancing anion; wherein the polymerizable precursor comprises at least one polymerizable vinyl monomer and a polymerizable constituent; wherein the polymerizable constituent comprises a polymerizable co-monomer, a crosslinking agent, or both a polymerizable co-monomer and a crosslinking agent; wherein the dielectric polymeric composition comprises a polymeric matrix and the ionic liquid; wherein the polymeric matrix comprises polymerized vinyl monomer an optionally polymerized co-monomer; wherein the ionic liquid is compatible or partially compatible with the polymeric matrix; wherein the polymerizable co-monomer comprises at least one functional group that has the ability to form hydrogen bonds within the polymeric matrix; wherein the crosslinking agent covalently crosslinks the polymeric matrix; and wherein the concentration of the ionic liquid in the dielectric polymeric composition ranges from about 0.5 wt. % to about 30 wt. %.

Also disclosed herein is a method for making a dielectric polymeric composition, the method comprising (a) subjecting a mixture comprising an ionic liquid and a polymerizable precursor to in situ polymerization conditions to form a precursor dielectric polymeric composition; wherein the ionic liquid comprises an organic cation and a balancing anion; wherein the polymerizable precursor comprises at least one polymerizable vinyl monomer and a polymerizable constituent; wherein the polymerizable constituent comprises a polymerizable co-monomer, a crosslinking agent, or both a polymerizable co-monomer and a crosslinking agent; wherein the precursor dielectric polymeric composition comprises a polymeric matrix, the ionic liquid, unreacted polymerizable vinyl monomer, and optionally unreacted polymerizable co-monomer; wherein the polymeric matrix comprises polymerized vinyl monomer and optionally polymerized co-monomer; wherein the polymerizable co-monomer comprises at least one functional group that has the ability to form hydrogen bonds within the polymeric matrix; and wherein the crosslinking agent covalently crosslinks the polymeric matrix, and (b) removing at least a portion of the unreacted polymerizable vinyl monomer and optionally at least a portion of the unreacted polymerizable co-monomer from the precursor dielectric polymeric composition to form the dielectric polymeric composition; wherein the dielectric polymeric composition comprises the polymeric matrix, the ionic liquid, and less than about 10 ppm of unreacted polymerizable vinyl monomer and unreacted polymerizable co-monomer, based on the total weight of the dielectric polymeric composition, wherein an amount of unreacted polymerizable vinyl monomer and unreacted polymerizable co-monomer in the dielectric polymeric composition is measured via high performance liquid chromatography (HPLC); wherein the ionic liquid is compatible or partially compatible with the polymeric matrix; and wherein the concentration of the ionic liquid in the dielectric polymeric composition ranges from about 0.5 wt. % to about 30 wt. %.

Also disclosed herein is an apparatus comprising a mechanical sensor comprising a dielectric polymeric composition, the dielectric polymeric composition comprising (a) a polymeric matrix; wherein the polymeric matrix comprises structural units derived from at least one polymerizable vinyl monomer; wherein the polymeric matrix optionally comprises a crosslinking agent, structural units derived from a polymerizable co-monomer, or both a crosslinking agent and structural units derived from a polymerizable co-monomer; wherein the crosslinking agent covalently crosslinks the polymeric matrix; and wherein the polymerizable co-monomer comprises at least one functional group that has the ability to form hydrogen bonds within the polymeric matrix, (b) an ionic liquid, wherein the ionic liquid comprises an organic cation and a balancing anion, wherein the ionic liquid is miscible or partially miscible with the at least one polymerizable vinyl monomer, wherein the ionic liquid is miscible or partially miscible with the polymerizable co-monomer, and wherein the concentration of the ionic liquid in the dielectric polymeric composition ranges from about 0.5 wt. % to about 30 wt. %, and (c) less than about 10 ppm of unreacted polymerizable vinyl monomer and unreacted polymerizable co-monomer, based on the total weight of the dielectric polymeric composition, wherein an amount of unreacted polymerizable vinyl monomer and unreacted polymerizable co-monomer in the dielectric polymeric composition is measured via high performance liquid chromatography (HPLC).

Also disclosed herein is an apparatus comprising a mechanical actuator comprising a dielectric polymeric composition, the dielectric polymeric composition comprising (a) a polymeric matrix; wherein the polymeric matrix comprises structural units derived from at least one polymerizable vinyl monomer; wherein the polymeric matrix optionally comprises a crosslinking agent, structural units derived from a polymerizable co-monomer, or both a crosslinking agent and structural units derived from a polymerizable co-monomer; wherein the crosslinking agent covalently crosslinks the polymeric matrix; and wherein the polymerizable co-monomer comprises at least one functional group that has the ability to form hydrogen bonds within the polymeric matrix, (b) an ionic liquid, wherein the ionic liquid comprises an organic cation and a balancing anion, wherein the ionic liquid is miscible or partially miscible with the at least one polymerizable vinyl monomer, wherein the ionic liquid is miscible or partially miscible with the polymerizable co-monomer, and wherein the concentration of the ionic liquid in the dielectric polymeric composition ranges from about 0.5 wt. % to about 30 wt. %, and (c) less than about 10 ppm of unreacted polymerizable vinyl monomer and unreacted polymerizable co-monomer, based on the total weight of the dielectric polymeric composition, wherein an amount of unreacted polymerizable vinyl monomer and unreacted polymerizable co-monomer in the dielectric polymeric composition is measured via high performance liquid chromatography (HPLC).

Also disclosed herein is an electronic device comprising (i) a display device, and (ii) an array of electronic components, wherein the array of electronic components is proximal to the display device, and wherein each electronic component of the array of electronic components comprises a dielectric polymeric composition, the dielectric polymeric composition comprising (a) a polymeric matrix; wherein the polymeric matrix comprises structural units derived from at least one polymerizable vinyl monomer; wherein the polymeric matrix optionally comprises a crosslinking agent, structural units derived from a polymerizable co-monomer, or both a crosslinking agent and structural units derived from a polymerizable co-monomer; wherein the crosslinking agent covalently crosslinks the polymeric matrix; and wherein the polymerizable co-monomer comprises at least one functional group that has the ability to form hydrogen bonds within the polymeric matrix, (b) an ionic liquid, wherein the ionic liquid comprises an organic cation and a balancing anion, wherein the ionic liquid is miscible or partially miscible with the at least one polymerizable vinyl monomer, wherein the ionic liquid is miscible or partially miscible with the polymerizable co-monomer, and wherein the concentration of the ionic liquid in the dielectric polymeric composition ranges from about 0.5 wt. % to about 30 wt. %, and (c) less than about 10 ppm of unreacted polymerizable vinyl monomer and unreacted polymerizable co-monomer, based on the total weight of the dielectric polymeric composition, wherein an amount of unreacted polymerizable vinyl monomer and unreacted polymerizable co-monomer in the dielectric polymeric composition is measured via high performance liquid chromatography (HPLC).

BRIEF DESCRIPTION OF THE DRAWINGS

For a detailed description of the preferred aspects of the disclosed methods, reference will now be made to the accompanying drawings in which:

FIGS. 2A1 and 2A2 display a photograph and scanning electron micrograph, respectively, of a film formed from a dielectric polymeric composition comprising PMMA and BMImPF$_6$;

FIGS. 2B1 and 2B2 display a photograph and scanning electron micrograph, respectively, of a film formed from a dielectric polymeric composition comprising PMMA and 1-(2-hydroxyethyl)-3-methylimidazolium tetrafluoroborate (HEMImBF$_4$);

DETAILED DESCRIPTION

Figure 1:
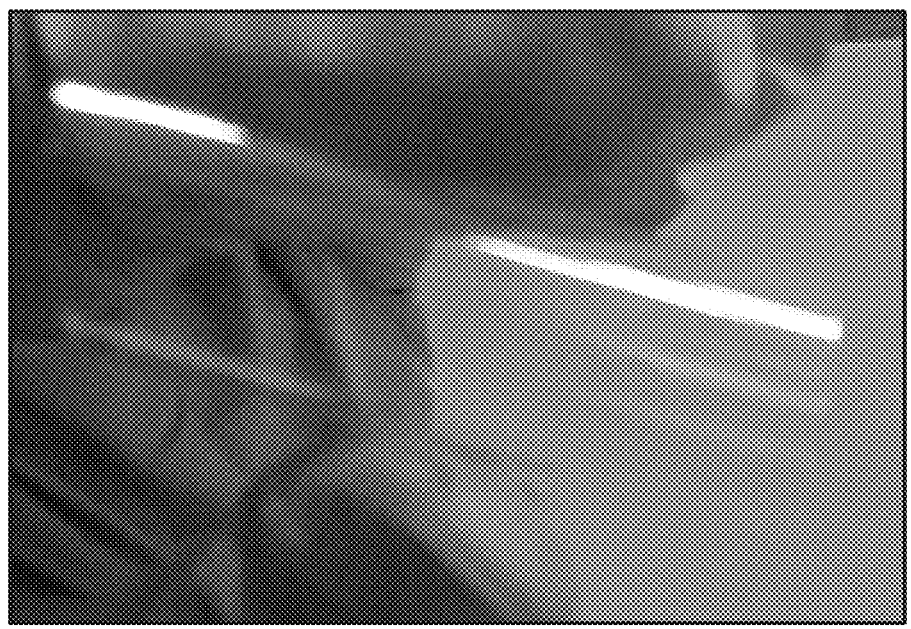
FIG. 1 displays a photograph of thin, flexible, and transparent film formed from a dielectric polymeric composition comprising poly(methyl methacrylate) (PMMA) and 1-butyl-3-methylimidazolium hexafluorophosphate (BMImPF$_6$)

Disclosed herein are dielectric polymeric compositions and methods of making and using same. In an aspect, a dielectric polymeric composition can comprise (a) a polymeric matrix, wherein the polymeric matrix comprises structural units derived from at least one polymerizable vinyl monomer; (b) an ionic liquid, wherein the ionic liquid comprises an organic cation and a balancing anion, wherein the ionic liquid is miscible or partially miscible with the at least one polymerizable vinyl monomer, and wherein the concentration of the ionic liquid in the dielectric polymeric composition ranges from about 0.5 wt. % to about 30 wt. %; and (c) less than about 10 ppm of unreacted polymerizable vinyl monomer, based on the total weight of the dielectric polymeric composition, wherein an amount of unreacted polymerizable vinyl monomer in the dielectric polymeric composition is measured via high performance liquid chromatography (HPLC). The dielectric polymeric composition can be ferroelectric. In an aspect, the ferroelectric properties of the dielectric polymeric compositions could be enhanced by crosslinking the polymeric matrix and/or by incorporating comonomers into the polymeric matrix, wherein the comonomers comprise functional groups capable of forming hydrogen bonds within the polymeric matrix. The use of comonomers comprising polar functional groups (e.g., —OH groups) can also facilitate an improved dispersion of ionic liquid into the polymer matrix.

In an aspect, the dielectric polymeric compositions can be formed into an article, such as a film or a sheet. In some aspects, a piezoelectric device can comprise the article formed from the dielectric polymeric composition, wherein the piezoelectric device can be selected from the group consisting of a piezoelectric sensor, a piezoelectric transducer, a piezoelectric energy harvester, and a piezoelectric actuator.

The dielectric polymeric compositions can be prepared via the incorporation of ionic liquids during polymerization of vinyl monomers (i.e., in situ polymerization technique). In an aspect, a method of making a dielectric polymeric composition can comprise the steps of (a) subjecting a mixture comprising an ionic liquid and a polymerizable precursor comprising at least one polymerizable vinyl monomer to in situ polymerization conditions to form a precursor dielectric polymeric composition, wherein the ionic liquid comprises an organic cation and a balancing anion, wherein the precursor dielectric polymeric composition comprises a polymeric matrix, the ionic liquid, and unreacted polymerizable vinyl monomer, wherein the polymeric matrix comprises polymerized vinyl monomer, and wherein the ionic liquid is compatible or partially compatible with the polymeric matrix; and (b) removing at least a portion of the unreacted polymerizable vinyl monomer from the precursor dielectric polymeric composition to form the dielectric polymeric composition; wherein the dielectric polymeric composition comprises the polymeric matrix, the ionic liquid, and less than about 10 ppm of unreacted polymerizable vinyl monomer, based on the total weight of the dielectric polymeric composition, wherein an amount of unreacted polymerizable vinyl monomer in the dielectric polymeric composition is measured via high performance liquid chromatography (HPLC); and wherein the concentration of the ionic liquid in the dielectric polymeric composition ranges from about 0.5 wt. % to about 30 wt. %. In some aspects, the step (b) of removing at least a portion of the unreacted polymerizable vinyl monomer comprises heating the precursor dielectric polymeric composition.

Other than in the operating examples or where otherwise indicated, all numbers or expressions referring to quantities of ingredients, reaction conditions, and the like, used in the specification and claims are to be understood as modified in all instances by the term "about." Various numerical ranges are disclosed herein. Because these ranges are continuous, they include every value between the minimum and maximum values. The endpoints of all ranges reciting the same characteristic or component are independently combinable and inclusive of the recited endpoint. Unless expressly indicated otherwise, the various numerical ranges specified in this application are approximations. The endpoints of all ranges directed to the same component or property are inclusive of the endpoint and independently combinable. The term "from more than 0 to an amount" means that the named component is present in some amount more than 0, and up to and including the higher named amount.

The terms "a," "an," and "the" do not denote a limitation of quantity, but rather denote the presence of at least one of the referenced item. As used herein the singular forms "a," "an," and "the" include plural referents.

As used herein, "combinations thereof" is inclusive of one or more of the recited elements, optionally together with a like element not recited, e.g., inclusive of a combination of one or more of the named components, optionally with one or more other components not specifically named that have essentially the same function. As used herein, the term "combination" is inclusive of blends, mixtures, alloys, reaction products, and the like.

Reference throughout the specification to "an aspect," "another aspect," "other aspect," "some aspect," and so forth, means that a particular element (e.g., feature, structure, property, and/or characteristic) described in connection with the aspect is included in at least an aspect described herein, and may or may not be present in other aspect. In addition, it is to be understood that the described element(s) can be combined in any suitable manner in the various aspect.

As used herein, the terms "inhibiting" or "reducing" or "preventing" or "avoiding" or any variation of these terms, include any measurable decrease or complete inhibition to achieve a desired result.

As used herein, the term "effective," means adequate to accomplish a desired, expected, or intended result.

As used herein, the terms "comprising" (and any form of comprising, such as "comprise" and "comprises"), "having" (and any form of having, such as "have" and "has"), "including" (and any form of including, such as "include" and "includes") or "containing" (and any form of containing, such as "contain" and "contains") are inclusive or open-ended and do not exclude additional, unrecited elements or method steps.

Unless defined otherwise, technical and scientific terms used herein have the same meaning as is commonly understood by one of skill in the art.

Compounds are described herein using standard nomenclature. For example, any position not substituted by any indicated group is understood to have its valency filled by a bond as indicated, or a hydrogen atom. A dash ("-") that is not between two letters or symbols is used to indicate a point of attachment for a substituent. For example, —CHO is attached through the carbon of the carbonyl group.

The term "alkyl" includes both $C_{1-30}$ branched and straight chain, alternatively $C_{1-20}$ branched and straight chain, unsaturated aliphatic hydrocarbon groups having the specified number of carbon atoms. Examples of alkyl include, but are not limited to, methyl, ethyl, n-propyl, i-propyl, n-butyl, s-butyl, t-butyl, n-pentyl, s-pentyl, n- and s-hexyl, n- and s-heptyl, n- and s-octyl, decyl, stearyl, and the like.

The term "alkenyl" means a straight or branched chain, monovalent hydrocarbon group having at least one carbon-carbon double bond (e.g., ethenyl (—HC=CH$_2$)).

The term "alkoxy" means a straight or branched alkyl group (e.g., C$_{1-18}$) that is linked via an oxygen (i.e., alkyl-O—), for example methoxy, ethoxy, sec-butyloxy, and nonyloxy groups.

The term "alkylene" means a straight or branched chain, saturated, divalent aliphatic hydrocarbon group (e.g., methylene (—CH$_2$—), or propylene (—(CH$_2$)$_3$—)).

The term "aryl" means an aromatic hydrocarbon group (e.g., aromatic moiety) containing the specified number of carbon atoms (e.g., an unsaturated ring of six carbon atoms), which may optionally be substituted with one or more alkyl groups, and includes, for example phenyl, tolyl, xylyl, troponyl, indanyl, indenyl, naphthyl, and the like.

The term "aryloxy" means an oxygen radical that is substituted with an unsaturated ring of six carbon atoms, which itself may optionally be substituted with one or more alkyl groups, and includes, for example, phenoxy.

The prefix "halo" means a group or compound including one more of a fluoro, chloro, bromo, and iodo substituent. A combination of different halo groups (e.g., bromo and fluoro) can be present. In an aspect, only chloro groups are present.

The prefix "hetero" means that the compound or group includes at least one ring member that is a heteroatom (e.g., 1, 2, or 3 heteroatom(s)), wherein the heteroatom(s) can each independently be N, O, S, or P.

In an aspect, a dielectric polymeric composition can be made by using any suitable methodology. A method of making a dielectric polymeric composition can comprise a step of subjecting a mixture comprising an ionic liquid and a polymerizable precursor to in situ polymerization conditions to form a precursor dielectric polymeric composition. The mixture to be subjected to in situ polymerization conditions can be prepared by combining the ionic liquid and the polymerizable precursor in any suitable order. In some aspects, the ionic liquid can be added to the polymerizable precursor to form the mixture, wherein the mixture can be further agitated (e.g., stirred), for example to enable the formation of a homogeneous mixture (e.g., to facilitate the solubilization or dissolution of the ionic liquid and polymerizable precursor in each other). In other aspects, the polymerizable precursor can be added to the ionic liquid to form the mixture, wherein the mixture can be further agitated (e.g., stirred), for example to enable the formation of a homogeneous mixture.

While the current disclosure will be discussed in detail in the context of a dielectric polymeric composition comprising a polymeric matrix and an ionic additive comprising an ionic liquid, it should be understood that the methods disclosed herein can be used in conjunction with any suitable method of making and/or using a dielectric polymeric composition comprising a polymeric matrix and any suitable ionic additive compatible with the methods and materials disclosed herein (e.g., a metal salt of an unsaturated carboxylic acid).

In an aspect, the ionic liquid can comprise an organic cation and a balancing anion. In an aspect, the ionic liquid can have the general structure of: $Z^+X^-$, wherein $Z^+$ is the organic cation, and $X^-$ is the balancing anion. Generally, ionic liquids are salts that are in a liquid state at temperatures below 100° C., wherein the ionic liquid has at least one organic component (usually the cation). Without wishing to be limited by theory, the ionic liquids suffer from poor coordination, and display a delocalized charge in the organic component (e.g., organic cation component), which in turn prevents the formation of a stable crystal lattice, and thus the ionic liquid remains in a liquid state at temperatures below 100° C.

In an aspect, the organic cation ($Z^+$) can be an onium cation. Generally, onium cations refer to cations derived by addition of a proton to a mononuclear parent hydride of the nitrogen, chalcogen (i.e., elements in group 16 of the periodic table, such as oxygen (O), sulfur (S)), and halogen families. Onium cations, along with their counter-ions, form onium compounds. In an aspect, the ionic liquid comprises an onium compound.

Non-limiting examples of onium cations suitable for use as $Z^+$ in the ionic liquids disclosed herein include a phosphonium cation, a sulfonium cation, a 5-membered heterocyclic ring cation, a 6-membered heterocyclic ring cation, and the like, or combinations thereof; wherein each of the 5-membered heterocyclic ring cation and the 6-membered heterocyclic ring cation can have from 1 to 3 heteroatoms as ring members selected from the group consisting of nitrogen, oxygen, sulfur, and combinations thereof. In an aspect, at least one heterocyclic ring atom of the 5-membered heterocyclic ring cation and/or the 6-membered heterocyclic ring cation can be substituted with a substituent group comprising one or more halides, oxygen, nitrogen, sulfur, phosphorus, alkanes, esters, ethers, ketones, carbonyls, alkoxy alkanes, alkenes, aryls, nitriles, silanes, sulfones, thiols, phenols, hydroxyls, amines, imides, aldehydes, carboxylic acids, alkynes, carbonates, anhydrides, and the like, or combinations thereof. In such aspect, the carbon or hydrogen atoms in the substituent group can be further substituted with one or more halides, oxygen, nitrogen, sulfur, phosphorus, alkanes, esters, ethers, ketones, carbonyls, alkoxy alkanes, alkenes, aryls, nitriles, silanes, sulfones, thiols, phenols, hydroxyls, amines, imides, aldehydes, carboxylic acids, alkynes, carbonates, anhydrides, and the like, or combinations thereof.

In an aspect, the onium cation can comprise a substituted or unsubstituted imidazolium cation, a substituted or unsubstituted N-alkyl pyridinium cation, a substituted or unsubstituted N,N-dialkyl pyrrolidinium cation, a substituted or unsubstituted piperidinium cation, a substituted or unsubstituted morpholinium cation, a sulfonium cation (e.g., a trialkyl sulfonium cation), a phosphonium cation (e.g., a tetraalkyl phosphonium cation and/or an aryl phosphonium cation), and the like, or combinations thereof.

In an aspect, the onium cation suitable for use as $Z^+$ in the ionic liquids disclosed herein can comprise a substituted or unsubstituted imidazolium cation having Structure I:

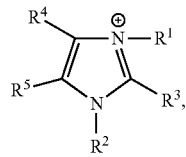

Structure I wherein $R^1$, $R^2$, $R^3$, $R^4$, and $R^5$ can each independently be hydrogen, or a linear or branched C$_1$ to C$_{20}$ alkyl group, alternatively a linear or branched C$_1$ to C$_{10}$ alkyl group, alternatively a linear or branched C$_2$ to C$_8$ alkyl group, or alternatively a linear or branched C$_3$ to C$_5$ alkyl group.

In an aspect, $R^1$ can be methyl, and $R^2$ can be a C$_1$ to C$_{10}$ alkyl group, alternatively a C$_2$ to C$_{20}$ alkyl group, or alternatively a $C_3$ to $C_5$ alkyl group. In such aspect, $R^2$ can be a $C_3$ to $C_5$ alkyl group; for example $R^2$ can be a $C_4$ alkyl group, such as a butyl group.

In an aspect, the onium cation suitable for use as $Z^+$ in the ionic liquids disclosed herein can comprise 1-butyl-3-methylimidazolium cation.

Non-limiting examples of balancing anions suitable for use as $X^-$ in the ionic liquids disclosed herein include a halide, a nitrate, a phosphate (e.g., a halogenated phosphate, hexafluorophosphate), a chlorate, a sulfate, an alkyl sulfate, a borate (e.g., tetrafluoroborate), a sulfonate (e.g., trifluoromethanesulfonate), a carboxylate, an acetate (e.g., trifluoromethaneacetate), a dicyanamide anion, a phosphazine anion, an imide anion (e.g., a bis(trifluoromethanesulfonyl) imide anion, a bis(pentafluoroethanesulfonyl)imide anion), and the like, or combinations thereof. In some aspects, the balancing anion suitable for use as $X^-$ in the ionic liquids can comprise hexafluorophosphate.

In an aspect, the ionic liquid comprises 1-butyl-3-methylimidazolium hexafluorophosphate ($BMImPF_6$).

In an aspect, the ionic liquid can be present in the mixture to be subjected to in situ polymerization conditions in an amount of from about 0.5 wt. % to about 30 wt. %, alternatively from about 1 wt. % to about 10 wt. %, or alternatively from about 4 wt. % to about 6 wt. %. In some aspects, the ionic liquid can be present in the mixture to be subjected to in situ polymerization conditions in an amount of about 5 wt. %.

In an aspect, the polymerizable precursor can comprise at least one polymerizable vinyl monomer. For purposes of the disclosure herein, the term "vinyl monomer" (also known as "ethenyl monomer") refers to compounds having ethenyl (e.g., substituted ethylene) functional groups capable of forming and reacting via free radicals, wherein such compounds having ethenyl functional groups comprise monomers, oligomers, polymers, or combinations thereof having one or more ethenyl functional groups capable of forming and reacting via free radicals. For purposes of the disclosure herein, the term "polymerizable" monomer (e.g., polymerizable vinyl monomer) refers to a monomer having a functional group (e.g., an ethenyl functional group) capable of undergoing addition polymerization (e.g., free radical polymerization by successive addition of free radical building blocks). Non-limiting examples of ethenyl functional groups that can be present in the vinyl monomers disclosed herein include a vinyl group, an allyl group, an acrylate group, a styrene group, and the like, or combinations thereof. Further, for purposes of the disclosure herein, the term "polymerizable" precursor (e.g., polymerizable constituent, polymerizable monomer, polymerizable co-monomer, crosslinking agent, etc.) refers to a precursor to polymer that can be polymerized or otherwise incorporated into a polymer as disclosed herein.

In an aspect, the vinyl monomer can have the following structure:

wherein $R^6$ is selected from the group consisting of hydrogen, an alkyl group, an aryl group, a substituted aryl group, an alkyl aryl group, a cyano group, and combinations thereof; and wherein $R^7$ is selected from the group consisting of hydrogen, an alkoxycarbonyl group, an aryloxycarbonyl group, a carboxyl group, and combinations thereof.

Non-limiting examples of vinyl monomers suitable for use in the present disclosure include styrene monomers, acrylonitrile monomers, acrylate monomers, diallyl phthalate monomer, divinyl succinate monomer, divinyl adipate monomer, divinyl phthalate monomer, derivatives thereof, and the like, or combinations thereof. In some aspects, the vinyl monomer can comprise styrene, acrylonitrile, derivatives thereof, or combinations thereof. In other aspects, the vinyl monomer can comprise an acrylate monomer, such as an acrylate and/or methacrylate monomer.

In some aspects, the vinyl monomer can comprise a single vinyl monomer; such as an acrylate. In other aspects, the vinyl monomer can comprise two polymerizable vinyl monomers; such as styrene and acrylonitrile.

In an aspect, the vinyl monomer can comprise an acrylate monomer, wherein the acrylate monomer can have the following structure:

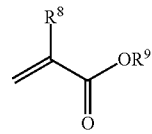

wherein $R^8$, and $R^9$ can each independently be hydrogen, a substituted or unsubstituted alkyl group, a substituted or unsubstituted aryl group, an alkyl aryl group, and the like, or combinations thereof.

Non-limiting examples of acrylate monomers suitable for use in the present disclosure include acrylic acid esters, methacrylic acid esters, hydroxy-functional acrylic acid esters, hydroxy-functional methacrylic acid esters, and the like, or combinations thereof.

In an aspect, the acrylate monomer comprises mono-(meth)acrylates, mono-(meth)acrylates, di-(meth)acrylates, poly-(meth)acrylates, methyl (meth)acrylate, ethyl (meth)acrylate, isopropyl (meth)acrylate, n-hexyl (meth)acrylate, stearyl (meth)acrylate, allyl (meth)acrylate, 1,3-propanediol di(meth)acrylate, trimethylolpropane tri(meth)acrylate, 1,2,4-butanetriol tri(meth)acrylate, 1,4-cyclohexanediol di(meth)acrylate, sorbitol hex(meth)acrylate, tetrahydrofurfuryl (meth)acrylate, bis[1-(2-acryloxy)]-p-ethoxyphenyldimethylmethane, bis[1-(3-acryloxy-2-hydroxy)]-p-propoxyphenyldimethylmethane, trishydroxyethyl-isocyanurate tri(meth)acrylate, urethane (meth)acrylates; (meth)acrylamides (e.g., (meth)acrylamide, methylene bis-(meth)acrylamide, diacetone (meth)acrylamide); and the like; or combinations thereof. For purposes of the disclosure herein, the term "(meth)acrylate" in a compound name refers to the compound comprising an acrylate, a methacrylate, or combinations thereof. For example, the term "mono-(meth)acrylates" refers to mono-acrylates, mono-methacrylates, or both mono-acrylates and mono-methacrylates. For purposes of the disclosure herein, the term "(meth)acrylamide" in a compound name refers to the compound comprising an acrylamide, a methacrylamide, or combinations thereof. For example, the term "methylene bis-(meth)acrylamide" refers to methylene bis-acrylamide, methylene bis-methacrylamide, or both methylene bis-acrylamide and methylene bis-methacrylamide.

In an aspect, the vinyl monomer can comprise an acrylate monomer (e.g., polymerizable acrylate monomer), wherein the acrylate monomer comprises methyl acrylate, ethyl acrylate, methacrylate, methyl methacrylate (MMA), butyl methacrylate, and the like, or combinations thereof. In some aspects, the vinyl monomer can comprise methyl methacrylate (MMA).

In some aspects, the polymerizable precursor can comprise a single polymerizable vinyl monomer (e.g., a single type of polymerizable vinyl monomer). In other aspects, the polymerizable precursor can comprise two or more monomers (e.g., 2, 3, 4, 5, or more monomers), wherein the two or more monomers can be the same type of vinyl monomer (e.g., all monomers can be acrylates; all monomers can be styrenes; etc.), or different types of vinyl monomers (e.g., some monomers can be styrenes, while other monomers can be acrylates).

In aspects where the polymerizable precursor comprises more than one type of vinyl monomer, the polymerizable precursor can be a monomer blend (e.g., blended polymerizable precursor), such as a styrene and acrylonitrile blend; a styrene, acrylonitrile and methyl methacrylate blend; and the like; or combinations thereof.

In an aspect, the vinyl monomer can be present in the mixture to be subjected to in situ polymerization conditions in an amount of from about 70 wt. % to about 99.5 wt. %, alternatively from about 90 wt. % to about 99 wt. %, or alternatively from about 94 wt. % to about 96 wt. %. In some aspects, the vinyl monomer can be present in the mixture to be subjected to in situ polymerization conditions in an amount of about 95 wt. %.

In an aspect, the polymerizable precursor can further comprise a polymerizable constituent, wherein the polymerizable constituent can comprise a polymerizable co-monomer, a crosslinking agent, or both a polymerizable co-monomer and a crosslinking agent. In an aspect, the polymerizable co-monomer comprises at least one functional group that has the ability to form hydrogen bonds within a polymeric matrix.

In an aspect, the polymerizable constituent can comprise a polymerizable co-monomer. Without wishing to be limited by theory, the at least one functional group of the polymerizable co-monomer has the ability to form hydrogen bonds with the vinyl monomer.

In some aspects, the at least one functional group that has the ability to form hydrogen bonds comprises a polar functional group. Without wishing to be limited by theory, the polar functional group of the co-monomer could improve uniform dispersion of the ionic liquid (also polar) within the vinyl monomer (and consequently within the polymeric matrix), by rendering the polymeric matrix more polar overall.

In an aspect, the at least one functional group that has the ability to form hydrogen bonds within the polymeric matrix can be selected from the group consisting of a hydroxyl group, a carboxyl group, an amino group, an imino group, and combinations thereof. In some aspects, the at least one functional group that has the ability to form hydrogen bonds within the polymeric matrix comprises a hydroxyl group.

In some aspects, the polymerizable co-monomer can be an acrylate monomer, such as a hydroxyalkyl methacrylate. In an aspect, the polymerizable co-monomer comprises 2-hydroxyethyl methacrylate (HEMA).

In an aspect, the co-monomer can be present in the polymerizable precursor in an amount of from about 5 wt. % to about 30 wt. %, alternatively from about 5 wt. % to about 15 wt. %, or alternatively from about 8 wt. % to about 12 wt. %. In such aspect, the vinyl monomer can be present in the polymerizable precursor in an amount of from about 70 wt. % to about 95 wt. %, alternatively from about 85 wt. % to about 95 wt. %, or alternatively from about 88 wt. % to about 92 wt. %.

In an aspect, the co-monomer can be present in the polymerizable precursor in an amount of about 10 wt. %. In such aspect, the vinyl monomer can be present in the polymerizable precursor in an amount of about 90 wt. %.

In an aspect, the polymerizable constituent can comprise a crosslinking agent. Generally, crosslinking agents provide for the formation of chemical bonds, such as covalent bonds (e.g., covalent crosslinks) between polymeric chains within a polymeric matrix. Without wishing to be limited by theory, the crosslinking agent provides for a stable three dimensional polymeric matrix.

In an aspect, the crosslinking agent can comprise tetraethylene glycol diacrylate (TEGDA), tetraethylene glycol dimethacrylate (TEGDMA), ethylene glycol dimethacrylate (EGDMA), diethylene glycol dimethacrylate (DEGDMA), hexamethylene glycol dimethacrylate (HMGDMA), polyethylene glycol diacrylate (PEGDA), polyethylene glycol dimethacrylate (PEGDMA), trimethylol propane triacrylate (TMPTA), and the like, or combinations thereof. In some aspects, the crosslinking agent can comprise tetraethylene glycol diacrylate (TEGDA).

In an aspect, the crosslinking agent can be present in the mixture to be subjected to in situ polymerization conditions in an amount of from about 0.1 wt. % to about 10 wt. %, alternatively from about 1 wt. % to about 9 wt. %, or alternatively from about 4 wt. % to about 6 wt. %. In some aspects, the crosslinking agent can be present in the mixture to be subjected to in situ polymerization conditions in an amount of about 5 wt. %.

In an aspect, the mixture to be subjected to in situ polymerization conditions can further comprise a free radical initiator. Generally, free radical initiators are chemical compounds that can generate a pair of free radicals, wherein the free radicals can react with the monomers and thus initiate the polymerization. The free radical initiator suitable for use in the present disclosure can be any initiator suitable for free radical polymerization reactions.

In an aspect, the free radical initiator can be selected from a group consisting of azobisisobutyronitrile, benzoyl peroxide, di-tert-butyl peroxide, tert-amyl peroxybenzoate, phenyl-azo-triphenylmethane, cumyl peroxide, acetyl peroxide, lauroyl peroxide, tert-butylhydroperoxide, tert-butyl perbenzoate, and combinations thereof. In some aspects, the free radical initiator comprises azobisisobutyronitrile.

In an aspect, the free radical initiator can be present in the mixture to be subjected to in situ polymerization conditions in an amount of from about 0.01 wt. % to about 0.5 wt. %, alternatively from about 0.05 wt. % to about 0.4 wt. %, or alternatively from about 0.1 wt. % to about 0.3 wt. %. In some aspects, the free radical initiator can be present in the mixture to be subjected to in situ polymerization conditions in an amount of about 0.2 wt. %.

In an aspect, the mixture to be subjected to in situ polymerization conditions can consist essentially of or consist of the ionic liquid, the polymerizable precursor, and the free radical initiator.

In an aspect, the ionic liquid is miscible or partially miscible with the at least one polymerizable vinyl monomer. In such aspect, the ionic liquid is further miscible or partially miscible with the polymerizable co-monomer. Generally, two or more fluids are miscible (e.g., fully miscible) when they can be mixed in any proportions to yield a homogeneous solution or mixture (as opposed to a phase separated solution or mixture); and when the two or more fluids have infinite solubility in each other. Two or more fluids are partially miscible when they can only be mixed in certain proportions to yield a homogeneous solution or mixture (as opposed to a phase separated solution or mixture); while any other proportions would yield a phase separated solution or mixture. As will be appreciated by one of skill in the art, and with the help of this disclosure, while the ionic liquid, and a monomer and/or co-monomer can be partially miscible over the entire range of possible mixing proportions, they are miscible over at least a portion of the range of proportions disclosed herein. Further, and as will be appreciated by one of skill in the art, and with the help of this disclosure, the ionic liquid, and the monomer and/or co-monomer can be selected such that they are miscible with each other at the proportions used for forming the mixture to be subjected to in situ polymerization conditions. In an aspect, the ionic liquid as disclosed herein is miscible or partially miscible with the monomer and/or co-monomer as disclosed herein, wherein the ionic liquid can be present in the mixture to be subjected to in situ polymerization conditions in an amount of from about 0.5 wt. % to about 30 wt. %.

The ionic liquid, and the monomer and/or co-monomer can be present in the mixture to be subjected to in situ polymerization conditions in a weight ratio of ionic liquid to monomer and/or co-monomer of from about 1:199 (i.e., 0.5 wt. % ionic liquid and 99.5 wt. % monomer and/or co-monomer) to about 3:7 (i.e., 30 wt. % ionic liquid and 70 wt. % monomer and/or co-monomer), alternatively from about 1:99 (i.e., 1 wt. % ionic liquid and 99 wt. % monomer and/or co-monomer) to about 1:9 (i.e., 10 wt. % ionic liquid and 90 wt. % monomer and/or co-monomer), or alternatively from about 1:24 (i.e., 4 wt. % ionic liquid and 96 wt. % monomer and/or co-monomer) to about 3:47 (i.e., 6 wt. % ionic liquid and 94 wt. % monomer and/or co-monomer). In some aspects, the ionic liquid, and the monomer and/or co-monomer can be present in the mixture to be subjected to in situ polymerization conditions in a weight ratio of ionic liquid to monomer and/or co-monomer of about 1:19 (i.e., 5 wt. % ionic liquid and 95 wt. % monomer and/or co-monomer).

In an aspect, the ionic liquid is miscible with the at least one polymerizable vinyl monomer and/or the polymerizable co-monomer, wherein the ionic liquid, and the monomer and/or co-monomer are present in the mixture to be subjected to in situ polymerization conditions in a weight ratio of ionic liquid to monomer and/or co-monomer of from about 1:199 to about 3:7.

In an aspect, the mixture to be subjected to in situ polymerization conditions comprises the at least one polymerizable vinyl monomer and/or the polymerizable co-monomer dissolved in the ionic liquid, prior to forming the precursor dielectric polymeric composition (e.g., prior to subjecting the mixture to in situ polymerization conditions). In aspects where the at least one polymerizable vinyl monomer and/or the polymerizable co-monomer are gases at normal conditions (e.g., atmospheric pressure, room temperature), the monomer and/or comonomer can be dissolved in the ionic liquid by bubbling the monomer and/or comonomer through the ionic liquid. In aspects where the at least one polymerizable vinyl monomer and/or the polymerizable co-monomer are liquids at normal conditions (e.g., atmospheric pressure, room temperature), the monomer and/or comonomer can be dissolved in the ionic liquid by contacting the monomer and/or comonomer with the ionic liquid in any suitable manner (e.g., adding the monomer and/or comonomer to the ionic liquid, adding the ionic liquid to the monomer and/or comonomer, etc.). For purposes of the disclosure herein, and as will be appreciated by one of skill in the art, and with the help of this disclosure, the ionic liquid can also be said to be dissolved in the at least one polymerizable vinyl monomer and/or the polymerizable co-monomer, owing to the ionic liquid, and the at least one polymerizable vinyl monomer and/or the polymerizable co-monomer being miscible at the proportions used herein for forming the mixture to be subjected to in situ polymerization conditions. Vinyl monomer miscibility with ionic liquids is described in more detail in J. Am. Chem. Soc., 2005, vol. 127, pp. 4976-4983; which is incorporated by reference herein in its entirety.

In an aspect, the method of making a dielectric polymeric composition can comprise subjecting a mixture comprising an ionic liquid and a polymerizable precursor to in situ polymerization conditions (e.g., conditions sufficient to polymerize the polymerizable precursor) to form a precursor dielectric polymeric composition. Generally, the term "in situ polymerization" refers to polymerization in the reaction mixture, for example polymerization of vinyl monomers in the presence of an ionic liquid in the reaction mixture. The polymerization conditions (e.g., in situ polymerization conditions) can be any suitable conditions that can initiate free radical polymerization in situ (e.g., free radical polymerization in the mixture of ionic liquid and polymerizable precursor). Without wishing to be limited by theory, the free radical polymerization of the vinyl monomers in the presence of the ionic liquid can form a polymeric matrix (e.g., continuous phase) that encapsulates or incorporates an ionic liquid dispersed phase. The in situ polymerization of the polymerizable precursor (e.g., polymerizable vinyl monomer, polymerizable co-monomer) occurs in the absence of a solvent other than the ionic liquid (i.e., a solvent other than the ionic liquid is not introduced into the mixture), owing to the ionic liquid being miscible with the monomers and co-monomers at the mixture proportions used herein.

In an aspect, the polymerization conditions can comprise a temperature (e.g., polymerization temperature) ranging from about 30° C. to about 100° C., alternatively from about 40° C. to about 95° C., alternatively from about 50° C. to about 90° C., or alternatively from about 75° C. to about 85° C. The polymerization temperature can be applied for a time period of (e.g., a polymerization time can range over a period of) from about 4 hours (h) to about 24 h, alternatively from about 6 h to about 20 h, alternatively from about 8 h to about 16 h, or alternatively from about 10 h to about 14 h.

In an aspect, the polymerization conditions can comprise an oxygen-free atmosphere (e.g., a substantially oxygen-free atmosphere). As will be appreciated by one of skill in the art, and with the help of this disclosure, oxygen can inhibit free radical polymerization of vinyl monomers. In aspects where the polymerizable vinyl monomer is a liquid, an inert gas (e.g., nitrogen, argon, helium, etc.) can be bubbled through the liquid monomer to remove the oxygen. For purposes of the disclosure herein, an oxygen-free atmosphere refers to an atmosphere having less than 100 ppm oxygen.

In an aspect, the precursor dielectric polymeric composition can comprise a polymeric matrix, the ionic liquid, unreacted vinyl monomer, and optionally unreacted co-monomer; wherein the polymeric matrix comprises polymerized vinyl monomer, and optionally the crosslinking agent and/or polymerized co-monomer; and wherein the ionic liquid is compatible or partially compatible with the polymeric matrix.

For purposes of the disclosure herein, the term "compatible" when used to define a relationship between the ionic liquid and the polymeric matrix refers to the dielectric polymeric composition and/or precursor dielectric polymeric composition being a stable homogeneous mixture which exhibits macroscopic properties expected of a single phase material. Homogeneity, when used to define the dielectric polymeric composition and/or precursor dielectric polymeric composition, does not refer to the electronic microscopic structure (e.g., structure observable with an electron microscope) of polymeric matrix and ionic liquid present in the polymeric composition. For purposes of the disclosure herein, the terms "homogeneous," "homogeneity," and the like, when used to define the dielectric polymeric composition and/or precursor dielectric polymeric composition, refer to the macroscopic behavior or properties of the polymeric composition, such as thermal transition temperature and light transparency. Generally, polymers can be characterized by a thermal transition temperature, which can be a glass transition temperature ($T_g$), and optionally a melting temperature ($T_m$). Generally, $T_g$ refers to a temperature region where a polymer transitions from a hard, glassy material to a soft, rubbery material. $T_g$ is a characteristic of amorphous polymers. Generally, $T_m$ refers to a temperature region where an ordered polymeric crystal structure becomes a disordered liquid. $T_m$ is a characteristic of crystalline polymers. Amorphous polymers, such as poly(methyl methacrylate) (PMMA), are characterized by $T_g$. Crystalline or semi-crystalline polymers, such as syndiotactic polystyrene, can display both a $T_g$ and a $T_m$, owing to having both amorphous and crystalline regions within the polymeric network.

In an aspect, when the ionic liquid is compatible with the polymeric matrix, the dielectric polymeric composition and/or precursor dielectric polymeric composition can be characterized by a single thermal transition temperature (e.g., $T_g$, and optionally $T_m$). Without wishing to be limited by theory, given the small amount of ionic liquid in the dielectric polymeric composition (e.g., less than about 30 wt. %, and as low as 0.5 wt. %), as well as the small size of the ionic liquid molecules as compared to significantly larger polymer molecules that form the polymeric matrix, in some cases the thermal transition of the ionic liquid could be undetectable (e.g., indistinguishable from the thermal transition of the polymeric matrix), given the resolution limitations of the analytical method used for measuring the thermal transition (e.g., differential scanning calorimetry (DSC)). In an aspect, the compatibility of the ionic liquid with the polymeric matrix can be assessed by comparing the $T_g$ of the polymeric matrix with the $T_g$ of the dielectric polymeric composition.

For purposes of the disclosure herein, the ionic liquid is considered to be compatible with the polymeric matrix when a difference between a $T_g$ of the polymeric matrix and a $T_g$ of the dielectric polymeric composition ($\Delta T_g$) is equal to or greater than about 25° C., alternatively equal to or greater than about 30° C., or alternatively equal to or greater than about 35° C. Further, for purposes of the disclosure herein, the ionic liquid is considered to be partially compatible with the polymeric matrix when a difference between a $T_g$ of the polymeric matrix and a $T_g$ of the dielectric polymeric composition is from about 5° C. to about 25° C., alternatively from about 6° C. to about 23° C., or alternatively from about 7.5° C. to about 20° C. Furthermore, for purposes of the disclosure herein, the ionic liquid is considered to be incompatible with the polymeric matrix when a difference between a $T_g$ of the polymeric matrix and a $T_g$ of the dielectric polymeric composition is equal to or less than about 5° C., alternatively equal to or less than about 2.5° C., or alternatively equal to or less than about 1° C. Without wishing to be limited by theory, an ionic liquid that is compatible with the polymeric matrix can impart a plasticization effect to the polymer matrix, and as a result, the $T_g$ of the dielectric polymeric composition and/or precursor dielectric polymeric composition will be reduced; the higher the compatibility between the ionic liquid and the polymeric matrix, the lower the $T_g$ of the dielectric polymeric composition and/or precursor dielectric polymeric composition, and thus the larger the $\Delta T_g$. For purposes of the disclosure herein, and without wishing to be limited by theory, the term "plasticization" refers to the ionic liquid molecules being incorporated between polymeric chains, as a result of which chain slippage can happen, resulting in the free volume of the system (i.e., dielectric polymeric composition and/or precursor dielectric polymeric composition) increasing, which in turn can be manifested by a lowering of $T_g$.

In an aspect, the ionic liquid is compatible with the polymeric matrix, wherein the difference between the $T_g$ of the polymeric matrix and the $T_g$ of the dielectric polymeric composition is equal to or greater than about 25° C. In such aspect, when the ionic liquid is compatible with the polymeric matrix, the dielectric polymeric composition and/or precursor dielectric polymeric composition can be transparent, as will be discussed in more detail later herein. Generally, a transparent material allows light to pass through without being scattered. For purposes of the disclosure herein, the compatibility of the ionic liquid with the polymeric matrix can be assessed visually, or by optical microscopy, wherein a transparent dielectric polymeric composition indicates that the ionic liquid is compatible with the polymeric matrix.

In an aspect, the ionic liquid is partially compatible with the polymeric matrix, wherein the difference between the $T_g$ of the polymeric matrix and the $T_g$ of the dielectric polymeric composition is from about 5° C. to about 25° C. In such aspect, when the ionic liquid is partially compatible with the polymeric matrix, the dielectric polymeric composition and/or precursor dielectric polymeric composition can be translucent (e.g., partially transparent, semi-transparent), as will be discussed in more detail later herein. Generally, a translucent material allows light to pass through, although a portion of the light is being scattered. For purposes of the disclosure herein, the compatibility of the ionic liquid with the polymeric matrix can be assessed visually, or by optical microscopy, wherein a translucent dielectric polymeric composition indicates that the ionic liquid is partially compatible with the polymeric matrix.

For purposes of the disclosure herein, the term "partially compatible" when used to define a relationship between the ionic liquid and the polymeric matrix refers to the dielectric polymeric composition and/or precursor dielectric polymeric composition being a heterogeneous mixture which exhibits macroscopic properties expected of a material that is a mixture of two or more phases, for example a heterogeneous mixture which displays translucency. For purposes of the disclosure herein, the terms "heterogeneous," "heterogeneity," and the like, when used to define the dielectric polymeric composition and/or precursor dielectric polymeric composition, refer to the macroscopic behavior or properties of the polymeric composition, such as thermal transition temperature and light transparency.

In some aspects, when the ionic liquid is partially compatible with the polymeric matrix, the dielectric polymeric composition and/or precursor dielectric polymeric composition can be characterized by a single thermal transition temperature (e.g., $T_g$, and optionally $T_m$). For example, and without wishing to be limited by theory, if one of the components of the dielectric polymeric composition and/or precursor dielectric polymeric composition does not show a thermal transition (e.g., a lack of thermal transition could be due to a relatively lower molecular weight), the composition could display a single $T_g$, even though the composition is partially compatible.

In other aspects, when the ionic liquid is partially compatible with the polymeric matrix, the dielectric polymeric composition and/or precursor dielectric polymeric composition can be characterized by two or more thermal transition temperatures (e.g., $T_g$, and optionally $T_m$).

In an aspect, the precursor dielectric polymeric composition can comprise unreacted polymerizable vinyl monomer in an amount of equal to or greater than about 10 ppm, alternatively equal to or greater than about 25, alternatively equal to or greater than about 50 ppm, alternatively from about 10 ppm to about 50 ppm, alternatively from about 15 ppm to about 45 ppm, or alternatively from about 20 ppm to about 40 ppm; wherein an amount of unreacted polymerizable vinyl monomer in the dielectric polymeric composition is measured via high performance liquid chromatography (HPLC).

In an aspect, the precursor dielectric polymeric composition can comprise unreacted polymerizable co-monomer in an amount of equal to or greater than about 10 ppm, alternatively equal to or greater than about 25, alternatively equal to or greater than about 50 ppm, alternatively from about 10 ppm to about 50 ppm, alternatively from about 15 ppm to about 45 ppm, or alternatively from about 20 ppm to about 40 ppm; wherein an amount of unreacted polymerizable co-monomer in the dielectric polymeric composition is measured via HPLC.

In an aspect, the method of making a dielectric polymeric composition as disclosed herein can comprise a step of removing at least a portion of the unreacted polymerizable vinyl monomer from the precursor dielectric polymeric composition to form the dielectric polymeric composition; wherein the dielectric polymeric composition comprises the polymeric matrix, the ionic liquid, and less than about 10 ppm of unreacted polymerizable vinyl monomer, based on the total weight of the dielectric polymeric composition, wherein an amount of unreacted polymerizable vinyl monomer in the dielectric polymeric composition is measured via HPLC. In aspects where the precursor dielectric polymeric composition comprises unreacted polymerizable co-monomer, the method of making a dielectric polymeric composition as disclosed herein can further comprise removing at least a portion of the unreacted polymerizable co-monomer (along with the unreacted polymerizable vinyl monomer) from the precursor dielectric polymeric composition to form the dielectric polymeric composition; wherein the dielectric polymeric composition comprises the polymeric matrix, the ionic liquid, and less than about 10 ppm of unreacted polymerizable vinyl monomer and unreacted polymerizable co-monomer, based on the total weight of the dielectric polymeric composition, wherein an amount of unreacted polymerizable co-monomer in the dielectric polymeric composition is measured via HPLC.

In some aspects where the precursor dielectric polymeric composition comprises unreacted polymerizable co-monomer and/or a crosslinking agent, the precursor dielectric polymeric composition can be used as a dielectric polymeric composition as disclosed herein without (i.e., prior to) removing at least a portion of the unreacted monomer and/or co-monomer. In other aspects where the precursor dielectric polymeric composition comprises unreacted polymerizable co-monomer and/or a crosslinking agent, the precursor dielectric polymeric composition can be used as a dielectric polymeric composition as disclosed herein subsequent to removing at least a portion of the unreacted monomer and/or unreacted co-monomer.

In an aspect, removing at least a portion of the unreacted polymerizable vinyl monomer from the precursor dielectric polymeric composition can comprise heating the precursor dielectric polymeric composition. In an aspect, the precursor dielectric polymeric composition can be heated by using any suitable heating source, such as an electrical heating source (e.g., a heater coil or band), microwave heating, and the like, or combinations thereof. In an aspect, heating the precursor dielectric polymeric composition can occur at ambient pressure (e.g., without vacuum).

In an aspect, the precursor dielectric polymeric composition can be heated to a first temperature of from about 50° C. to about 70° C., alternatively from about 55° C. to about 65° C., or alternatively from about 57° C. to about 62° C.; for a first time period of from about 12 h to about 30 h, alternatively from about 16 h to about 26 h, or alternatively from about 20 h to about 24 h. In some aspects, the precursor dielectric polymeric composition can be heated to a first temperature of about 60° C.; for a first time period of about 24 h.

In an aspect, removing at least a portion of the unreacted polymerizable vinyl monomer can further comprise polymerizing a portion of the unreacted polymerizable vinyl monomer to form the polymerized vinyl monomer. In an aspect, removing at least a portion of the unreacted polymerizable co-monomer can further comprise polymerizing a portion of the unreacted polymerizable co-monomer to form the polymerized co-monomer. As will be appreciated by one of skill in the art, and with the help of this disclosure, heating the precursor dielectric polymeric composition to the first temperature can lead to further polymerization of unreacted monomers and unreacted co-monomers.

In an aspect, the first temperature is lower than a boiling point of the ionic liquid. Generally, the ionic liquids disclosed herein have a boiling point of greater than about 200-300° C. Some monomers and co-monomers can have a boiling point of about 100-200° C., while other monomers and co-monomers can be a gas at room temperature.

In some aspects, the first temperature can be lower than a boiling point of the unreacted monomers and/or unreacted co-monomers. In such aspects, heating the precursor dielectric polymeric composition to the first temperature can lead to further polymerization of unreacted monomers and/or unreacted co-monomers, respectively.

In other aspects, the first temperature can be greater than a boiling point of the unreacted monomers and/or unreacted co-monomers. In such aspects, heating the precursor dielectric polymeric composition to the first temperature can lead to the physical removal of the unreacted monomers and/or unreacted co-monomers, respectively, from the precursor dielectric polymeric composition; although a portion of the unreacted monomers and/or unreacted co-monomers could still polymerize at the first temperature (as opposed to being physically removed from the composition).

In an aspect, subsequent to heating the precursor dielectric polymeric composition to the first temperature, the precursor dielectric polymeric composition can be heated to a second temperature of from about 70° C. to about 200° C., alternatively from about 75° C. to about 175° C., or alternatively from about 80° C. to about 150° C.; for a second time period of from about 30 min to about 6 h, alternatively from about 1 h to about 5 h, or alternatively from about 2 h to about 4 h; wherein the second temperature is greater than the first temperature.

In some aspects, heating the precursor dielectric polymeric composition to the second temperature can be done step-wise. In such aspects, the precursor dielectric polymeric can be heated to an initial temperature in the range of from about 70° C. to about 200° C., wherein the initial temperature can be held for an initial time period of from about 30 min to about 6 h; followed by heating the precursor dielectric polymeric composition to an intermediary temperature in the range of from about 70° C. to about 200° C., wherein the intermediary temperature can be held for an intermediary time period of from about 30 min to about 6 h, and wherein the intermediary temperature can be greater than the initial temperature. Heating the precursor dielectric polymeric composition to the second temperature can further comprise one or more additional heating steps; for example heating the precursor dielectric polymeric composition to a final temperature in the range of from about 70° C. to about 200° C., wherein the final temperature can be held for a final time period of from about 30 min to about 6 h, and wherein the final temperature can be greater than the intermediary temperature. The step-wise heating of the precursor dielectric polymeric composition to the second temperature can have two or more heating steps, for example, 2, 3, 4, 5, or more heating steps. In some aspects, the precursor dielectric polymeric composition can be heated and held at an initial temperature of about 80° C. for about 2-4 h, followed by heating and holding at an intermediary temperature of about 120° C. for about 2-4 h, and then followed by heating and holding at a final temperature of about 150° C. for about 2-4 h.

In an aspect, the second temperature can be lower than a boiling point of the ionic liquid. In some aspects, the second temperature can be greater than a boiling point of the polymerizable vinyl monomer and the polymerizable co-monomer. Without wishing to be limited by theory, by heating the precursor dielectric polymeric composition to a temperature that is greater than the boiling point of the unreacted monomer and unreacted co-monomer, the unreacted monomer and unreacted co-monomer will change state from a liquid state into a gaseous state and diffuse out of the precursor dielectric polymeric composition, thereby forming the dielectric polymeric composition.

In an aspect, subsequent to heating the precursor dielectric polymeric composition to form the dielectric polymeric composition, the dielectric polymeric composition can be allowed to cool to (e.g., to reach) ambient temperature (e.g., room temperature). In some aspects, cooling the dielectric polymeric composition can further comprise removing a heating source used during heating the precursor dielectric polymeric composition. In other aspects, the dielectric polymeric composition can be cooled by actively cooling the dielectric polymeric composition, for example in a forced air-flow environment (e.g., cooled air-flow environment).

In an aspect, a dielectric polymeric composition as disclosed herein can comprise (a) a polymeric matrix, wherein the polymeric matrix comprises structural units derived from at least one polymerizable vinyl monomer; (b) an ionic liquid, wherein the ionic liquid comprises an organic cation and a balancing anion, wherein the ionic liquid is miscible or partially miscible with the at least one polymerizable vinyl monomer, and wherein the concentration of the ionic liquid in the dielectric polymeric composition ranges from about 0.5 wt. % to about 30 wt. %, alternatively from about 1 wt. % to about 10 wt. %, or alternatively from about 4 wt. % to about 6 wt. %; and (c) less than about 10 ppm, alternatively less than about 5 ppm, or alternatively less than about 1 ppm of unreacted polymerizable vinyl monomer, based on the total weight of the dielectric polymeric composition, wherein an amount of unreacted polymerizable vinyl monomer in the dielectric polymeric composition is measured via HPLC.

In an aspect, the dielectric polymeric composition as disclosed herein can be a polymeric composite, wherein the dielectric polymeric composition comprises a continuous polymeric phase comprising the polymeric matrix having dispersed therein an ionic liquid dispersed phase, and wherein the ionic liquid dispersed phase comprises the ionic liquid. As will be appreciated by one of skill in the art, and with the help of this disclosure, while the ionic liquid dispersed phase primarily comprises the ionic liquid (e.g., equal to or greater than about 50 vol. % ionic liquid), some polymerized material (e.g., polymeric matrix) can also be entrained in the ionic liquid dispersed phase.

The ionic liquid dispersed phase can be characterized by an average cross section size. For purposes of the disclosure herein, the average cross section size refers to an arithmetic mean of cross section diameters, wherein the diameter refers to the largest dimension of a dispersed phase of any two dimensional cross section through a material (e.g., dielectric polymeric composition). The average cross section size can be determined by electron microscopy, for example scanning electron microscopy (SEM).

Without wishing to be limited by theory, the dielectric polymeric composition can be thought of as a polymeric composite characterized by a "critical" average cross section size of the ionic liquid dispersed phase (e.g., about 200 nm), wherein the dielectric polymeric composition exhibits homogeneous macroscopic properties (e.g., transparency, $\Delta T_g \geq 25°$ C., single $T_g$) below the critical average cross section size of the ionic liquid dispersed phase, and wherein the dielectric polymeric composition exhibits heterogeneous properties (e.g., translucency and/or more than one $T_g$; $\Delta T_g < 25°$ C.) above the critical average cross section size of the ionic liquid dispersed phase. Further, and without wishing to be limited by theory, the dielectric polymeric composition behaves as a single phase composition (as opposed to a multi-phase composition) below the critical average cross section size of the ionic liquid dispersed phase, and as a multi-phase composition (as opposed to a single phase composition) above the critical average cross section size of the ionic liquid dispersed phase.

In some aspects, the ionic liquid can be compatible with the polymeric matrix, wherein the ionic liquid dispersed phase can have an average cross section size of less than about 200 nm, alternatively less than about 175 nm, alternatively less than about 150 nm, alternatively less than about 100 nm, alternatively less than about 50 nm, alternatively less than about 20 nm, alternatively from about 5 nm to about 200 nm, alternatively from about 20 nm to about 175 nm, or alternatively from about 50 nm to about 150 nm. In such aspects, a difference between a $T_g$ of the polymeric matrix and a $T_g$ of the dielectric polymeric composition ($\Delta T_g$) is equal to or greater than about 25° C. In such aspects, the dielectric polymeric composition is transparent. Without wishing to be limited by theory, when the average cross section size of the ionic liquid dispersed phase is less than 200 nm, the dielectric polymeric composition appears transparent, given that the highest resolution achievable with an optical microscope is about 200 nm (about half of the wavelength of visible light), and given that the concentration of the ionic liquid in the dielectric polymeric composition is fairly low (below 30 wt. %).

In other aspects, the ionic liquid can be partially compatible with the polymeric matrix, wherein the ionic liquid dispersed phase can have an average cross section size of equal to or greater than about 200 nm, alternatively equal to or greater than about 300 nm, alternatively equal to or greater than about 400 nm, or alternatively equal to or greater than about 500 nm. In such aspects, a difference between a $T_g$ of the polymeric matrix and a $T_g$ of the dielectric polymeric composition ($\Delta T_g$) is from about 5° C. to about 25° C. In such aspects, the dielectric polymeric composition can be translucent. Without wishing to be limited by theory, when the average cross section size of the ionic liquid dispersed phase is greater than 200 nm, the dielectric polymeric composition appears translucent, owing to the ionic liquid dispersed phase being visible (for example under an optical microscope) and diffracting or scattering a portion of the light.

In an aspect, the dielectric polymeric composition consists essentially of or consists of the ionic liquid, the polymeric matrix, and less than about 10 ppm unreacted polymerizable vinyl monomer, wherein an amount of unreacted polymerizable vinyl monomer in the dielectric polymeric composition is measured via HPLC.

In some aspects, the dielectric polymeric composition consists essentially of or consists of the ionic liquid and the polymeric matrix, wherein the dielectric polymeric composition substantially excludes unreacted polymerizable vinyl monomer (e.g., the dielectric polymeric composition is substantially free of unreacted polymerizable vinyl monomer); for example the dielectric polymeric composition comprises less than about 0.01 mol %, alternatively less than about 0.001 mol %, or alternatively less than about 0.0001 mol % unreacted polymerizable vinyl monomer. A dielectric polymeric composition that is substantially free of unreacted polymerizable vinyl monomer can comprise an amount of unreacted polymerizable vinyl monomer that is below the detection limit of the analytical method used for measuring the amount of unreacted polymerizable vinyl monomer (e.g., HPLC).

In an aspect, a volumetric concentration of the ionic liquid in any 1 μm³ of dielectric polymeric composition differs by less than about 10%, alternatively by less than about 7.5%, or alternatively by less than about 5% from an average volumetric concentration of the ionic liquid in the dielectric polymeric composition as a whole.

In an aspect, the polymeric matrix comprises structural units derived from at least one polymerizable vinyl monomer. In an aspect, the polymeric matrix comprises PMMA, wherein the polymeric matrix comprises structural units derived from methyl methacrylate (MMA).

In an aspect, the polymeric matrix can be a copolymer comprising structural units derived from two polymerizable vinyl monomers. In some aspects, the polymeric matrix comprises structural units derived from styrene and structural units derived from acrylonitrile, wherein the polymeric matrix can have Structure II:

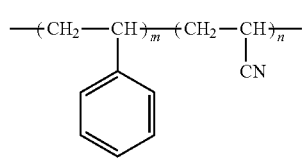

Structure II wherein the structural units derived from styrene (repeated m times) are present in the polymeric matrix in an amount of from about 60 wt. % to about 90 wt. %, alternatively from about 60 wt. % to about 80 wt. %, alternatively from about 70 wt. % to about 80 wt. %, or alternatively from about 60 wt. % to about 75 wt. %; and wherein the structural units derived from acrylonitrile (repeated n times) are present in the polymeric matrix in an amount of from about 10 wt. % to about 40 wt. %, alternatively from about 20 wt. % to about 40 wt. %, alternatively from about 20 wt. % to about 30 wt. %, or alternatively from about 15 wt. % to about 40 wt. %.

In an aspect, the polymeric matrix can comprise from about 70 wt. % to about 80 wt. %, alternatively from about 71 wt. % to about 79 wt. %, or alternatively from about 72.5 wt. % to about 77.5 wt. % structural units derived from styrene, and from about 20 wt. % to about 30 wt. %, alternatively from about 21 wt. % to about 29 wt. %, or alternatively from about 22.5 wt. % to about 27.5 wt. % structural units derived from acrylonitrile; and wherein the concentration of the ionic liquid in the dielectric polymeric composition ranges from about 1 wt. % to about 10 wt. %, or alternatively from about 4 wt. % to about 6 wt. %.

In an aspect, the polymeric matrix can be a terpolymer comprising structural units derived from at least one polymerizable acrylate monomer (e.g., MMA), and structural units derived from two polymerizable vinyl monomers other than the at least one polymerizable acrylate monomer (e.g., other than MMA).

In some aspects, the polymeric matrix comprises structural units derived from styrene, structural units derived from acrylonitrile, and structural units derived from methyl methacrylate, wherein the polymeric matrix can have Structure III:

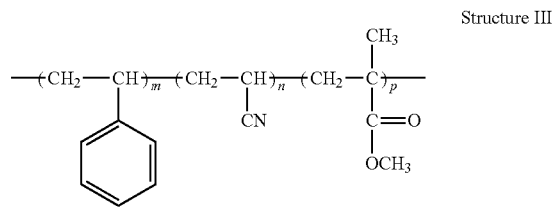

Structure III wherein the structural units derived from styrene (repeated m times) are present in the polymeric matrix in an amount of from about 30 wt. % to about 80 wt. %, alternatively from about 35 wt. % to about 60 wt. %, or alternatively from about 38 wt. % to about 42 wt. %; wherein the structural units derived from acrylonitrile (repeated n times) are present in the polymeric matrix in an amount of from about 10 wt. % to about 40 wt. %, alternatively from about 20 wt. % to about 30 wt. %, or alternatively from about 23 wt. % to about 26 wt. %; and wherein the structural units derived from methyl methacrylate (repeated p times) are present in the polymeric matrix in an amount of from about 10 wt. % to about 40 wt. %, alternatively from about 20 wt. % to about 40 wt. %, or alternatively from about 33 wt. % to about 36 wt. %.

In an aspect, the polymeric matrix can comprise from about 30 wt. % to about 40 wt. %, alternatively from about 31 wt. % to about 39 wt. %, or alternatively from about 32.5 wt. % to about 37.5 wt. % structural units derived from methyl methacrylate (MMA), from about 35 wt. % to about 45 wt. %, alternatively from about 36 wt. % to about 44 wt. %, or alternatively from about 37.5 wt. % to about 42.5 wt.

% structural units derived from styrene, and from about 20 wt. % to about 30 wt. %, alternatively from about 21 wt. % to about 29 wt. %, or alternatively from about 22.5 wt. % to about 27.5 wt. % structural units derived from acrylonitrile; and wherein the concentration of the ionic liquid in the dielectric polymeric composition ranges from about 1 wt. % to about 10 wt. %, or alternatively from about 4 wt. % to about 6 wt. %.

In an aspect, the polymeric matrix can be characterized by a number average molecular weight ($M_n$) of from about 200,000 grams per mole (g/mol) or Dalton (Da) to about 300,000 Da, alternatively from about 210,000 Da to about 290,000 Da, or alternatively from about 220,000 Da to about 275,000 Da, as measured by gel permeation chromatography (GPC), using a polystyrene standard. Generally, $M_n$ can be calculated according to equation 1:

$$M_n = \frac{\sum_i N_i M_i}{\sum_i N_i} \quad (1)$$

wherein $N_i$ is the number of molecules of molecular weight $M_i$.

In an aspect, the polymeric matrix can be characterized by a molecular weight distribution (MWD) of from about 1 to about 5, alternatively from about 1.5 to about 4, or alternatively from about 2 to about 3, as determined in accordance with size exclusion chromatography/differential viscometry (SEC/DV). Generally, MWD, also known as polydispersity index (PDI), is a measure of the distribution of molecular mass in a given polymer sample. MWD can be calculated by dividing the weight average molecular weight by the number average molecular weight.

In an aspect, the ionic liquid imparts flexibility to the dielectric polymeric composition, wherein the dielectric polymeric composition is characterized by a storage modulus (G') that is lower than the G' of the polymeric matrix in the absence of the ionic liquid. Generally, the storage modulus (G') is a measure of the energy stored in a material in which a deformation has been imposed; and can be measured in accordance with ASTM D4440-15, under a specific set of conditions, such as at room temperature and 0.1 rad/s. The storage modulus can be thought of that proportion of the total rigidity (complex modulus) of a material that is attributable to elastic deformation. Without wishing to be limited by theory, small molecules such as ionic liquid molecules (by comparison with significantly larger polymer molecules that form the polymeric matrix) can act as a plasticizer within the dielectric polymeric composition, thereby improving the flexibility of the dielectric polymeric composition.

In some aspects, the dielectric polymeric composition can be characterized by a storage modulus that is decreased by equal to or greater than about 25%, alternatively equal to or greater than about 30%, alternatively equal to or greater than about 40%, or alternatively equal to or greater than about 50% when compared to the storage modulus of the polymeric matrix in the absence of the ionic liquid. For example, a PMMA polymeric matrix can be characterized by a G' of 1.45 GPa, while a dielectric composition comprising PMMA and 5 wt. % $BMImPF_6$ can be characterized by a G' of 782 MPa, wherein G' is measured at room temperature and 0.1 rad/s in accordance with ASTM D4440-15.

Dielectric materials are electrical insulators that can be polarized by an applied electric field. As will be appreciated by one of skill in the art, and with the help of this disclosure, the primary feature of a dielectric material is its ability to store charge (e.g., capacitive component), which allows for a dielectric material to be used for ferroelectric applications, piezoelectric applications, capacitive applications, insulating applications, etc.

In an aspect, the dielectric polymeric composition can be piezoelectric. Piezoelectric materials are dielectric materials that can generate a potential difference when subjected to mechanical stress, or (equivalently) change physical shape if an external voltage is applied across the material. As will be appreciated by one of skill in the art and with the help of this disclosure, by having flexibility, the dielectric polymeric composition is able to resume its normal shape after being stretched or compressed, thereby making the dielectric polymeric composition suitable for applications that require their components to display a certain degree of flexibility (e.g., electronic devices). Without wishing to be limited by theory, due to its flexibility, application of pressure can deform the dielectric polymeric composition, thereby pushing ion dipoles (organic cations and anions) of the ionic liquid closer together or further apart, upsetting the balance of positive and negative charge, and causing net electrical charges to appear. This effect can carry through the whole dielectric polymeric composition, such that net positive and negative charges appear on opposite, outer surfaces of the dielectric polymeric composition (i.e., piezoelectric effects). In some aspects, the dielectric polymeric composition can also be used for reverse-piezoelectric effects. Without wishing to be limited by theory, when a voltage is applied across a dielectric polymeric composition, the ion dipoles of the ionic liquid inside the polymeric matrix are subjected to "electrical pressure," causing the ion dipoles to move to rebalance the charge, thereby causing the dielectric polymeric composition to deform (slightly change shape).

In an aspect, the dielectric polymeric composition can be ferroelectric. Ferroelectric materials are piezoelectric materials that exhibit spontaneous electric polarization that can be reversed repeatedly by the application of an external opposing electric field. The polarization reversal can be observed by measuring the ferroelectric hysteresis. The ionic liquid provides a source of ion dipoles (organic cations and anions) that enable the spontaneous electric polarization (e.g., spontaneous orientation of ion dipoles) of the dielectric polymeric composition. Generally, polarization is expressed as $C/m^2$ or $\mu C/cm^2$.

Ferroelectric materials, such as the dielectric polymeric compositions disclosed herein, are ionically non-conductive. While the ionic liquids are ionically conductive, the dielectric polymeric composition disclosed herein are ionically non-conductive, owing to a low amount of ionic liquid present in the dielectric polymeric composition (e.g., less than about 30 wt. % ionic liquid) in the form of a dispersed phase (e.g., ionic liquid dispersed phase). As will be appreciated by one of skill in the art, and with the help of this disclosure, when large amounts of ionic liquids are used in polymers (e.g., more than about 30 wt. % ionic liquid), the resulting materials are polymer electrolytes, which can be ionically conductive and/or electrically conductive. Ferroelectric materials, such as the dielectric polymeric composition disclosed herein, are electrically non-conductive. Some dielectric materials are characterized by leakage, which is a small amount of current that can flow through the dielectric material. As will be appreciated by one of skill in the art, and with the help of this disclosure, if a dielectric material does not have a charge storing capacity, and thus leaks, it will have very poor ferroelectric properties.

As will be appreciated by one of skill in the art, and with the help of this disclosure, ferroelectricity is a subset of piezoelectricity, thus all ferroelectric materials are piezoelectric but not all piezoelectric materials are ferroelectric. Ferroelectric materials can generally be characterized by their ferroelectric properties, such as remnant polarization, coercive field, maximum polarization, polarization loss, dielectric constant, and the like, or combinations thereof. Generally, a dielectric constant of a material refers to the rate of change of dielectric displacement with applied electric field. Without wishing to be limited by theory, in a ferroelectric material, the polarization does not return to zero upon removal of the applied electric field, because some of the dipoles (e.g., dipoles of the ionic liquid) remain aligned in the direction of the previously applied positive field, and the ferroelectric material will still be polarized, thus displaying a polarization that is referred to as a remnant polarization (which can also be referred to as residual polarization). The ferroelectric material cannot be completely depolarized until an electric field of the same magnitude as the field applied for polarization, is applied in the negative direction. Generally, the external field required to reduce the polarization to zero is referred to as a coercive field. Generally, the coercive field is expressed as kV/m or kV/cm.

A ferroelectric material is generally characterized by a maximum polarization value that can be achieved under a given electric field. Generally, the maximum polarization is expressed as $C/m^2$ or $\mu C/cm^2$. Further, a ferroelectric material can be characterized by a polarization loss, wherein the polarization loss can be defined as the percentage of maximum polarization lost under the applied electric field. Ferroelectric properties as disclosed herein can be measured and calculated in accordance with ANSI/IEEE 180-1986. The measurement and calculation of ferroelectric properties is described in more detail in a NPL Report CMMT(A) 152, 1999, "Ferroelectric Hysteresis Measurement and Analysis" by M. Stewart, M. G. Cain, and D. A. Hall; which is incorporated by reference herein in its entirety.

In an aspect, the dielectric polymeric composition as disclosed herein is characterized by remnant polarization. In an aspect, the dielectric polymeric composition can be characterized by a remnant polarization of equal to or greater than about 0.1 $\mu C/cm^2$, alternatively equal to or greater than about 0.2 $\mu C/cm^2$, or alternatively equal to or greater than about 0.3 $\mu C/cm^2$, subsequent to removal of an applied electric field of 150 kV/cm.

In an aspect, the dielectric polymeric composition as disclosed herein can be characterized by a maximum polarization of equal to or greater than about 0.4 $\mu C/cm^2$, alternatively equal to or greater than about 0.5 $\mu C/cm^2$, or alternatively equal to or greater than about 0.6 $\mu C/cm^2$ under an applied electric field of 150 kV/cm.

In an aspect, the dielectric polymeric composition as disclosed herein can be characterized by a low polarization loss; for example when compared with the polarization loss of an otherwise similar dielectric composition comprising the polymeric matrix and the ionic liquid, and equal to or greater than about 10 ppm unreacted monomer/co-monomer.

In an aspect, the dielectric polymeric composition as disclosed herein can be characterized by a polarization loss of less than about 35%, alternatively less than about 25%, alternatively less than about 20%, alternatively less than about 10%, alternatively less than about 5%, alternatively less than about 3%, alternatively less than about 1%, or alternatively less than about 0.1%.

In an aspect, the dielectric polymeric composition as disclosed herein can be characterized by a coercive field of equal to or greater than about 20 kV/cm, alternatively equal to or greater than about 25 kV/cm, alternatively equal to or greater than about 30 kV/cm, alternatively equal to or greater than about 40 kV/cm, or alternatively equal to or greater than about 50 kV/cm, under an applied electric field of 150 kV/cm.

In an aspect, the dielectric polymeric composition as disclosed herein can be characterized by a dielectric constant (E) at 1 kHz of from about 5 to about 30, alternatively from about 10 to about 25, or alternatively from about 15 to about 20.

In some aspects, the dielectric polymeric composition can be characterized by (i) a dielectric constant (E) at 1 kHz of from about 5 to about 30; and (ii) a polarization loss of less than about 10%.

In an aspect, a dielectric polymeric composition as disclosed herein can comprise (a) a polymeric matrix, wherein the polymeric matrix comprises structural units derived from at least one polymerizable vinyl monomer and a polymerizable co-monomer, and wherein the polymerizable co-monomer comprises at least one functional group that has the ability to form hydrogen bonds within the polymeric matrix; and (b) an ionic liquid, wherein the ionic liquid comprises an organic cation and a balancing anion, wherein the ionic liquid is miscible or partially miscible with the at least one polymerizable vinyl monomer, wherein the ionic liquid is miscible or partially miscible with the polymerizable co-monomer, and wherein the concentration of the ionic liquid in the dielectric polymeric composition ranges from about 0.5 wt. % to about 30 wt. %, alternatively from about 1 wt. % to about 10 wt. %, or alternatively from about 4 wt. % to about 6 wt. %. In such aspect, the polymeric matrix can comprise hydrogen bonds between structural units derived from the polymerizable co-monomer and structural units derived from the at least one polymerizable vinyl monomer. For purposes of the disclosure herein, a dielectric polymeric composition comprising structural units derived from a polymerizable co-monomer having at least one functional group that has the ability to form hydrogen bonds within the polymeric matrix can also be referred to as a "hydrogen bonded dielectric polymeric composition;" and the terms dielectric polymeric composition and hydrogen bonded dielectric polymeric composition can be used interchangeably.

In an aspect, a hydrogen bonded dielectric polymeric composition as disclosed herein can comprise less than about 10 ppm, alternatively less than about 5 ppm, or alternatively less than about 1 ppm of unreacted polymerizable vinyl monomer and unreacted polymerizable co-monomer, based on the total weight of the dielectric polymeric composition, wherein an amount of unreacted polymerizable vinyl monomer and unreacted polymerizable co-monomer in the dielectric polymeric composition is measured via HPLC.

In an aspect, a hydrogen bonded dielectric polymeric composition as disclosed herein can comprise a polymeric matrix comprising from about 70 wt. % to about 95 wt. %, alternatively from about 75 wt. % to about 92.5 wt. %, or alternatively from about 80 wt. % to about 90 wt. % structural units derived from the at least one polymerizable vinyl monomer, and from about 5 wt. % to about 30 wt. %, alternatively from about 7.5 wt. % to about 25 wt. %, or alternatively from about 10 wt. % to about 20 wt. % structural units derived from the polymerizable co-monomer.

In some aspects, a hydrogen bonded dielectric polymeric composition as disclosed herein can comprise a polymeric matrix comprising structural units derived from at least one polymerizable vinyl monomer and a polymerizable co-monomer; wherein the at least one polymerizable vinyl monomer comprises an alkyl methacrylate, and wherein the polymerizable co-monomer comprises a hydroxyalkyl methacrylate. In such aspects, the polymeric matrix can comprise from about 85 wt. % to about 95 wt. %, alternatively from about 87.5 wt. % to about 92.5 wt. %, or alternatively from about 88 wt. % to about 92 wt. % structural units derived from methyl methacrylate (MMA), and from about 5 wt. % to about 15 wt. %, alternatively from about 7.5 wt. % to about 12.5 wt. %, or alternatively from about 8 wt. % to about 12 wt. % structural units derived from 2-hydroxyethyl methacrylate (HEMA); and the concentration of the ionic liquid in the dielectric polymeric composition can range from about 1 wt. % to about 10 wt. %, or alternatively from about 4 wt. % to about 6 wt. %.

In some aspects, a hydrogen bonded dielectric polymeric composition as disclosed herein can comprise a polymeric matrix comprising about 90 wt. % structural units derived from methyl methacrylate (MMA), and about 10 wt. % structural units derived from 2-hydroxyethyl methacrylate (HEMA); and an ionic liquid in an amount of 5 wt. % in the dielectric polymeric composition.

In an aspect, a hydrogen bonded dielectric polymeric composition as disclosed herein comprises a continuous polymeric phase comprising the polymeric matrix having dispersed therein an ionic liquid dispersed phase, wherein the ionic liquid dispersed phase comprises the ionic liquid. For purposes of the disclosure herein, all descriptions related to the structure and properties of the dielectric polymeric composition can be applied to the structure and properties of the hydrogen bonded dielectric polymeric composition, respectively, unless otherwise specified herein.

In some aspects, the hydrogen bonded dielectric polymeric composition as disclosed herein comprises an ionic liquid that is compatible with the polymeric matrix, wherein the ionic liquid dispersed phase can have an average cross section size of less than about 200 nm. In such aspects, a difference between a $T_g$ of the polymeric matrix and a $T_g$ of the hydrogen bonded dielectric polymeric composition ($\Delta T_g$) is equal to or greater than about 25° C. In such aspects, the hydrogen bonded dielectric polymeric composition is transparent.

In other aspects, the hydrogen bonded dielectric polymeric composition as disclosed herein comprises an ionic liquid that is partially compatible with the polymeric matrix, wherein the ionic liquid dispersed phase can have an average cross section size of equal to or greater than about 200 nm. In such aspects, a difference between a $T_g$ of the polymeric matrix and a $T_g$ of the hydrogen bonded dielectric polymeric composition ($\Delta T_g$) is from about 5° C. to about 25° C. In such aspects, the hydrogen bonded dielectric polymeric composition can be translucent.

In an aspect, a hydrogen bonded dielectric polymeric composition as disclosed herein can be ferroelectric.

In an aspect, a hydrogen bonded dielectric polymeric composition as disclosed herein can be characterized by a maximum polarization of equal to or greater than about 0.6 $\mu C/cm^2$, alternatively equal to or greater than about 0.65 $\mu C/cm^2$, or alternatively equal to or greater than about 0.7 $\mu C/cm$, under an applied electric field of 150 kV/cm.

In an aspect, a hydrogen bonded dielectric polymeric composition as disclosed herein can be characterized by a maximum polarization that is increased by equal to or greater than about 25%, alternatively equal to or greater than about 35%, or alternatively equal to or greater than about 50% when compared to a maximum polarization of an otherwise similar dielectric polymeric composition (i) comprising a polymeric matrix and an ionic liquid and (ii) without the structural units derived from a polymerizable co-monomer.

In an aspect, a hydrogen bonded dielectric polymeric composition as disclosed herein can be characterized by a remnant polarization of equal to or greater than about 0.25 $\mu C/cm^2$, alternatively equal to or greater than about 0.3 $\mu C/cm^2$, or alternatively equal to or greater than about 0.35 $\mu C/cm^2$, subsequent to removal of an applied electric field of 150 kV/cm.

In an aspect, a hydrogen bonded dielectric polymeric composition as disclosed herein can be characterized by a remnant polarization subsequent to removal of an applied electric field of 150 kV/cm that is increased by equal to or greater than about 50%, alternatively equal to or greater than about 60%, or alternatively equal to or greater than about 75% when compared to a remnant polarization subsequent to removal of an applied electric field of 150 kV/cm of an otherwise similar dielectric polymeric composition (i) comprising a polymeric matrix and an ionic liquid and (ii) without the structural units derived from a polymerizable co-monomer.

In an aspect, a hydrogen bonded dielectric polymeric composition as disclosed herein can be characterized by a coercive field of equal to or greater than about 45 kV/cm, alternatively equal to or greater than about 50 kV/cm, or alternatively equal to or greater than about 55 kV/cm under an applied electric field of 150 kV/cm.

In an aspect, a hydrogen bonded dielectric polymeric composition as disclosed herein can be characterized by a coercive field under an applied electric field of 150 kV/cm that is increased by equal to or greater than about 75%, alternatively equal to or greater than about 85%, or alternatively equal to or greater than about 100% when compared to a coercive field under an applied electric field of 150 kV/cm of an otherwise similar dielectric polymeric composition (i) comprising a polymeric matrix and an ionic liquid and (ii) without the structural units derived from a polymerizable co-monomer.

In an aspect, a hydrogen bonded dielectric polymeric composition as disclosed herein can be characterized by a polarization loss of less than about 35%, alternatively less than about 25%, alternatively less than about 20%, alternatively less than about 10%, alternatively less than about 5%, alternatively less than about 3%, alternatively less than about 1%, or alternatively less than about 0.1%.

In an aspect, a dielectric polymeric composition as disclosed herein can comprise (a) a polymeric matrix (e.g., crosslinked polymeric matrix), wherein the polymeric matrix comprises a crosslinking agent and structural units derived from at least one polymerizable vinyl monomer, and wherein the polymeric matrix comprises covalent crosslinks between the crosslinking agent and the structural units derived from at least one polymerizable vinyl monomer; and (b) an ionic liquid, wherein the ionic liquid comprises an organic cation and a balancing anion, wherein the ionic liquid is miscible or partially miscible with the at least one polymerizable vinyl monomer, and wherein the concentration of the ionic liquid in the dielectric polymeric composition ranges from about 0.5 wt. % to about 30 wt. %, alternatively from about 1 wt. % to about 10 wt. %, or alternatively from about 4 wt. % to about 6 wt. %. For purposes of the disclosure herein, a dielectric polymeric composition comprising covalent crosslinks between the crosslinking agent and the structural units derived from at least one polymerizable vinyl monomer can also be referred to as a "crosslinked dielectric polymeric composition;" and the terms dielectric polymeric composition and crosslinked dielectric polymeric composition can be used interchangeably.

In an aspect, the crosslinking agent can be present in the crosslinked dielectric polymeric composition in an amount of from about 0.1 wt. % to about 10 wt. %, alternatively from about 1 wt. % to about 9 wt. %, or alternatively from about 4 wt. % to about 6 wt. %.

In an aspect, a crosslinked dielectric polymeric composition as disclosed herein can comprise less than about 10 ppm, alternatively less than about 5 ppm, or alternatively less than about 1 ppm of unreacted polymerizable vinyl monomer, based on the total weight of the dielectric polymeric composition, wherein an amount of unreacted polymerizable vinyl monomer in the dielectric polymeric composition is measured via HPLC.

In an aspect, a crosslinked dielectric polymeric composition as disclosed herein comprises a continuous polymeric phase comprising the polymeric matrix having dispersed therein an ionic liquid dispersed phase, wherein the ionic liquid dispersed phase comprises the ionic liquid. For purposes of the disclosure herein, all descriptions related to the structure and properties of the dielectric polymeric composition can be applied to the structure and properties of the crosslinked dielectric polymeric composition, respectively, unless otherwise specified herein.

In some aspects, the crosslinked dielectric polymeric composition as disclosed herein comprises an ionic liquid that is compatible with the polymeric matrix, wherein the ionic liquid dispersed phase can have an average cross section size of less than about 200 nm. In such aspects, a difference between a $T_g$ of the polymeric matrix and a $T_g$ of the crosslinked dielectric polymeric composition ($\Delta T_g$) is equal to or greater than about 25° C. In such aspects, the crosslinked dielectric polymeric composition is transparent.

In other aspects, the crosslinked dielectric polymeric composition as disclosed herein comprises an ionic liquid that is partially compatible with the polymeric matrix, wherein the ionic liquid dispersed phase can have an average cross section size of equal to or greater than about 200 nm. In such aspects, a difference between a $T_g$ of the polymeric matrix and a $T_g$ of the crosslinked dielectric polymeric composition ($\Delta T_g$) is from about 5° C. to about 25° C. In such aspects, the crosslinked dielectric polymeric composition can be translucent.

In an aspect, a crosslinked dielectric polymeric composition as disclosed herein can be ferroelectric.

In an aspect, a crosslinked dielectric polymeric composition as disclosed herein can be characterized by a maximum polarization of equal to or greater than about 0.65 $\mu C/cm^2$, alternatively equal to or greater than about 0.65 $\mu C/cm^2$, or alternatively equal to or greater than about 0.7 $\mu C/cm^2$, under an applied electric field of 150 kV/cm.

In an aspect, a crosslinked dielectric polymeric composition as disclosed herein can be characterized by a maximum polarization that is increased by equal to or greater than about 30%, alternatively equal to or greater than about 40%, or alternatively equal to or greater than about 50% when compared to a maximum polarization of an otherwise similar dielectric polymeric composition (i) comprising a polymeric matrix and an ionic liquid and (ii) without the crosslinking agent.

In an aspect, a crosslinked dielectric polymeric composition as disclosed herein can be characterized by a remnant polarization of equal to or greater than about 0.25 $\mu C/cm^2$, alternatively equal to or greater than about 0.30 $\mu C/cm^2$, or alternatively equal to or greater than about 0.35 $\mu C/cm^2$, subsequent to removal of an applied electric field of 150 kV/cm.

In an aspect, a crosslinked dielectric polymeric composition as disclosed herein can be characterized by a remnant polarization subsequent to removal of an applied electric field of 150 kV/cm that is increased by equal to or greater than about 50%, alternatively equal to or greater than about 60%, or alternatively equal to or greater than about 75% when compared to a remnant polarization subsequent to removal of an applied electric field of 150 kV/cm of an otherwise similar dielectric polymeric composition (i) comprising a polymeric matrix and an ionic liquid and (ii) without the crosslinking agent.

In an aspect, a crosslinked dielectric polymeric composition as disclosed herein can be characterized by a coercive field of equal to or greater than about 40 kV/cm, alternatively equal to or greater than about 45 kV/cm, or alternatively equal to or greater than about 50 kV/cm under an applied electric field of 150 kV/cm.

In an aspect, a crosslinked dielectric polymeric composition as disclosed herein can be characterized by a coercive field under an applied electric field of 150 kV/cm that is increased by equal to or greater than about 60%, alternatively equal to or greater than about 70%, or alternatively equal to or greater than about 75% when compared to a coercive field under an applied electric field of 150 kV/cm of an otherwise similar dielectric polymeric composition (i) comprising a polymeric matrix and an ionic liquid and (ii) without the crosslinking agent.

In an aspect, a crosslinked dielectric polymeric composition as disclosed herein can be characterized by a polarization loss of less than about 35%, alternatively less than about 25%, alternatively less than about 20%, alternatively less than about 10%, alternatively less than about 5%, alternatively less than about 3%, alternatively less than about 1%, or alternatively less than about 0.1%.

In an aspect, a dielectric polymeric composition as disclosed herein can comprise (a) a polymeric matrix; wherein the polymeric matrix comprises structural units derived from at least one polymerizable vinyl monomer; wherein the polymeric matrix comprises a crosslinking agent, structural units derived from a polymerizable co-monomer, or both a crosslinking agent and structural units derived from a polymerizable co-monomer; wherein the crosslinking agent covalently crosslinks the polymeric matrix; and wherein the polymerizable co-monomer comprises at least one functional group that has the ability to form hydrogen bonds within the polymeric matrix; (b) an ionic liquid, wherein the ionic liquid comprises an organic cation and a balancing anion, wherein the ionic liquid is miscible or partially miscible with the at least one polymerizable vinyl monomer, wherein the ionic liquid is miscible or partially miscible with the polymerizable co-monomer, and wherein the concentration of the ionic liquid in the dielectric polymeric composition ranges from about 0.5 wt. % to about 30 wt. %, alternatively from about 1 wt. % to about 10 wt. %, or alternatively from about 4 wt. % to about 6 wt. %; and (c) less than about 10 ppm, alternatively less than about 5 ppm, or alternatively less than about 1 ppm of unreacted polymerizable vinyl monomer and unreacted polymerizable co-monomer, based on the total weight of the dielectric polymeric composition, wherein an amount of unreacted polymerizable vinyl monomer and unreacted polymerizable co-monomer in the dielectric polymeric composition is measured via HPLC. For purposes of the disclosure herein, a dielectric polymeric composition comprising (i) structural units derived from a polymerizable co-monomer having at least one functional group that has the ability to form hydrogen bonds within the polymeric matrix; and/or (ii) covalent crosslinks between the crosslinking agent and the structural units derived from at least one polymerizable vinyl monomer can also be referred to as a hydrogen bonded and/or crosslinked dielectric polymeric composition, respectively; and the terms dielectric polymeric composition and hydrogen bonded and/or crosslinked dielectric polymeric composition can be used interchangeably. For purposes of the disclosure herein, all descriptions related to the structure and properties of the dielectric polymeric composition, hydrogen bonded dielectric polymeric composition, and crosslinked dielectric polymeric composition can be applied to the structure and properties of the hydrogen bonded and/or crosslinked dielectric polymeric composition, unless otherwise specified herein.

In an aspect, a hydrogen bonded and/or crosslinked dielectric polymeric composition as disclosed herein can comprise a polymeric matrix comprising covalent crosslinks between the crosslinking agent, and the structural units derived from the at least one polymerizable vinyl monomer and optionally the structural units derived from the polymerizable co-monomer.

In an aspect, a hydrogen bonded and/or crosslinked dielectric polymeric composition as disclosed herein can comprise a polymeric matrix comprising hydrogen bonds between the structural units derived from the polymerizable co-monomer and the structural units derived from at least one polymerizable vinyl monomer.

In some aspects, a hydrogen bonded and/or crosslinked dielectric polymeric composition as disclosed herein comprises an ionic liquid that is compatible with the polymeric matrix, wherein the ionic liquid dispersed phase can have an average cross section size of less than about 200 nm. In such aspects, a difference between a $T_g$ of the polymeric matrix and a $T_g$ of the hydrogen bonded and/or crosslinked dielectric polymeric composition ($\Delta T_g$) is equal to or greater than about 25° C. In such aspects, the hydrogen bonded and/or crosslinked dielectric polymeric composition is transparent.

In other aspects, a hydrogen bonded and/or crosslinked dielectric polymeric composition as disclosed herein comprises an ionic liquid that is partially compatible with the polymeric matrix, wherein the ionic liquid dispersed phase can have an average cross section size of equal to or greater than about 200 nm. In such aspects, a difference between a $T_g$ of the polymeric matrix and a $T_g$ of the hydrogen bonded and/or crosslinked dielectric polymeric composition ($\Delta T_g$) is from about 5° C. to about 25° C. In such aspects, the hydrogen bonded and/or crosslinked dielectric polymeric composition can be translucent.

In an aspect, a hydrogen bonded and/or crosslinked dielectric polymeric composition as disclosed herein can be ferroelectric.

In an aspect, a hydrogen bonded and/or crosslinked dielectric polymeric composition as disclosed herein can be characterized by a polarization loss of less than about 35%, alternatively less than about 25%, alternatively less than about 20%, alternatively less than about 10%, alternatively less than about 5%, alternatively less than about 3%, alternatively less than about 1%, or alternatively less than about 0.1%.

In an aspect, a dielectric polymeric composition as described herein can be formed into any suitable article of manufacture by using any suitable methodology (e.g., casting). In such aspect, the article can be a film or a sheet.

In an aspect, a piezoelectric device can comprise an article formed from a dielectric polymeric composition as disclosed herein. In such aspect, the piezoelectric device can be selected from the group consisting of a piezoelectric sensor (e.g., mechanical sensor), a piezoelectric transducer, a piezoelectric energy harvester, and a piezoelectric actuator (e.g., mechanical actuator).

Mechanical sensors can take advantage of the direct piezoelectric effect of the dielectric polymeric composition (e.g., dielectric polymeric material), in which changes in stress on the dielectric polymeric composition cause a strain on the dielectric polymeric composition further causing displacement of the charge centers of the anions and cations in the composition to produce an electric field, as previously described herein. Such electric field can be measured and used to determine the stress applied to the dielectric polymeric composition. For example, a read-out circuit, such as a voltmeter or any other suitable circuit configured to measure a voltage between two points can be coupled to the dielectric polymeric composition or electrodes in electrical contact with the dielectric polymeric composition. That read-out circuit can be coupled to processing logic configured to determine the voltage across the dielectric polymeric composition (e.g., piezoelectric material, ferroelectric material) resulting from an applied stress and, subsequently, to determine the applied stress by processing the determined voltage. For example, the determined voltage can be compared to a look-up table of values to determine the applied stress. As another example, a formula can be implemented in hardware or software to determine the applied stress based, at least in part, on the determined voltage. Such a formula can include known or measured quantities of the dielectric polymeric composition, for example, a piezoelectric coefficient value or values.

Mechanical actuators can take advantage of the converse piezoelectric effect of the dielectric polymeric composition (e.g., dielectric polymeric material), in which application of an electric field across the dielectric polymeric composition (e.g., piezoelectric material, ferroelectric material) by a voltage source causes a strain on the dielectric polymeric composition causing an expansion or contraction of the dielectric polymeric composition to accommodate the changed strain, as previously described herein. The electric field can be controlled to obtain a desired contraction and expansion of the dielectric polymeric composition. For example, a voltage source, such as an alternating current (AC) or direct current (DC) power source, and a controller can be coupled to the dielectric polymeric composition or electrodes in electrical contact with the dielectric polymeric composition. The controller can control the voltage source to generate a particular voltage to cause a specific expansion or contraction of the dielectric polymeric composition. In some aspects, the controller can implement a look-up table to correlate a desired change in shape or size of the dielectric polymeric composition with a particular voltage value to apply using the voltage source. In other aspects, the controller can implement a formula in hardware and/or software to determine a voltage value for application to the dielectric polymeric composition to obtain a desired change in shape and/or size of the dielectric polymeric composition. The formula can include known or measured parameters of the dielectric polymeric composition, for example, a piezoelectric coefficient value or values.

A controller that can be used with the actuators and/or sensors disclosed herein can include digital and/or analog control circuitry. An analog-to-digital converter (ADC) or digital-to-analog converter (DAC) can be used to interface digital control circuitry with analog control circuitry, digital control circuitry with analog devices, or vice versa. For example, a voltage source or a voltmeter coupled to a dielectric polymeric composition can be configured to generate analog output values and/or receive analog input values, whereas the controller can be digital control circuitry. A digital-to-analog converter (DAC) can be used to interface an output control signal from the controller to the voltage source. An analog-to-digital converter (ADC) can be used to interface an output value from the voltmeter to the controller. The controller can include or be coupled to a tangible computer readable medium with code, such as in firmware and/or software, to configure the controller to perform certain functions relating to the control of or measurement of dielectric polymeric-based components (e.g., a piezoelectric-based component, a ferroelectric-based component).

In some aspects, individual devices can comprise a dielectric polymeric composition as disclosed herein, wherein individual devices can be employed in a suitable end-use application. In other aspects, an array of devices comprising a plurality of individual devices can be employed in a suitable end-use application, wherein each individual device of the array of devices can comprise a dielectric polymeric composition that can be the same as or different from the dielectric polymeric composition of the other individual devices.

For example, a mechanical sensor can include an array of elements, wherein each element comprises a dielectric polymeric composition. By determining a stress applied to each of the elements, a two dimensional representation of the applied stress can be generated. By determining the applied stress to each element as a function of time, a movement of the applied stress can be determined. For example, when a user input device comprises an array of elements comprising a dielectric polymeric composition as disclosed herein, a swipe gesture by a user on the user input device can be determined.

Figure 6:
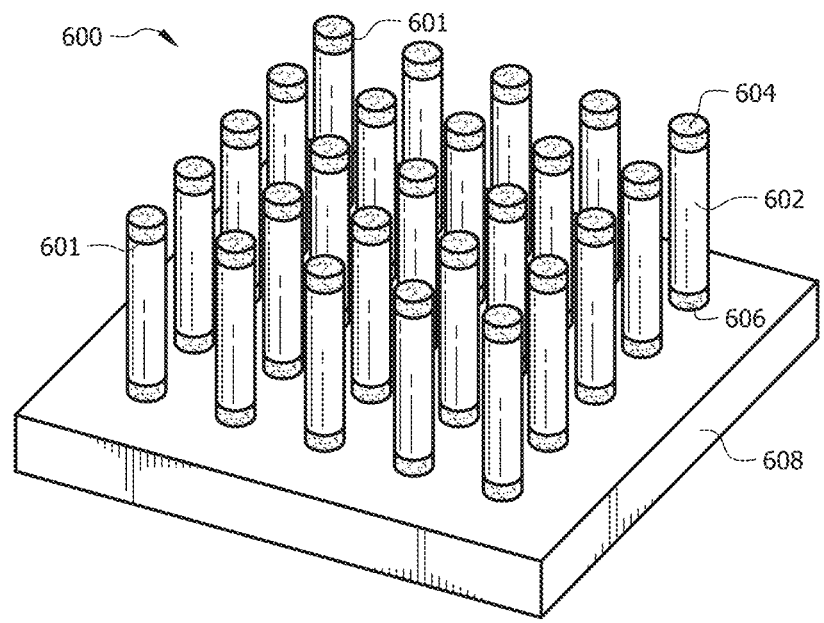
FIG. 6 is an illustration showing an array of dielectric polymeric composition-based actuators according to one aspect of the present disclosure.

FIG. 6 displays a configuration of an array of devices 600 comprising a plurality of individual devices 601, wherein each individual device 601 of the array of devices can comprise a dielectric polymeric composition. Each individual device 601 (e.g., actuator; sensor) of array 600 can comprise a dielectric polymeric composition 602. Dielectric polymeric composition 602 can be a dielectric polymeric composition as disclosed herein, wherein the dielectric polymeric composition comprises (i) a polymeric matrix, wherein the polymeric matrix comprises structural units derived from at least one polymerizable vinyl monomer; (ii) an ionic liquid, wherein the ionic liquid comprises an organic cation and a balancing anion, wherein the ionic liquid is miscible or partially miscible with the at least one polymerizable vinyl monomer, and wherein the concentration of the ionic liquid in the dielectric polymeric composition ranges from about 0.5 wt. % to about 30 wt. %; and (iii) less than about 10 ppm of unreacted polymerizable vinyl monomer, based on the total weight of the dielectric polymeric composition, wherein an amount of unreacted polymerizable vinyl monomer in the dielectric polymeric composition is measured via HPLC. Each individual device 601 (e.g., actuator; sensor) of array 600 can be characterized by a long axis (e.g., longitudinal axis) oriented approximately perpendicular to a surface of a substrate 608. Thus, each individual device 601 (e.g., actuator; sensor) of array 600 can extend orthogonally from substrate 608, for example toward a user when array 600 is a component part of a display of an electronic device. Electrodes 604 and 606 can be located on opposite ends of the longitudinal axis of each individual device 601 comprising the dielectric polymeric composition 602, wherein electrodes 604 and 606 are in contact with the dielectric polymeric composition 602. Electrodes 604 and 606 can comprise electrically conductive materials, for example a transparent conductive polymer, such as poly(3,4-ethylenedioxythiophene):polystyrene sulfonate (PEDOT:PSS); transparent conductive oxides, such as indium tin oxide (ITO), aluminum doped zinc oxide (AZO), F-doped $SnO_2$ ($F:SnO_2$), zinc-based oxides, and the like, or combinations thereof; graphene; graphene-like materials; metal-based nanowires and/or nanoparticles, such as silver nanowires, copper nanowires, carbon nanotubes, any other suitable carbon-based structures, and the like, or combinations thereof; a metal mesh; a nanomesh; any other suitable electrically conducting materials, such as copper, aluminum, alloys thereof, and the like, or combinations thereof; and the like, or combinations thereof.

Non-limiting examples of devices (e.g., apparatus) comprising actuators and/or sensors comprising the dielectric polymeric composition as disclosed herein can include ultrasonic devices, such as ultrasonic oscillators, ultrasonic motors, pressure sensors, acoustic sensors, transducers, energy harvesters, pyroelectric elements such as infrared (IR) sensors, etc. Dielectric polymeric compositions as disclosed herein (e.g., piezoelectric materials, ferroelectric materials) can also be incorporated into consumer electronic devices such as smartcards, radio frequency identification (RFID) cards/tags, memory devices, non-volatile memory, standalone memory, firmware, microcontrollers, gyroscopes, microgenerators, power supply circuits, circuit coupling, circuit decoupling, radio frequency (RF) filters, delay circuits, RF tuners, etc.

In aspects where the dielectric polymeric composition as disclosed herein is employed in a end-use technology and/or device, the dielectric polymeric composition can be coupled to a voltage source (e.g., drive circuit) configured to apply an electric potential across the dielectric polymeric composition, for example via electrodes such as electrodes 604 and 606. The voltage source and the dielectric polymeric composition can be configured in various spatial orientations, such that the applied electric potential and the direction of stress or strain in the dielectric polymeric composition are parallel, perpendicular (orthogonal), or at any other suitable angle. By orienting the applied electric potential in parallel or perpendicular with the stress or strain, the dielectric polymeric composition can be caused to expand or contract along certain directions under the application of certain voltages. By orienting the applied electric potential at other angles with the stress or strain, the dielectric polymeric composition can be caused to shear.

Non-limiting examples of a device comprising a dielectric polymeric composition-based mechanical sensor and/or actuator include a mobile computing device, a remote control for a television (e.g., entailing the use of a signal such as a wireless signal to control the television; for example to switch on or off the television, to adjust a control setting on the television, such as audio volume, screen brightness, channel setting, etc.), a control within an automobile (e.g., entailing the use of a signal such as wireless signal to control the automobile, or a component thereof; for example to switch on or off an automobile component, to adjust a control setting in an automobile), a switch such as a wall switch for a lighting device, etc. While some examples of devices comprising the dielectric polymeric composition as disclosed herein and uses thereof are disclosed in FIGS. 6-11, the dielectric polymeric composition as disclosed herein can be used in any other suitable device.

Referring to the array 600 in FIG. 6, a stimulus, such as a voltage, can be applied across the electrodes 604 and 606 to create an electric field through the dielectric polymeric composition 602. When the dielectric polymeric composition 602 has piezoelectric properties (e.g., ferroelectric properties), the electric field spanning between the electrodes 604 and 606 can cause the dielectric polymeric composition 602 to change shape. For example, an applied stimulus can be used to control a height (or length) of the dielectric polymeric composition 602 along the long axis. Thus, a height (or length) of an actuator may be adjusted and controlled by applying appropriate stimuli to the actuators. Each actuator of the array 600 can be individually controlled through appropriate circuitry to apply different stimuli to different actuators to create a texture that a user can feel. That texture can be created, for example, by overlying a display screen such that a person can feel a button or feel the texture of an animal's skin in a photograph. In an aspect, static deflection of the actuators can be caused by applying a DC signal as a stimulus to the actuators. Static deflection of the actuators is further described with reference to FIG. 7.

Figure 7:
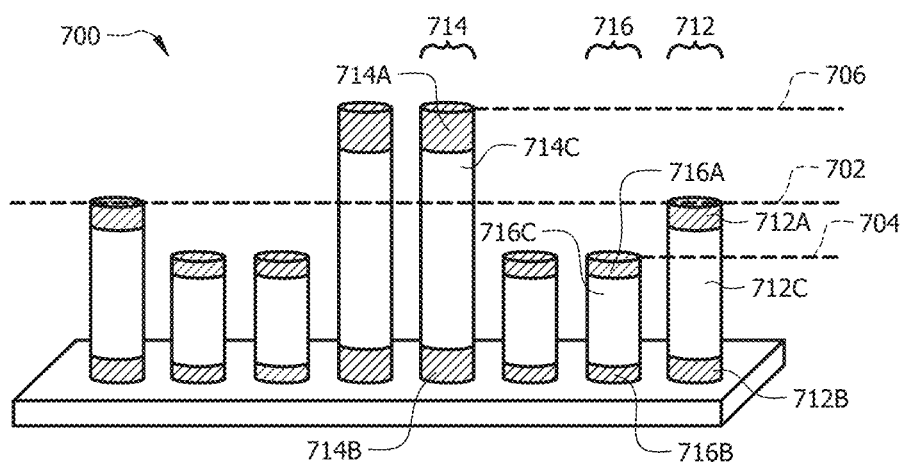
FIG. 7 is an illustration showing an array of dielectric polymeric composition-based actuators receiving a direct current (DC) stimulation to cause static displacement to generate touch feedback according to one aspect of the present disclosure.

FIG. 7 is an illustration showing an array 700 of dielectric polymeric composition-based actuators receiving a DC stimulation to cause static displacement of the actuators according to one aspect of the present disclosure. An array 700 of actuators is shown with some of the actuators affected by an applied DC stimulus. An actuator 712 can comprise dielectric polymeric composition 712C and electrodes 712A and 712B. No stimulus is applied to actuator 712, thus actuator 712 has a height level 702, which is a rest height for actuators of the array 700. A positive DC signal can be applied to actuator 714 across electrodes 714A and 714B to cause a core material 714C comprising the dielectric polymeric composition to elongate or expand along its long axis. The actuator 714 thus reaches height level 706 above rest level 702. A negative DC signal may be applied to actuator 716 across electrodes 716A and 716B to cause a core material 716C comprising the dielectric polymeric composition to contract or shrink along its long axis. The actuator 716 thus reaches height level 704 below rest level 702. Although a positive signal is described as stretching an actuator and a negative signal is described as shrinking an actuator, the positive and negative signals are relative and can be switched. Thus, alternatively, a negative DC signal can shrink an actuator and a positive signal can stretch an actuator. By individually controlling actuators 712, 714, and 716, and other similar actuators of the array 700, a texture can be generated at a surface of an electronic device, such as a smart phone or mobile computing device.

Figure 8:
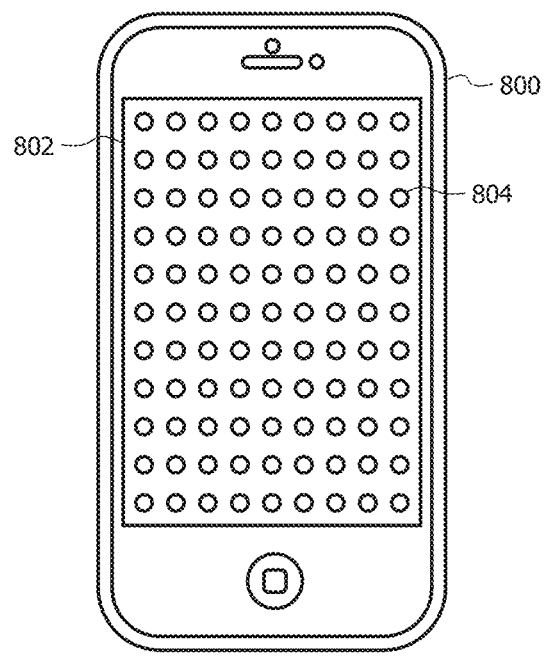
FIG. 8 is an illustration showing an array of dielectric polymeric composition-based actuators integrated into a display of an electronic device according to one aspect of the present disclosure.

A smart phone with a display screen integrating an array of actuators, such as the array shown in the configurations of FIGS. 6 and 7, is shown in FIG. 8. FIG. 8 is an illustration showing an array of dielectric polymeric composition-based actuators (e.g., cylindrical actuators) integrated into a display of an electronic device according to one aspect of the present disclosure. A smart phone 800 can include a display device 802. An array 804 of dielectric polymeric composition-based actuators can be integrated with the display device 802 to provide a user with addressable and localized touch feedback. In an aspect, the array 804 can be constructed of transparent materials and integrated over the display device 802. Although a smart phone is illustrated in FIG. 8, the array 804 can also be integrated into any display device of any suitable electronic device in the same manner. For example, the array 804 of dielectric polymeric composition-based actuators can be integrated into a smart watch, a tablet computer, a laptop computer, a cellular phone, a remote control, a television screen, etc. Further, the array 804 of dielectric polymeric composition-based actuators can be integrated into other components separate from a display device for reading by the visually-impaired.

Figure 9:
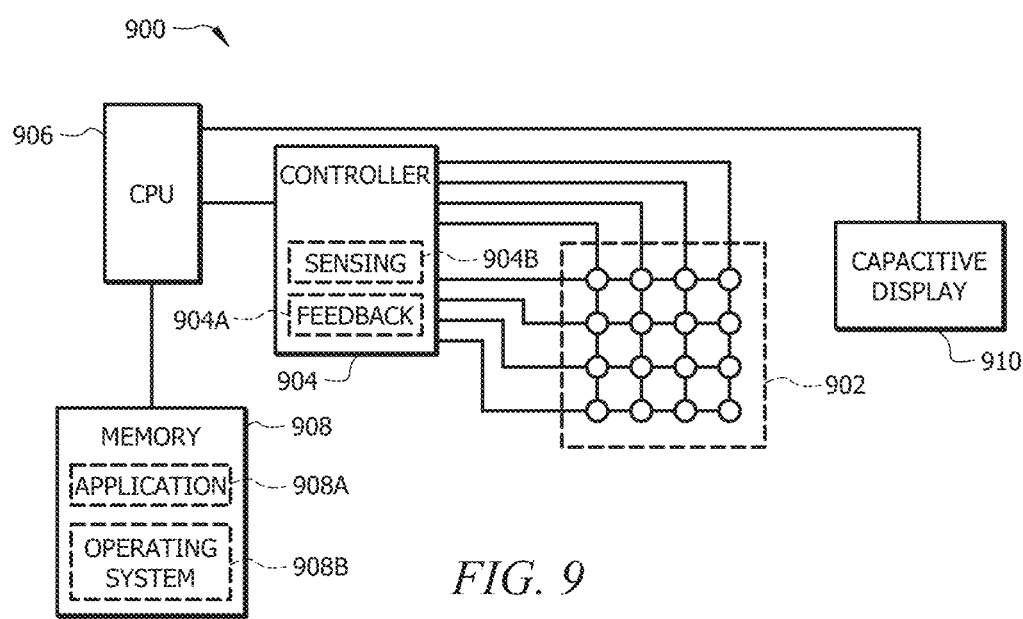
FIG. 9 is a block diagram showing operation of an array of dielectric polymeric composition-based actuators from a controller according to one aspect of the present disclosure.

Control of an array of dielectric polymeric-based actuators to create textures through electrostatic deflection can be performed from a controller coupled to the array as shown in FIG. 9. FIG. 9 is a block diagram showing operation of an array 902 of dielectric polymeric composition-based actuators from a controller 904 according to one aspect of the present disclosure. A control system 900 can include an array 902 of dielectric polymeric composition-based actuators, such as the arrays described above with reference to FIGS. 6 and 7. The array 902 can be coupled to a controller 904, wherein controller 904 can be configured to apply a stimulus to the actuators of array 902. The controller 904 can be configured to individually address actuators of the array 902, such that the controller 904 can manipulate a height of individual actuators within the array 902. The controller 904 can also be configured to address actuators of the array 902 by groups of, for example, 4 or 16 actuators (or any other suitable number of actuators) at a time. In an aspect, the array 902 can be configured similar to a dynamic random access memory (DRAM) module with word and bit lines arranged to allow for addressing one or more actuators of the array 902. The mechanical actuators can be coupled to a drive circuit, wherein the drive circuit can be configured to apply a voltage proportional to a desired stress to be applied to the dielectric polymeric composition. The controller 904 can be further coupled to the drive circuit, wherein the controller is configured to control the drive circuit to provide touch feedback to a user; for example in response to receiving user input.

The controller 904 can generate control signals for providing touch feedback through the array 902 and/or receiving sensing signals for determining user input through the array 902. The controller 904 can coordinate operation of the array 902 via a processor 906 and memory 908. In a configuration of FIG. 9, the processor 906 can execute an application 908A or an operating system 908B residing within the memory 908. Application code within the application 908A can include code for providing touch feedback to a user, and such code can apply a texture to a displayed image. The operating system 908B receiving a command from the processor 906 can cause the execution of the application 908A including code to provide the touch feedback. In another configuration of FIG. 9, the operating system 908B can include code to provide touch feedback as part of an application programming interface (API) accessed by the application 908A. Thus, for example, when the application 908A generates a user dialog box with buttons, the operating system 908B can include code to automatically apply touch feedback to that user dialog box.

Figure 10:
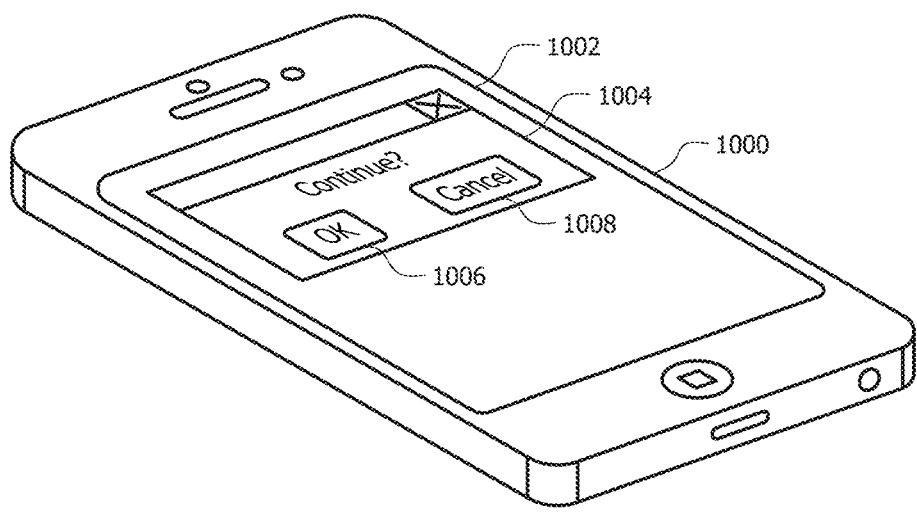
FIG. 10 is an illustration showing a texture presented on a display of an electronic device using an array of dielectric polymeric composition-based actuators receiving a DC stimulation according to one aspect of the present disclosure.

An example of textures produced through static deflection of the array 902 is illustrated in FIG. 10. FIG. 10 is an illustration showing a texture presented on a display 1002 of an electronic device using an array of dielectric polymeric composition-based actuators receiving a DC stimulation according to one aspect of the present disclosure. A mobile phone 1000 can comprise a display device 1002. During operation of the mobile phone 1000, an application being executed on the mobile phone 1000 can display a dialog box with decision making buttons, such as "OK" or "Cancel" selection indicated by buttons 1006 and 1008, respectively; although any other suitable decision making buttons can be implemented (e.g., "yes," "no," etc.). The dielectric polymeric composition-based actuators located at the position of the buttons 1006 and 1008 can be stimulated to generate a texture of a raised surface at the location of the buttons 1006 and 1008. The texture can provide sensation to a user operating the smart phone 1000 and allow them to quickly find the buttons 1006 and 1008. Further, the actuators can be programmed to provide a user with touch feedback in response to pressing the buttons 1006 and 1008, such as by depressing the texture of the button 1006 or 1008, depending on which button was pressed.

In some aspects, an array of mechanical sensors can be located on a side of the display device that is facing towards the outside of the electronic device (e.g., mobile phone), wherein the electronic device further comprises a controller coupled to the array of mechanical sensors, wherein the controller is configured to receive user input through the array of mechanical sensors, and wherein the controller is configured to correlate the received user input to a position on the display device.

Referring to FIG. 9, the processor 906 can provide touch feedback by accessing a feedback module 904A within the controller 904. The feedback module 904A can receive instructions from the processor 906, in which the instructions can include a type of touch feedback, a strength of the touch feedback, and/or a location for the touch feedback. The controller 904 can decode the instruction and provide appropriate stimuli to the array 902 of dielectric polymeric composition-based actuators by applying a DC voltage to the identified actuator in the array 900. The DC voltage can be generated by the controller 904 or the controller 904 can connect the actuator to an external voltage source (not shown).

The processor 906 can also interact with the controller 904 to receive input from a user through a sensing module 904B within the controller 904. The sensing module 904B can monitor actuators in the array 902 for changes in characteristics of the actuators that can result from a user applying pressure to the array 902 and causing the actuators to deflect, compress, or otherwise change shape. The change in shape of the actuator can cause, for example, a resistance of the actuator to change. That change in resistance can be detected by the sensing module 904B to determine when and where pressure was applied in the array 902. The sensing module 904B can then communicate to the processor 906 a signal indicating a location of the user's input and an amount of pressure applied by the user. The processor 906 can then provide the user input to the application 908A and/or the operating system 908B executing on the processor 906, which can take action in response to the user input. For example, the sensing module 904B can collect data from the array 902 over a period of time (e.g., predetermined period of time) and determine if a swiping motion is received and then take corresponding action, such as to turn pages on a display of a mobile computing device to page through an e-book.

In an aspect, user input can be received through a capacitive layer 910 in the display device in addition to or alternative to input from the dielectric polymeric composition-based actuators. The capacitive layer 910 can be coupled to the processor 906, or through a display controller (not shown), to provide the user input to the application 908A and/or the operating system 908B. The processor 906 can generate instructions for providing touch feedback in response to user input received from the capacitive layer 910. In some aspects, no capacitive layer 910 can be present and all user input can be received through the array 902.

Figure 11:
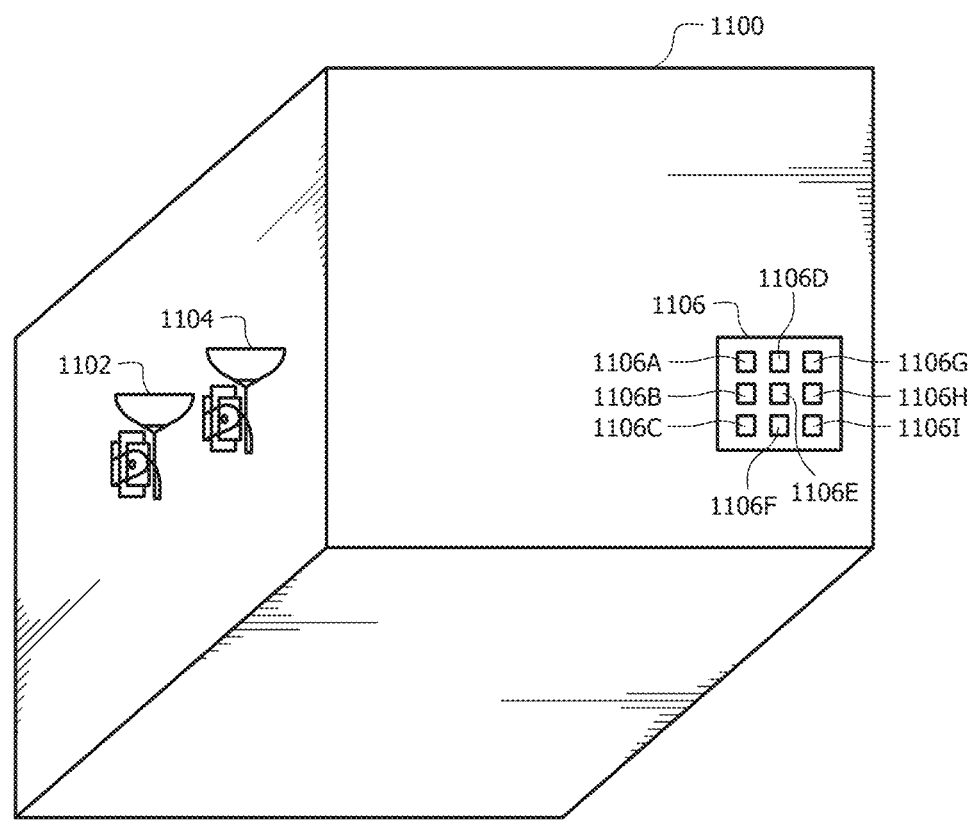
FIG. 11 is an illustration of a room with a dielectric polymeric composition-based light switch with an array of dielectric polymeric composition-based touch sensors according to one aspect of the present disclosure.

An array of dielectric polymeric composition-based sensors can be used in a user input device to control electronic devices or provide other user input. An example of such user input device can be a wall switch for operating lighting fixtures as shown in FIG. 11. FIG. 11 is an illustration of a room 1100 with a switch 1106 with an array of dielectric polymeric composition-based sensors according to one aspect of the present disclosure. A room 1100 can include lighting fixtures 1102 and 1104 and a wall switch 1106. The switch 1106 can include dielectric polymeric composition-based sensors 1106A, 1106B, 1106C, 1106D, 1106E, 1106F, 1106G, 1106H, and 1106I. A controller can be coupled to the sensors 1106A-I to receive user input. For example, when a user swipes their hand in an upward motion across the sensors 1106A-I, the controller can detect a changing voltage first on sensors 1106C, 1106F, and 1106I, second on sensors 1106B, 1106E, and 1106H, and then on sensors 1106A, 1106D, and 1106G. The controller can interpret this as a swipe upwards across the switch 1106 and control a voltage source or dimmer for the lighting fixtures 1102 and 1104 to increase brightness. The controller can similarly detect a swipe downwards across the switch 1106 to decrease brightness. Although a wall switch is described with reference to a dielectric polymeric composition-based sensor, any user input device can incorporate one or more dielectric polymeric composition-based elements. Other non-limiting examples can include input devices on a mobile computing device, input devices integrated into a screen of a mobile computing device, input devices for computers such as mice and keyboards, input devices on remote controls, input devices on media playback devices such as speakers and/or headphones, input devices on office telephones, input devices in automobiles, and the like.

The dielectric polymeric composition as disclosed herein can be incorporated into devices or components that are frequently under stress (e.g., mechanical stress), such that dielectric polymeric composition can be used to harvest energy that would otherwise expended and lost. For example, the dielectric polymeric composition can be incorporated into shoes, such that a user's steps can apply stress to the dielectric polymeric composition. Energy can be harvested from the applied stress and stored in an energy storage device such as a battery. As another example, dielectric polymeric compositions can be incorporated into a floor on which users frequently step. Although user steps are described as the process used for harvesting energy in these examples, energy can be harvested from other actions. For example, ambient noise or vibration can be used for energy harvesting through an appropriately-configured device comprising the dielectric polymeric composition as disclosed herein.

In an aspect, microscope tips for high-resolution imaging, such as atomic force microscopy (AFM) and scanning tunneling microscopy (STM), can employ tips comprising the dielectric polymeric composition as disclosed herein. The dielectric polymeric composition can be used in the microscope tip to apply a downward force on the tip to maintain proximity to a sample being imaged by the microscope.

In an aspect, an AC transformer can use the dielectric polymeric composition as disclosed herein to convert one form of electrical energy to another form of electrical energy. For example, an input AC voltage can be applied to a dielectric polymeric composition causing alternating stress in the dielectric polymeric composition leading to vibration of the dielectric polymeric composition. The shape and characteristics of the dielectric polymeric composition can be selected to obtain a vibration frequency at a desired frequency. An output AC voltage from a different section of the dielectric polymeric composition can be a voltage of higher or lower frequency than the input AC voltage. Such a transformer could be used in power distribution networks or in power circuitry for consumer electronics.

In an aspect, the dielectric polymeric composition as disclosed herein can comprise (a) a polymeric matrix, wherein the polymeric matrix comprises structural units derived from at least one polymerizable vinyl monomer; (b) an ionic additive, wherein the ionic additive comprises a cation and a balancing anion, wherein the concentration of the ionic additive in the dielectric polymeric composition ranges from about 0.5 wt. % to about 30 wt. %; and (c) less than about 10 ppm of unreacted polymerizable vinyl monomer, based on the total weight of the dielectric polymeric composition, wherein an amount of unreacted polymerizable vinyl monomer in the dielectric polymeric composition is measured via high performance liquid chromatography (HPLC).

In some aspects, the ionic additive comprises an ionic liquid as disclosed herein wherein the ionic liquid is miscible or partially miscible with the at least one polymerizable vinyl monomer.

In other aspects, the ionic additive comprises a metal salt of an unsaturated carboxylic acid. Non-limiting examples of a metal salt of an unsaturated carboxylic acid suitable for use in the present disclosure include zinc diacrylate, zinc dimethacrylate, zinc dicinnamate, and the like, or combinations thereof. For purposes of the disclosure herein, all descriptions related to the dielectric polymeric composition comprising an ionic liquid can be applied to the dielectric polymeric composition comprising the metal salt of an unsaturated carboxylic acid, unless otherwise specified herein.

In an aspect, the metal salt of an unsaturated carboxylic acid comprises zinc diacrylate (ZDA), wherein ZDA can have the following structure:

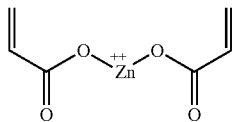

In an aspect, the metal salt of an unsaturated carboxylic acid comprises zinc dicinnamate, wherein zinc dicinnamate can have the following structure:

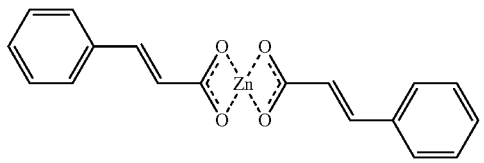

In an aspect, the metal salt of an unsaturated carboxylic acid can display one or more of the following properties: (i) the metal salt of an unsaturated carboxylic acid can comprise a metallic center (e.g., zinc); (ii) the metal salt of an unsaturated carboxylic acid can be capable of forming covalent and/or ionic crosslinks; (iii) the metal salt of an unsaturated carboxylic acid can display a reversible crosslinking character; (iv) the metal salt of an unsaturated carboxylic acid can have a crystalline structure; (v) the metal salt of an unsaturated carboxylic acid can increase tensile strength and/or storage modulus in the polymeric matrix; (vi) the metal salt of an unsaturated carboxylic acid can display a reinforcement effect in a rubber matrix, such as the polymeric matrix disclosed herein; and (vii) any combination of (i)-(vi). In an aspect, the metal salt of an unsaturated carboxylic acid can display a reinforcement effect of the polymeric matrix, thereby increasing the storage modulus of the dielectric polymeric composition.

In some aspects, the dielectric polymeric composition as disclosed herein can comprise a metal salt of an unsaturated carboxylic acid, wherein the dielectric polymeric composition can be characterized by a storage modulus that is increased by equal to or greater than about 5%, alternatively equal to or greater than about 10%, alternatively equal to or greater than about 20%, alternatively equal to or greater than about 25%, alternatively equal to or greater than about 30%, alternatively equal to or greater than about 40%, or alternatively equal to or greater than about 50% when compared to the storage modulus of the polymeric matrix in the absence of the metal salt of an unsaturated carboxylic acid.

In an aspect, the dielectric polymeric composition as disclosed herein can comprise a polymeric matrix and a metal salt of an unsaturated carboxylic acid. As will be appreciated by one of skill in the art, and with the help of this disclosure, at least a portion of the unsaturated carboxylic acid of the metal salt of an unsaturated carboxylic acid can be polymerized during the formation of the polymeric matrix, and thus can provide for structural units of the polymeric matrix that are derived from the unsaturated carboxylic acid. In such aspect, the dielectric polymeric composition can comprise ionic crosslinks (e.g., reversible crosslinks) between the metal cation of the metal salt of an unsaturated carboxylic acid and structural units derived from the unsaturated carboxylic acid.

In an aspect, the dielectric polymeric composition as disclosed herein can comprise the polymeric matrix and the ionic additive comprising the metal salt of an unsaturated carboxylic acid; wherein the polymeric matrix comprises polymerized vinyl monomer, and optionally the crosslinking agent and/or polymerized co-monomer; and wherein the metal salt of an unsaturated carboxylic acid is compatible or partially compatible with the polymeric matrix.

For purposes of the disclosure herein, the term "compatible" when used to define a relationship between the metal salt of an unsaturated carboxylic acid and the polymeric matrix refers to the dielectric polymeric composition and/or precursor dielectric polymeric composition being a stable homogeneous mixture which exhibits macroscopic properties expected of a single phase material. Homogeneity, when used to define the dielectric polymeric composition and/or precursor dielectric polymeric composition, does not refer to the electronic microscopic structure (e.g., structure observable with an electron microscope) of polymeric matrix and metal salt of an unsaturated carboxylic acid present in the polymeric composition. For purposes of the disclosure herein, the terms "homogeneous," "homogeneity," and the like, when used to define the dielectric polymeric composition and/or precursor dielectric polymeric composition, refer to the macroscopic behavior or properties of the polymeric composition, such as thermal transition temperature and light transparency, as previously disclosed herein.

In an aspect, and as previously disclosed herein, the piezoelectric (e.g., ferroelectric) properties of the dielectric polymeric composition as disclosed herein can be improved (e.g., enhanced) by one or more of the following: (1) the choice of an appropriate polymer-ionic additive combination; (2) the use of optimal concentration of the ionic additive (e.g., from about 0.5 wt. % to about 30 wt. %, or alternatively from about 0.5 wt. % to about 5 wt. %); (3) selecting the ionic additive which is compatible with the polymer; (4) in-situ dispersion of ionic additive in the polymer matrix; (5) limiting the amount of unreacted monomer in the films below a threshold concentration; (6) use of monomers capable of forming a hydrogen bonded network, thereby providing a further enhancement of compatibility of the ionic additive with the polymeric matrix); and (7) any combination of (1)-(6). For purposes of the disclosure herein, improving ferroelectric properties of the dielectric polymeric composition refers to arresting the polarization loss under a given electric field, improving the remnant polarization, increasing the coercive field while minimizing polarization loss, and the like, or combinations thereof. In such aspect, the ionic additive can comprise either an ionic liquid or a metal salt of an unsaturated carboxylic acid.

In an aspect, the dielectric polymeric composition (e.g., optionally hydrogen bonded and/or crosslinked), and methods of making and using same, as disclosed herein can advantageously display improvements in one or more composition characteristics when compared to an otherwise similar dielectric polymeric composition (i) comprising a polymeric matrix and an ionic liquid and (ii) equal to or greater than about 10 ppm of unreacted polymerizable vinyl monomer, based on the total weight of the dielectric polymeric composition, wherein an amount of unreacted polymerizable vinyl monomer in the dielectric polymeric composition is measured via HPLC.

In an aspect, the hydrogen bonded dielectric polymeric composition, and methods of making and using same, as disclosed herein can advantageously display improvements in one or more composition characteristics when compared to an otherwise similar dielectric polymeric composition (i) comprising a polymeric matrix and an ionic liquid and (ii) without the structural units derived from a polymerizable co-monomer.

In an aspect, the crosslinked dielectric polymeric composition, and methods of making and using same, as disclosed herein can advantageously display improvements in one or more composition characteristics when compared to an otherwise similar dielectric polymeric composition (i) comprising a polymeric matrix and an ionic liquid and (ii) without the crosslinking agent.

In an aspect, the dielectric polymeric composition as disclosed herein can advantageously display improved ferroelectric properties at low electric field, wherein the dielectric polymeric composition displays arresting or decreasing the polarization loss under a given electric field (e.g., low polarization loss); improving (e.g., increasing) the remnant polarization; improving (e.g., increasing) the coercive field while polarization loss is minimum; and the like; or combinations thereof.

In an aspect, the dielectric polymeric composition as disclosed herein can advantageously display thin film forming ability, both free-standing and supported film on a substrate with excellent film quality (e.g., transparent film, flexible film, etc.). The ferroelectric film comprising the dielectric polymeric composition as disclosed herein can advantageously be formed as a layer of desired thickness at a relatively low temperature (e.g., <100° C.).

In an aspect, the method of making the dielectric polymeric composition as disclosed herein can advantageously display ease of synthesis (e.g., fewer steps, solvent-less) from commercially available raw materials; wherein scalability and ease of processability of the dielectric polymeric composition provide further advantages. The dielectric polymeric composition as disclosed herein can be prepared in a "one pot process," without a need for a purification step. In an aspect, the method of making the dielectric polymeric composition as disclosed herein can advantageously be scalable.

In some aspects, the dielectric polymeric composition as disclosed herein can advantageously be solution processable. Additional advantages of the dielectric polymeric composition, and methods of making and using same, as disclosed herein can be apparent to one of skill in the art viewing this disclosure.

EXAMPLES

The subject matter having been generally described, the following examples are given as particular embodiments of the disclosure and to demonstrate the practice and advantages thereof. It is understood that the examples are given by way of illustration and are not intended to limit the specification of the claims to follow in any manner.

Example 1

Dielectric polymeric compositions comprising ionic additives (e.g., ionic liquids, metal acrylates) were prepared (e.g., synthesized at the lab scale) as follows, and their properties were investigated. Ionic additives can comprise ionic liquids, as well as metal acrylates, wherein metal diacrylates can comprise a metallic center and could display a reversible crosslinking character. Metal diacrylates can be very reactive with free radicals. Metal diacrylates can have crystalline structures. Methyl methacrylate (MMA), styrene (Sty), acrylonitrile (AN), 2-hydroxyethyl methacrylate (HEMA), tetra (ethylene glycol) diacrylate (TEGDA), and 1-butyl-3-methylimidazolium hexafluorophosphate ($BMImPF_6$) were purchased from Sigma Aldrich. 1-(2-hydroxyethyl)-3-methylimidazolium tetrafluoroborate ($HEMImBF_4$) was purchased from Io-Li-Tec. Zinc diacrylate (ZDA) was available from Cray Valley. Polyvinylidene fluoride (PVDF) film (piezoelectric) was purchased from Piezotech, France.

The dielectric polymeric compositions were prepared as follow. The desired amount of ionic additive (e.g., ionic liquid) and monomer (e.g., the acrylate monomer(s)) was mixed in a glass reactor to produce a reactant mixture. The reactant mixture was stirred using a magnetic stirrer at 500 rpm for 30 mins under nitrogen. 0.2 wt. % azobisisobutyronitrile (AIBN) was then added to the reactant mixture stirring under nitrogen. The bulk polymerization was continued at 60° C. under nitrogen. The resulting partially polymerized viscous reaction mass was cast into thin films using doctor blade on a glass substrate and kept in the oven at 60° C. under nitrogen for further polymerization. The films were thoroughly dried for the removal/reaction of unreacted monomers. The detailed formulations of the compositions synthesized by the present method are summarized in Table 1. Ionic additive concentration in all the formulations was 5 weight percent (wt. %).

TABLE 1

Dielectric polymeric compositions

| Mixture # | Monomer(s) | Feed composition (wt. %) | TEGDA | Ionic additive |
|---|---|---|---|---|
| 1 | MMA | 100 | — | — |
| 2 | MMA | 100 | — | BMImPF$_6$ |
| 3 | MMA/HEMA | 90/10 | — | — |
| 4 | MMA/HEMA | 90/10 | — | BMImPF$_6$ |
| 5 | MMA | 100 | 5 wt % | BMImPF$_6$ |
| 6 | MMA | 100 | — | HEMImBF$_4$ |
| 8 | MMA | 100 | — | ZDA |
| 9 | MMA/HEMA | 90/10 | — | ZDA |

The compatibility of the polymers with the ionic additive was also investigated, as such compatibility can render the dielectric films formed into stable good quality thin films, where the lack of macroscopic phase separation is preferable. FIG. 1 displays a photograph of a thin, flexible, and transparent film formed from an acrylate monomer and ionic liquid mixture which was polymerized as described above: PMMA-BMImPF$_6$ (mixture #2 in Table 1).

The compatibility of polymers with ionic additive, and the miscibility of vinyl monomers with ionic liquids are summarized in Table 2.

TABLE 2

Compatibility between ionic additives, monomers and polymers

| Compositions | Compatibility |
|---|---|
| MMA/BMImPF6 | Fully miscible |
| PMMA/BMImPF6 | Fully compatible (FIGS. 2A1 and 2A2) |
| HEMA/BMImPF6 | Fully miscible |
| P(MMA-co-HEMA)/BMImPF6 | Fully compatible |
| MMA/HEMImBF4 | Partially miscible |
| PMMA/HEMImBF4 | Partially compatible (FIGS. 2B1 and 2B2) |
| MMA/ZDA | Phase separation/sedimentation |
| PMMA/ZDA | Incompatible |
| HEMA/ZDA | Single observable phase |
| P(MMA-co-HEMA)/ZDA | Partially compatible |

The assessment of miscibility and compatibility was made by visual observation. Monomer and/or co-monomer and ionic liquid mixtures that appeared transparent (e.g., clear) were considered fully miscible; the monomer and/or co-monomer and ionic liquid mixtures that appeared translucent were considered partially miscible; and the monomer and/or co-monomer and ionic liquid mixtures that appeared opaque or displayed phase separation were considered immiscible. Similarly, the dielectric polymeric compositions that appeared transparent (e.g., clear) were considered fully compatible; dielectric polymeric compositions that appeared translucent were considered partially compatible; and the dielectric polymeric compositions that appeared opaque or displayed phase separation were considered incompatible. For all compositions investigated in Table 2, the ionic liquid content was 5 wt. %. FIGS. 2A1 and 2A2 display a photograph and scanning electron micrograph, respectively, for a PMMA/BMImPF$_6$ dielectric polymeric composition. FIGS. 2B1 and 2B2 display a photograph and scanning electron micrograph, respectively, for PMMA/HEMImBF$_4$ dielectric polymeric composition, which was found to be incompatible, and was thus not characterized further. PMMA/ZDA dielectric polymeric composition was also found to be incompatible, and thus was not characterized further.

Example 2

Dielectric polymeric compositions comprising ionic additives (e.g., ionic liquids, metal acrylates) were prepared as described in Example 1, and their properties were further investigated. Specifically, the molecular weight, polydispersity index (PDI), thermal profile, and proton nuclear magnetic resonance ($^1$H NMR) spectra of the dielectric polymeric compositions were investigated. The molecular weight and PDI were evaluated by gel permeation chromatography (GPC) using monodispersed PMMA as a calibration standard and tetrahydrofuran (THF) as a mobile phase. The number average molecular weight ($M_n$) and the PDI of the dielectric polymeric compositions are displayed in Table 3.

TABLE 3

Glass transition temperature, molecular weight and polydispersity of dielectric polymeric compositions

| Sample # | Sample detail | $T_g$ (° C.) | $M_n$ | PDI |
|---|---|---|---|---|
| 1 | PMMA | 129 | 170,360 | 2.6 |
| 2 | PMMA-BMImPF$_6$ (5 wt. %) | 73 | 255,006 | 2.1 |
| 3 | P(MMA-co-HEMA) | 102 | 227,397 | 2.4 |
| 4 | P(MMA-co-HEMA)-BMImPF$_6$ (5 wt. %) | 66 | 288,183 | 2.2 |
| 5 | X-linked-PMMA-BMImPF$_6$ (5 wt. %) | 84 | 219,697 | 2.1 |
| 6 | PMMA-HEMImBF$_4$ (5 wt. %) | 111 | 255,987 | 2.1 |
| 7 | PMMA-BMImPF$_6$ (5 wt. %)-ex-situ | 96 | 58,443 | 1.9 |
| 8 | PMMA/ZDA | 126 | 189,050 | 2.2 |
| 9 | P(MMA-co-HEMA)/ZDA | 122 | 352,240 | 3.3 |

Molecular weight of the ionic compositions was in the range of 150,000-300,000 Da with a PDI of less than about 3.5. The compositions in Table 3 can form thin coherent films with good mechanical properties (e.g., flexibility, transparency), except for sample #8.

Differential scanning calorimetry (DSC) measurements were performed on the samples in Table 3, under nitrogen, using a DSC Q1000 (TA instruments) at a heating rate of 10° C./min. $T_g$ values from the DSC curves are displayed in Table 3. Plasticization effect was observed with samples #2 and #4, as compared to samples #1 and #3, respectively. Such plasticization effect is a further indication of the compatibility of polymer matrix with ionic liquid in the dielectric polymeric compositions.

HPLC technique was used to determine the residual unreacted acrylate monomers in the dielectric polymeric compositions. Residual acrylates were extracted by dissolving the dielectric polymeric composition in dichloromethane followed by precipitation in methanol. The extracted solution was subjected to HPLC study for quantification. After removal/reaction of unreacted monomers, the residual monomer content reached <10 ppm (below the detection limit).

Example 3

The dielectric properties of the samples in Table 3 of Example 2 were investigated. Polarization-electric field (P-E) hysteresis loops were measured using a Radiant Precision Materials Analyzer. During measurement, films were immersed in silicon oil to reduce arcing. A circular electrode was applied on both surfaces of the film by sputtering with gold/palladium.

Figure 4A:
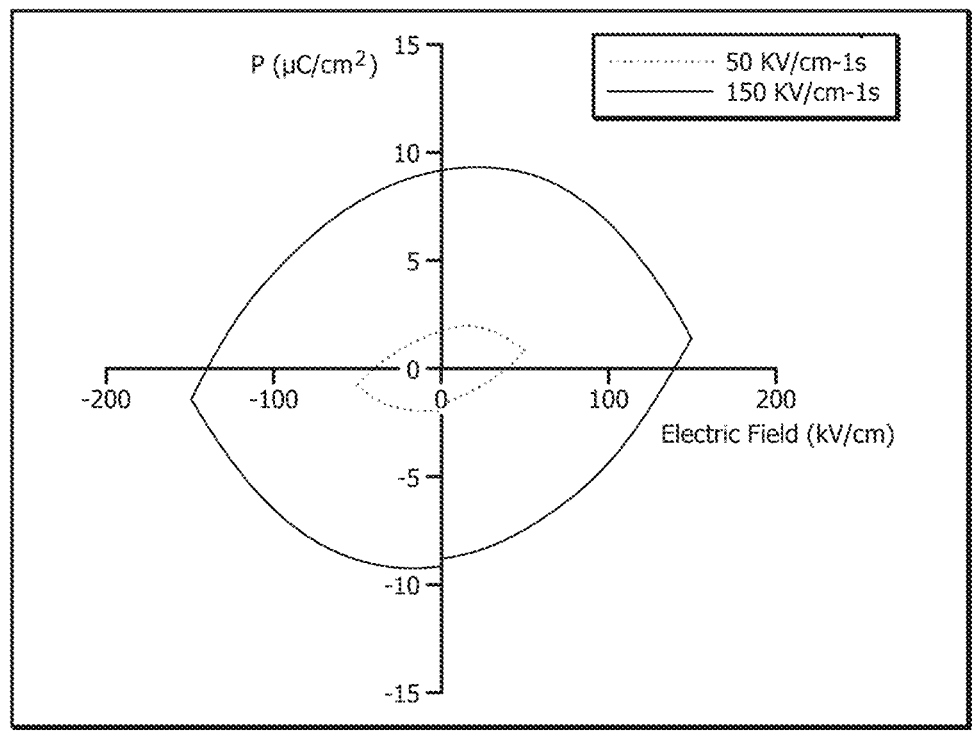
FIGS. 4A and 4B display polarization hysteresis loops of a dielectric polymeric composition comprising PMMA and BMImPF$_6$, before unreacted monomer removal and after unreacted monomer removal, respectively, at 50 kV/cm and 150 kV/cm, 1 s.
Figure 4B:
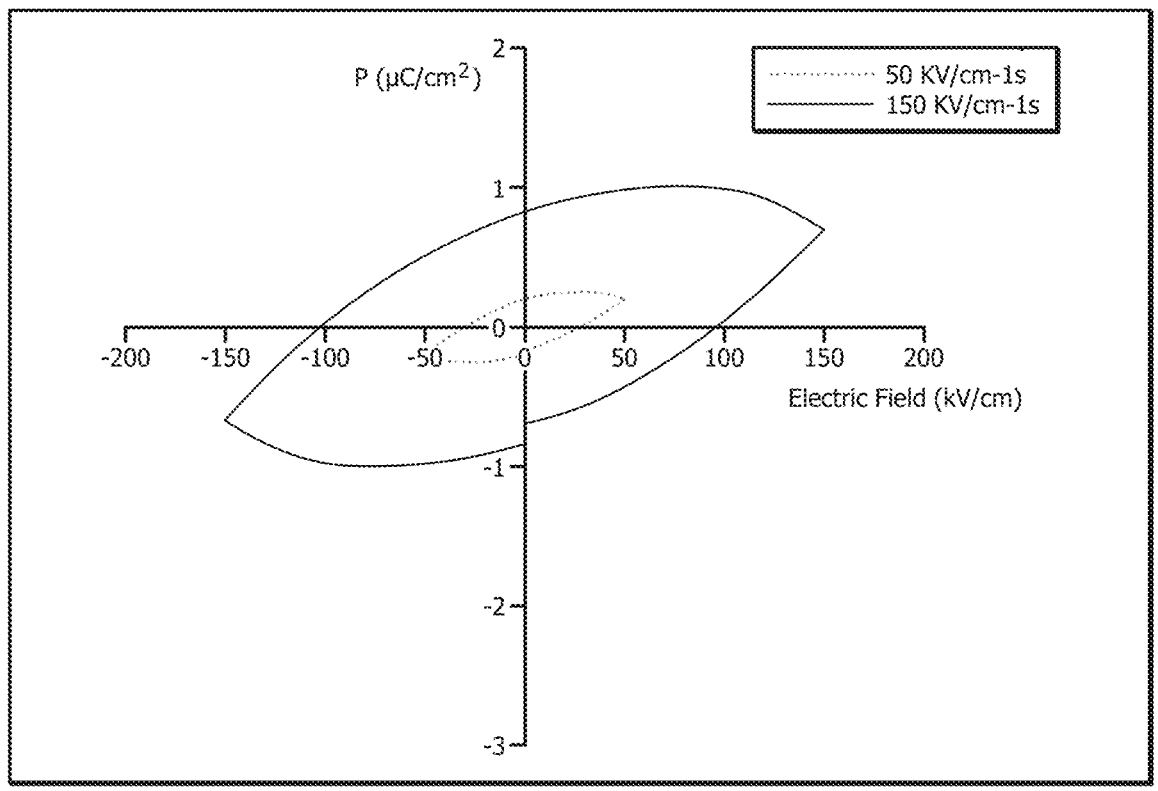

The influence of unreacted monomers on the polarization-electric field (P-E) hysteresis loops is illustrated in FIGS. 4A and 4B for sample #2. At ambient temperature and an electric field of 50 kV/cm and 150 kV/cm, sample #2 containing acrylate monomer (i.e., prior to unreacted monomer removal) had a coercive field of 40 kV/cm and 140 kV/cm, respectively, and a maximum polarization of 2 $\mu C/cm^2$ and 9.3 $\mu C/cm^2$, respectively, with 60% and 85% polarization loss respectively; while a coercive field of 28.8 kV/cm and 97.2 kV/cm, respectively, and a maximum polarization of 0.25 $\mu C/cm^2$ and 1 $\mu C/cm^2$, respectively, with 20% and 31% polarization loss, respectively, were displayed after removal/reaction of unreacted monomer. As demonstrated in FIGS. 4A and 4B, at a given electric field, sample #2 showed a higher maximum polarization in presence of unreacted acrylate monomer compared to that of the sample after removal/reaction of the monomer. However, polarization loss reduced significantly upon removal/reaction of residual monomer. Without wishing to be limited by theory, the plasticization effect caused by the residual monomer led to higher ion mobility resulting in higher maximum polarization, but at the same time led to a higher (and undesirable) polarization loss.

Figure 4C:
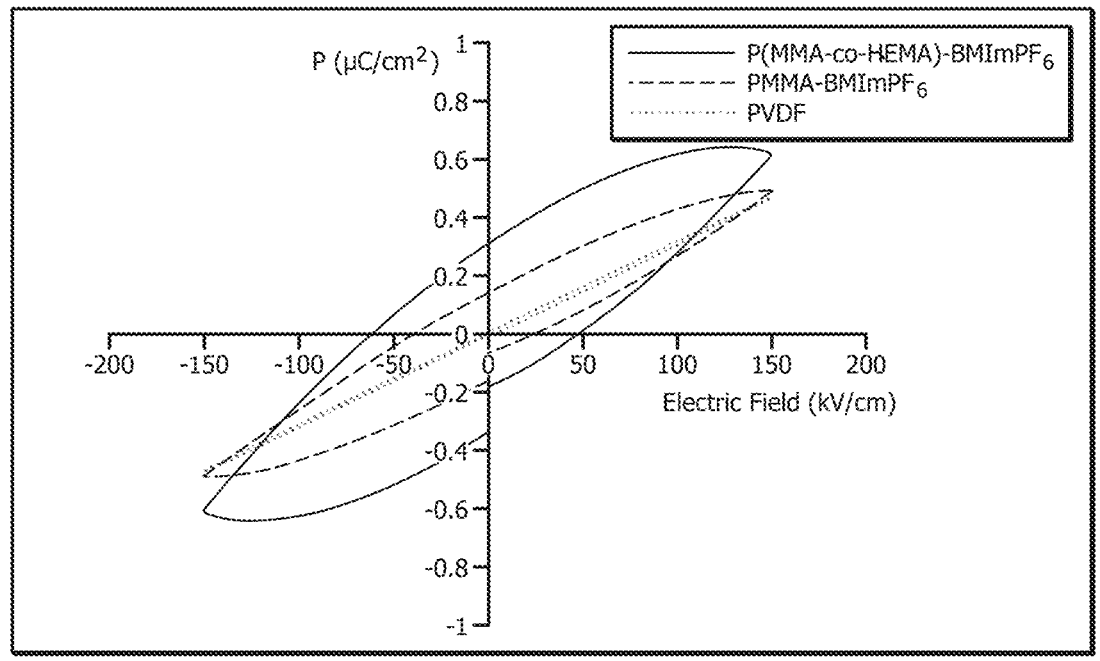
FIG. 4C displays a comparison of polarization hysteresis loops at 150 kV/cm, 10 ms of a dielectric polymeric composition comprising PMMA and BMImPF$_6$; a dielectric polymeric composition comprising a copolymer of methyl methacrylate (MMA) and 2-hydroxyethyl methacrylate (HEMA) (P(MMA-co-HEMA)) and BMImPF$_6$; and polyvinylidene fluoride (PVDF)

FIG. 4C shows the effect of introducing HEMA as comonomer in PMMA which acts as a matrix in dielectric polymeric composition, on P-E hysteresis loop. The hysteresis loops in FIG. 4C were recorded after removal/reaction of unreacted acrylate monomer. Ferroelectric properties of the dielectric polymeric composition based on P(MMA-co-HEMA)-BMImPF$_6$ (5 wt. %) (sample #4) were compared with the ferroelectric properties of the dielectric polymeric composition based on PMMA-BMImF$_6$ (5 wt. %) (sample #2); and the results are summarized in Table 4. The applied field in all cases was 150 kV/cm, 10 ms.

TABLE 4

Ferroelectric properties of the polymeric compositions

| Sample # | Remnant Polarization ($\mu C/cm^2$) | Maximum polarization ($\mu C/cm^2$) | Polarization loss (%) | Coercive field (KV/cm) |
|---|---|---|---|---|
| Sample 2 | 0.14 | 0.49 | 0 | 25.2 |
| Sample 4 | 0.31 | 0.64 | 3 | 48 |
| Sample 5 | 0.3 | 0.69 | 3 | 41.6 |
| PVDF * | 0.003 | 0.47 | 0 | 1.6 |

As compared to sample 2, sample 4 displays enhancement of coercive field, remnant polarization and maximum polarization with negligible polarization loss. Noticeably, at a low electric field (150 kV/cm), both samples (#2 and #4) showed improved ferroelectric properties as compared to the ferroelectric properties exhibited by the commercial piezoelectric PVDF.

Figure 4D:
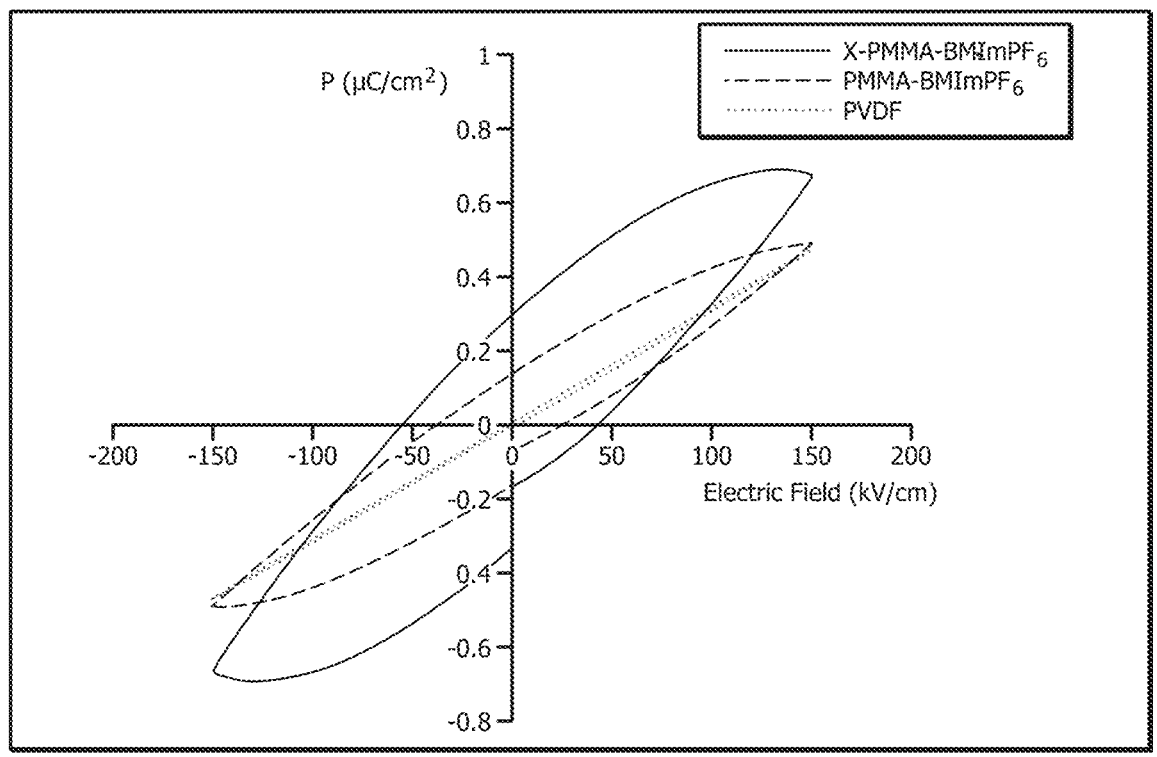
FIG. 4D displays a comparison of polarization hysteresis loops at 150 kV/cm, 10 ms of a dielectric polymeric composition comprising PMMA and BMImPF$_6$; a dielectric polymeric composition comprising crosslinked PMMA and BMImPF$_6$; and polyvinylidene fluoride (PVDF)

Sample #5 in Table 3 was prepared by using a crosslinking agent, TEGDA. The crosslinking agent (TEGDA) was added to the partially polymerized viscous reaction mass before casting into a thin film. M$_n$ and PDI of sample #5 are provided in Table 3. After the removal/reaction of unreacted acrylates, the P-E hysteresis loops were recorded for sample #5 and compared with the dielectric polymeric composition comprising uncrosslinked PMMA (sample #2); and the representative P-E hysteresis loops are shown in FIG. 4D. As compared to sample #2, sample #5 displayed an improved coercive field, remnant polarization and maximum polarization with negligible polarization loss, as further indicated in Table 4. The ferroelectric properties observed with cross-linked PMMA based ionic compositions (sample #5) are higher (e.g., enhanced, more pronounced) than those of commercial piezoelectric PVDF, at low electric field (as shown in FIG. 4D).

Figure 3:
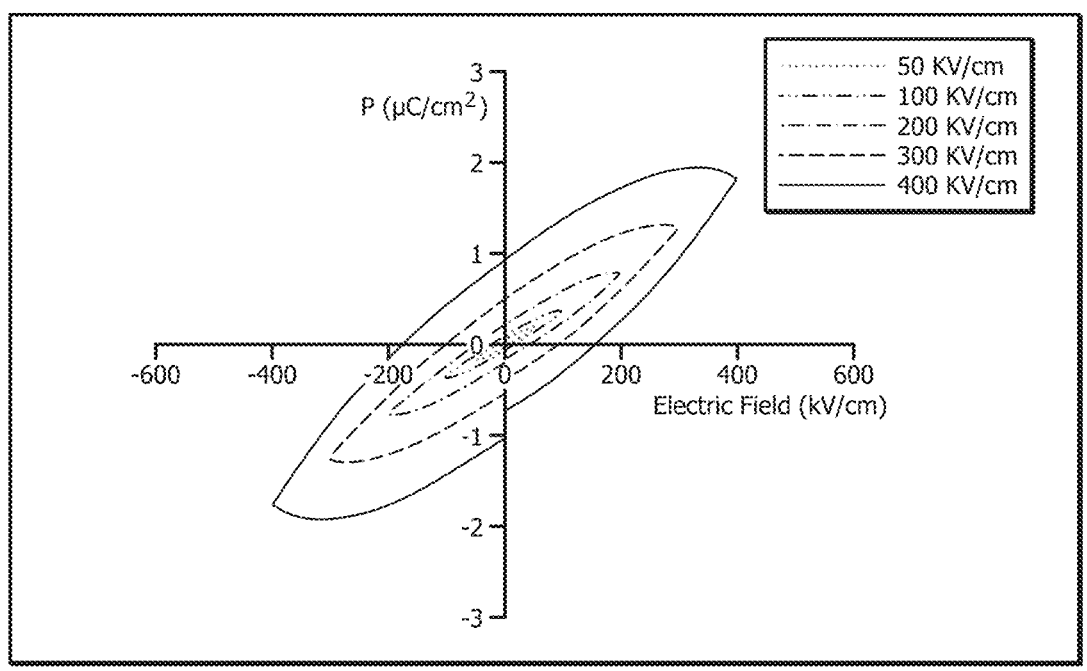
FIG. 3 displays polarization hysteresis loops of an ionic hybrid composition at different electric field values.

Sample #9 in Table 3 was prepared by using an ionic additive possessing a metallic center, zinc diacrylate. Dielectric polymeric compositions containing ZDA were prepared as described in Example 1. FIG. 3 shows polarization (C/cm$^2$) vs. applied electric field (kV/cm) at 1 Hz frequency for the sample. The dielectric composition showed a remnant polarization of ~1 $\mu C/cm^2$ and saturation polarization of ~2 $\mu C/cm^2$ with negligible polarization fatigue. For comparison, a polymer composite composition was also prepared by using 5 wt. % piezoelectric grade of barium titanate, based on the total weight of the polymer composite composition; following the procedure described in Example 1. This polymer composite composition (with barium titanate) has shown a similar trend of polarization (C/cm$^2$) vs. applied electric field (kV/cm) as observed with Sample #9 (as displayed in FIG. 3). This result indicates that the dielectric polymeric compositions as disclosed herein (which do not contain any piezoelectric additive) exhibit ferroelectric characteristics similar to compositions that contain a piezoelectric additive (polymer composite composition).

Figure 5B:
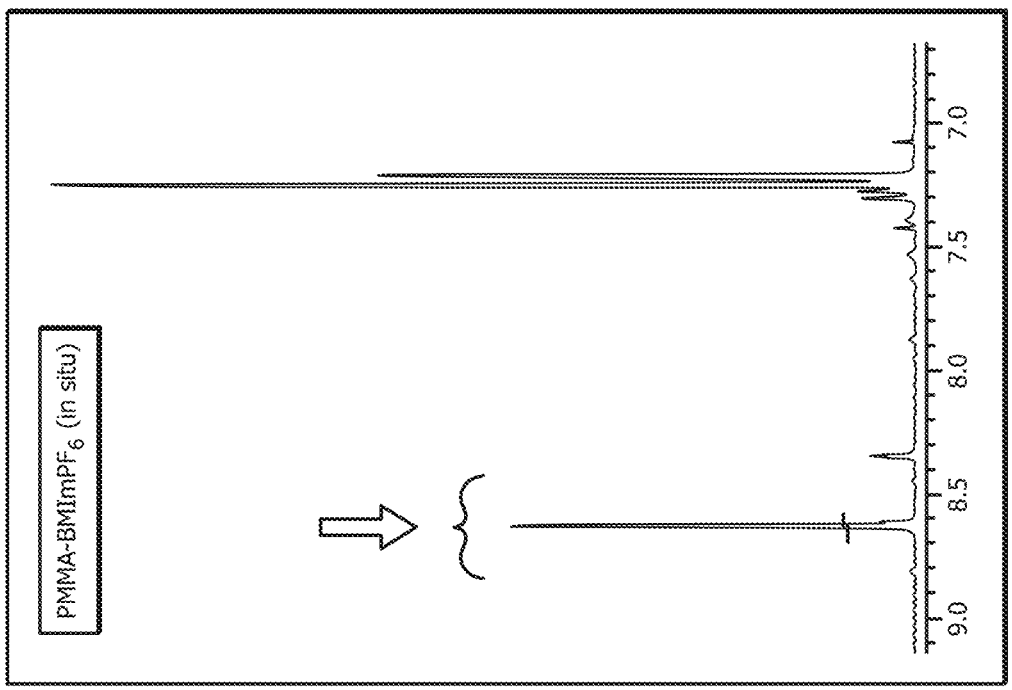
FIGS. 5A and 5B display proton nuclear magnetic resonance ($^1$H NMR) spectra of a dielectric polymeric composition comprising PMMA and BMImPF$_6$, prepared via in situ polymerization and ex situ polymerization, respectively.
Figure 5A:
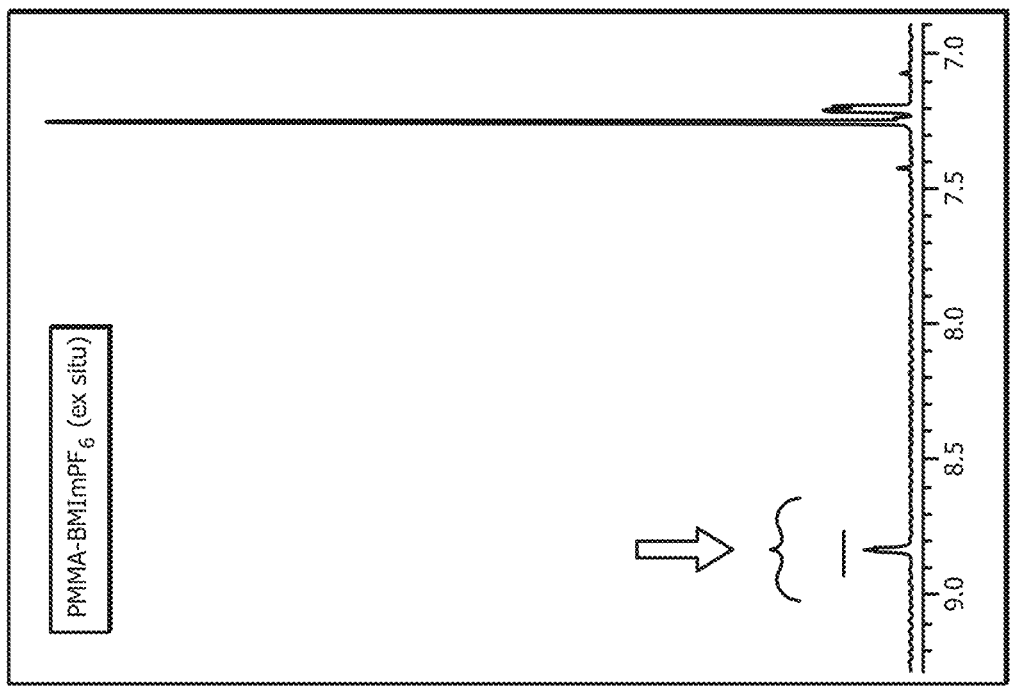

Ex-situ dispersion of ionic liquid in PMMA was also investigated via sample #7 of Table 3. To prepare sample #7, a desired amount of ionic liquid (BMImPF$_6$) was added to the PMMA resin. A 30% (w/v) solution was then prepared by adding MMA (MMA acted as solvent) to the mixture of ionic liquid and PMMA. The resulting solution was stirred until the resin dissolved completely and formed a homogeneous solution. The solution was then cast on a glass substrate using a doctor blade and dried to remove MMA. $^1$H NMR was used to identify the compatibility of ionic liquid with PMMA for in-situ and ex-situ mixed compositions (samples #2 and #7, respectively), and the spectra is displayed in FIG. 5. The well resolved peak in the region of 8-9 ppm corresponds to the proton of the ionic liquid. The peak shifted to a lower value in sample #2 as compared to sample #7, indicating better compatibility of ionic liquid with PMMA in sample #2 resulting from in-situ mixing of the acrylate monomer with the ionic liquid.

Figure 4E:
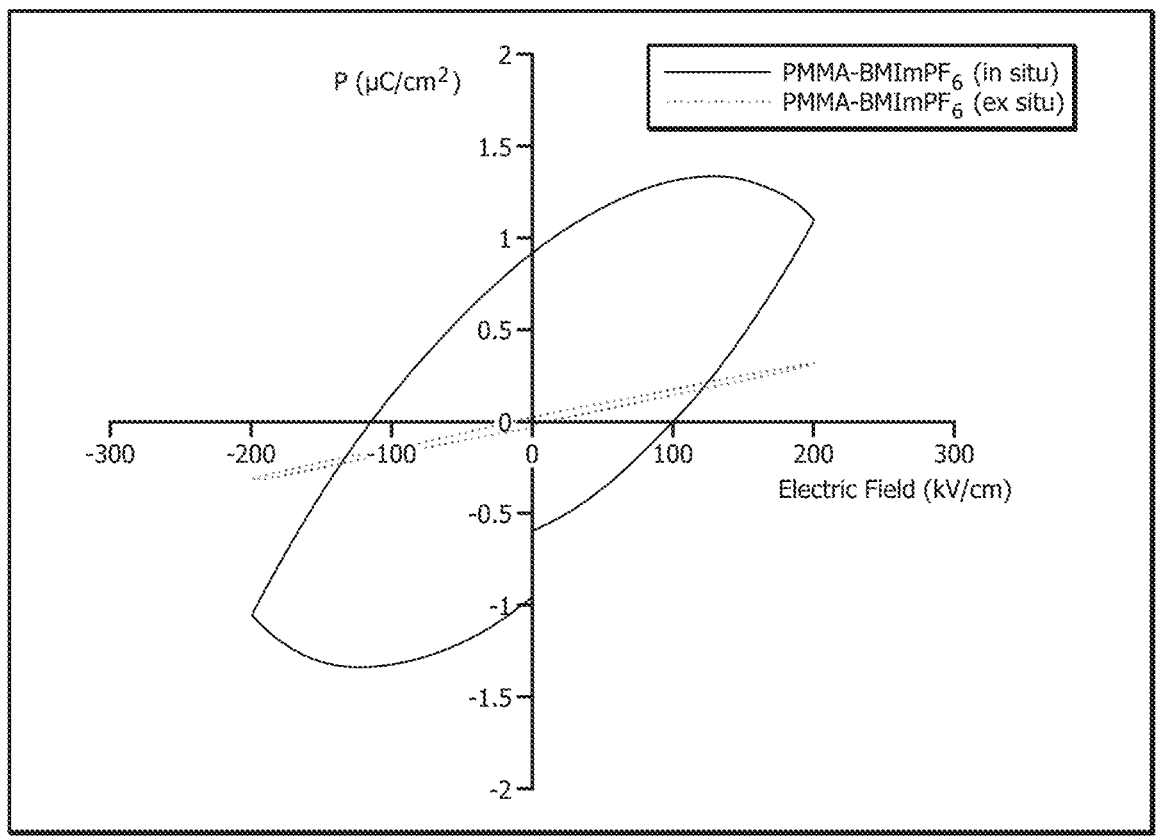
FIG. 4E displays a comparison of polarization hysteresis loops at 200 kV/cm, 100 ms of a dielectric polymeric composition comprising PMMA and BMImPF$_6$; prepared via in situ polymerization and ex situ polymerization.

P-E hysteresis loops of the compositions prepared by in-situ (sample #2) and ex-situ (sample #7) mixing techniques are displayed for comparison in FIG. 4E. An improvement in ferroelectric properties is evident for sample #2, as compared to sample #7. At ambient temperature and an electric field of 200 kV/cm, 100 ms, sample #2 had a coercive field of 100.4 kV/cm, and a maximum polarization of 1.33 $\mu C/cm^2$ with a remnant polarization of 0.92 $\mu C/cm^2$, while sample #7 had a coercive field of 7.7 kV/cm, and a maximum polarization of 0.31 $\mu C/cm^2$ with a remnant polarization of 0.02 $\mu C/cm^2$.

For the purpose of any U.S. national stage filing from this application, all publications and patents mentioned in this disclosure are incorporated herein by reference in their entireties, for the purpose of describing and disclosing the constructs and methodologies described in those publications, which might be used in connection with the methods of this disclosure. Any publications and patents discussed herein are provided solely for their disclosure prior to the filing date of the present application. Nothing herein is to be construed as an admission that the inventors are not entitled to antedate such disclosure by virtue of prior invention.

In any application before the United States Patent and Trademark Office, the Abstract of this application is provided for the purpose of satisfying the requirements of 37 C.F.R. § 1.72 and the purpose stated in 37 C.F.R. § 1.72(b) "to enable the United States Patent and Trademark Office and the public generally to determine quickly from a cursory inspection the nature and gist of the technical disclosure." Therefore, the Abstract of this application is not intended to be used to construe the scope of the claims or to limit the scope of the subject matter that is disclosed herein. Moreover, any headings that can be employed herein are also not intended to be used to construe the scope of the claims or to limit the scope of the subject matter that is disclosed herein. Any use of the past tense to describe an example otherwise indicated as constructive or prophetic is not intended to reflect that the constructive or prophetic example has actually been carried out.

The present disclosure is further illustrated by the following examples, which are not to be construed in any way as imposing limitations upon the scope thereof. On the contrary, it is to be clearly understood that resort can be had to various other aspects, embodiments, modifications, and equivalents thereof which, after reading the description herein, can be suggest to one of ordinary skill in the art without departing from the spirit of the present invention or the scope of the appended claims.

Additional Disclosure

A first aspect, which is a dielectric polymeric composition comprising (a) a polymeric matrix, wherein the polymeric matrix comprises structural units derived from at least one polymerizable vinyl monomer; (b) an ionic liquid, wherein the ionic liquid comprises an organic cation and a balancing anion, wherein the ionic liquid is miscible or partially miscible with the at least one polymerizable vinyl monomer, and wherein the concentration of the ionic liquid in the dielectric polymeric composition ranges from about 0.5 wt. % to about 30 wt. %; and (c) less than about 10 ppm of unreacted polymerizable vinyl monomer, based on the total weight of the dielectric polymeric composition, wherein an amount of unreacted polymerizable vinyl monomer in the dielectric polymeric composition is measured via high performance liquid chromatography (HPLC).

A second aspect, which is the dielectric polymeric composition of the first aspect, wherein the dielectric polymeric composition comprises a continuous polymeric phase comprising the polymeric matrix having dispersed therein an ionic liquid dispersed phase, wherein the ionic liquid dispersed phase comprises the ionic liquid.

A third aspect, which is the dielectric polymeric composition of the second aspect, wherein the ionic liquid is compatible with the polymeric matrix, and wherein a difference between a glass transition temperature ($T_g$) of the polymeric matrix and a $T_g$ of the dielectric polymeric composition is equal to or greater than about 25° C.

A fourth aspect, which is the dielectric polymeric composition of the third aspect, wherein the ionic liquid dispersed phase has an average cross section size of less than about 200 nm.

A fifth aspect, which is the dielectric polymeric composition of the fourth aspect, wherein the dielectric polymeric composition is transparent.

A sixth aspect, which is the dielectric polymeric composition of any one of the first and the second aspects, wherein the ionic liquid is partially compatible with the polymeric matrix, and wherein a difference between a $T_g$ of the polymeric matrix and a $T_g$ of the dielectric polymeric composition is from about 5° C. to about 25° C.

A seventh aspect, which is the dielectric polymeric composition of the sixth aspect, wherein the ionic liquid dispersed phase has an average cross section size of equal to or greater than about 200 nm.

An eighth aspect, which is the dielectric polymeric composition of any one of the first through the seventh aspects, wherein the at least one polymerizable vinyl monomer is polymerized in situ in the presence of the ionic liquid and in the absence of a solvent to form the dielectric polymeric composition.

A ninth aspect, which is the dielectric polymeric composition of any one of the first through the eighth aspects, wherein the dielectric polymeric composition consists essentially of or consists of the ionic liquid and the polymeric matrix, and wherein the dielectric polymeric composition is substantially free of unreacted polymerizable vinyl monomer.

A tenth aspect, which is the dielectric polymeric composition of any one of the first through the ninth aspects, wherein the concentration of the ionic liquid in the dielectric polymeric composition ranges from about 1 wt. % to about 10 wt. %.

An eleventh aspect, which is the dielectric polymeric composition of any one of the first through the tenth aspects, wherein the ionic liquid imparts flexibility to the dielectric polymeric composition, wherein the dielectric polymeric composition is characterized by a storage modulus that is lower than the storage modulus of the polymeric matrix in the absence of the ionic liquid.

A twelfth aspect, which is the dielectric polymeric composition of the eleventh aspect, wherein the dielectric polymeric composition is characterized by a storage modulus that is decreased by equal to or greater than about 25% when compared to the storage modulus of the polymeric matrix in the absence of the ionic liquid.

A thirteenth aspect, which is the dielectric polymeric composition of any one of the first through the twelfth aspects, wherein the organic cation comprises a substituted or unsubstituted imidazolium cation, a substituted or unsubstituted N-alkyl pyridinium cation, a substituted or unsubstituted N,N-dialkyl pyrrolidinium cation, a substituted or unsubstituted piperidinium cation, a substituted or unsubstituted morpholinium cation, a trialkyl sulfonium cation, a tetraalkyl phosphonium cation, an aryl phosphonium cation, or combinations thereof.

A fourteenth aspect, which is the dielectric polymeric composition of the thirteenth aspect, wherein the substituted or unsubstituted imidazolium cation has the following structure:

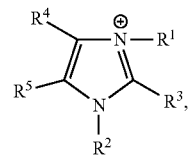

wherein $R^1$, $R^2$, $R^3$, $R^4$, and $R^5$ can each independently be hydrogen, or a linear or branched $C_1$ to $C_{20}$ alkyl group.

A fifteenth aspect, which is the dielectric polymeric composition of the fourteenth aspect, wherein R is methyl, and wherein $R^2$ is a $C_1$ to $C_{10}$ alkyl group.

A sixteenth aspect, which is the dielectric polymeric composition of the fifteenth aspect, wherein $R^2$ is a $C_3$ to $C_5$ alkyl group.

A seventeenth aspect, which is the dielectric polymeric composition of the sixteenth aspect, wherein R² is a butyl group.

An eighteenth aspect, which is the dielectric polymeric composition of any one of the first through the seventeenth aspects, wherein the balancing anion is selected from the group consisting of a halide, a nitrate, a phosphate, a halogenated phosphate, hexafluorophosphate, a chlorate, a sulfate, an alkyl sulfate, a borate, tetrafluoroborate, a sulfonate, trifluoromethanesulfonate, a carboxylate, an acetate, trifluoromethaneacetate, a dicyanamide anion, a phosphazine anion, an imide anion, a bis(trifluoromethanesulfonyl)imide anion, a bis(pentafluoroethanesulfonyl)imide anion, and combinations thereof.

A nineteenth aspect, which is the dielectric polymeric composition of any one of the first through the eighteenth aspects, wherein the balancing anion comprises hexafluorophosphate.

A twentieth aspect, which is dielectric polymeric composition of any one of the first through the nineteenth aspects, wherein the ionic liquid comprises 1-butyl-3-methylimidazolium hexafluorophosphate (BMImPF₆).

A twenty-first aspect, which is the dielectric polymeric composition of any one of the first through the twentieth aspects, wherein the at least one polymerizable vinyl monomer has the following structure:

wherein R⁶ is selected from the group consisting of hydrogen, an alkyl group, an aryl group, a substituted aryl group, an alkyl aryl group, a cyano group, and combinations thereof; and wherein R⁷ is selected from the group consisting of hydrogen, an alkoxycarbonyl group, an aryloxycarbonyl group, a carboxyl group, and combinations thereof.

A twenty-second aspect, which is the dielectric polymeric composition of the twenty-first aspect, wherein the at least one polymerizable vinyl monomer comprises at least one polymerizable acrylate monomer.

A twenty-third aspect, which is the dielectric polymeric composition of the twenty-second aspect, wherein the at least one polymerizable acrylate monomer comprises methyl acrylate, ethyl acrylate, methacrylate, methyl methacrylate (MMA), butyl methacrylate, or combinations thereof.

A twenty-fourth aspect, which is the dielectric polymeric composition of any one of the first through the twenty-third aspects, wherein the at least one polymerizable acrylate monomer comprises methyl methacrylate (MMA).

A twenty-fifth aspect, which is the dielectric polymeric composition of any one of the first through the twenty-fourth aspects, wherein the polymeric matrix is a terpolymer comprising structural units derived from at least one polymerizable acrylate monomer, and structural units derived from two polymerizable vinyl monomers other than the at least one polymerizable acrylate monomer.

A twenty-sixth aspect, which is the dielectric polymeric composition of any one of the first through the twenty-fifth aspects, wherein the polymeric matrix comprises from about 30 wt. % to about 40 wt. % structural units derived from methyl methacrylate (MMA), from about 35 wt. % to about 45 wt. % structural units derived from styrene, and from about 20 wt. % to about 30 wt. % structural units derived from acrylonitrile; and wherein the concentration of the ionic liquid in the dielectric polymeric composition ranges from about 1 wt. % to about 10 wt. %.

A twenty-seventh aspect, which is the dielectric polymeric composition of any one of the first through the twenty-sixth aspects, wherein the polymeric matrix is a copolymer comprising structural units derived from two polymerizable vinyl monomers.

A twenty-eighth aspect, which is the dielectric polymeric composition of any one of the first through the twenty-seventh aspects, wherein the at least one polymerizable vinyl monomer comprises styrene, acrylonitrile, derivatives thereof, or combinations thereof.

A twenty-ninth aspect, which is the dielectric polymeric composition of any one of the first through the twenty-first aspects, wherein the polymeric matrix comprises from about 70 wt. % to about 80 wt. % structural units derived from styrene, and from about 20 wt. % to about 30 wt. % structural units derived from acrylonitrile; and wherein the concentration of the ionic liquid in the dielectric polymeric composition ranges from about 1 wt. % to about 10 wt. %.

A thirtieth aspect, which is the dielectric polymeric composition of any one of the first through the twenty-ninth aspects, wherein the dielectric polymeric composition is characterized by remnant polarization.

A thirty-first aspect, which is the dielectric polymeric composition of the thirtieth aspect, wherein the dielectric polymeric composition is ferroelectric.

A thirty-second aspect, which is the dielectric polymeric composition of any one of the first through the thirty-first aspects, wherein the dielectric polymeric composition is characterized by a low polarization loss, and wherein the polarization loss is less than about 35%.

A thirty-third aspect, which is the dielectric polymeric composition of any one of the first through the thirty-second aspects, wherein the dielectric polymeric composition is characterized by a polarization loss of less than about 25%.

A thirty-fourth aspect, which is the dielectric polymeric composition of any one of the first through the thirty-third aspects, wherein the dielectric polymeric composition is characterized by a maximum polarization of equal to or greater than about 0.4 µC/cm², under an applied electric field of 150 kV/cm.

A thirty-fifth aspect, which is the dielectric polymeric composition of any one of the first through the thirty-fourth aspects, wherein the dielectric polymeric composition is characterized by a remnant polarization of equal to or greater than about 0.1 µC/cm², subsequent to removal of an applied electric field of 150 kV/cm.

A thirty-sixth aspect, which is the dielectric polymeric composition of any one of the first through the thirty-fifth aspects, wherein the dielectric polymeric composition is characterized by a dielectric constant (E) at 1 kHz of from about 5 to about 30.

A thirty-seventh aspect, which is the dielectric polymeric composition of any one of the first through the thirty-sixth aspects, wherein the dielectric polymeric composition is characterized by a coercive field of equal to or greater than about 20 kV/cm, under an applied electric field of 150 kV/cm.

A thirty-eighth aspect, which is the dielectric polymeric composition of any one of the first through the thirty-seventh aspects, wherein the dielectric polymeric composition is characterized by (i) a dielectric constant (E) at 1 kHz of from about 5 to about 30; and (ii) a polarization loss of less than about 10%.

A thirty-ninth aspect, which is the dielectric polymeric composition of any one of the first through the thirty-eighth aspects, wherein the polymeric matrix further comprises structural units derived from a polymerizable co-monomer, and wherein the polymerizable co-monomer comprises at least one functional group that has the ability to form hydrogen bonds within the polymeric matrix.

A fortieth aspect, which is the dielectric polymeric composition of the thirty-ninth aspect, wherein the polymeric matrix comprises hydrogen bonds between structural units derived from the polymerizable co-monomer and structural units derived from the at least one polymerizable vinyl monomer.

A forty-first aspect, which is the dielectric polymeric composition of any one of the first through the fortieth aspects, wherein the ionic liquid is miscible or partially miscible with the polymerizable co-monomer, wherein a difference between a $T_g$ of the polymeric matrix and a $T_g$ of the dielectric polymeric composition is equal to or greater than about 25° C.

A forty-second aspect, which is the dielectric polymeric composition of any one of the first through the forty-first aspects, wherein the polymeric matrix further comprises a crosslinking agent, and wherein the polymeric matrix comprises covalent crosslinks between the crosslinking agent and the structural units derived from the at least one polymerizable vinyl monomer.

A forty-third aspect, which is a dielectric polymeric composition comprising (a) a polymeric matrix, wherein the polymeric matrix comprises structural units derived from at least one polymerizable vinyl monomer and a polymerizable co-monomer, and wherein the polymerizable co-monomer comprises at least one functional group that has the ability to form hydrogen bonds within the polymeric matrix; and (b) an ionic liquid, wherein the ionic liquid comprises an organic cation and a balancing anion, wherein the ionic liquid is miscible or partially miscible with the at least one polymerizable vinyl monomer, wherein the ionic liquid is miscible or partially miscible with the polymerizable co-monomer, and wherein the concentration of the ionic liquid in the dielectric polymeric composition ranges from about 0.5 wt. % to about 30 wt. %.

A forty-fourth aspect, which is the dielectric polymeric composition of the forty-third aspect, wherein the polymeric matrix comprises hydrogen bonds between structural units derived from the polymerizable co-monomer and structural units derived from the at least one polymerizable vinyl monomer.

A forty-fifth aspect, which is the dielectric polymeric composition of any one of the forty-third and the forty-fourth aspects, wherein the at least one functional group that has the ability to form hydrogen bonds within the polymeric matrix is selected from the group consisting of a hydroxyl group, a carboxyl group, an amino group, an imino group, and combinations thereof.

A forty-sixth aspect, which is the dielectric polymeric composition of any one of the forty-third through the forty-fifth aspects, wherein the at least one functional group that has the ability to form hydrogen bonds within the polymeric matrix comprises a hydroxyl group.

A forty-seventh aspect, which is the dielectric polymeric composition of any one of the forty-third through the forty-sixth aspects, wherein the polymerizable co-monomer is an acrylate monomer.

A forty-eighth aspect, which is the dielectric polymeric composition of the forty-seventh aspect, wherein the acrylate monomer comprises a hydroxyalkyl methacrylate.

A forty-ninth aspect, which is the dielectric polymeric composition of any one of the forty-third through the forty-eighth aspects, wherein the acrylate monomer comprises 2-hydroxyethyl methacrylate (HEMA).

A fiftieth aspect, which is the dielectric polymeric composition of any one of the forty-third through the forty-ninth aspects, wherein the polymeric matrix comprises from about 70 wt. % to about 95 wt. % structural units derived from the at least one polymerizable vinyl monomer, and from about 5 wt. % to about 30 wt. % structural units derived from the polymerizable co-monomer.

A fifty-first aspect, which is the dielectric polymeric composition of the fiftieth aspect, wherein the at least one polymerizable vinyl monomer comprises an alkyl methacrylate, and wherein the polymerizable co-monomer comprises a hydroxyalkyl methacrylate.

A fifty-second aspect, which is the dielectric polymeric composition of the fifty-first aspect, wherein the polymeric matrix comprises from about 85 wt. % to about 95 wt. % structural units derived from methyl methacrylate (MMA), and from about 5 wt. % to about 15 wt. % structural units derived from 2-hydroxyethyl methacrylate (HEMA); and wherein the concentration of the ionic liquid in the dielectric polymeric composition ranges from about 1 wt. % to about 10 wt. %.

A fifty-third aspect, which is the dielectric polymeric composition of any one of the forty-third through the fifty-second aspects, wherein the polymeric matrix comprises about 90 wt. % structural units derived from methyl methacrylate (MMA), and about 10 wt. % structural units derived from 2-hydroxyethyl methacrylate (HEMA); and wherein the concentration of the ionic liquid in the dielectric polymeric composition is about 5 wt. %.

A fifty-fourth aspect, which is the dielectric polymeric composition of any one of the forty-third through the fifty-third aspects, wherein the dielectric polymeric composition comprises less than about 10 ppm of unreacted polymerizable vinyl monomer and unreacted polymerizable co-monomer, based on the total weight of the dielectric polymeric composition, wherein an amount of unreacted polymerizable vinyl monomer and unreacted polymerizable co-monomer in the dielectric polymeric composition is measured via high performance liquid chromatography (HPLC).

A fifty-fifth aspect, which is the dielectric polymeric composition of any one of the forty-third through the fifty-fourth aspects, wherein the dielectric polymeric composition comprises a continuous polymeric phase comprising the polymeric matrix having dispersed therein an ionic liquid dispersed phase, wherein the ionic liquid dispersed phase comprises the ionic liquid.

A fifty-sixth aspect, which is the dielectric polymeric composition of the fifty-fifth aspect, wherein the dielectric polymeric composition is transparent.

A fifty-seventh aspect, which is the dielectric polymeric composition of any one of the forty-third through the fifty-sixth aspects, wherein the dielectric polymeric composition is ferroelectric.

A fifty-eighth aspect, which is the dielectric polymeric composition of any one of the forty-third through the fifty-seventh aspects, wherein the dielectric polymeric composition is characterized by a maximum polarization of equal to or greater than about 0.6 $\mu C/cm^2$, under an applied electric field of 150 kV/cm.

A fifty-ninth aspect, which is the dielectric polymeric composition of any one of the forty-third through the fifty-eighth aspects, wherein the dielectric polymeric composition is characterized by a maximum polarization that is increased by equal to or greater than about 25% when compared to a maximum polarization of an otherwise similar dielectric polymeric composition (i) comprising a polymeric matrix and an ionic liquid and (ii) without the structural units derived from a polymerizable co-monomer.

A sixtieth aspect, which is the dielectric polymeric composition of any one of the forty-third through the fifty-ninth aspects, wherein the dielectric polymeric composition is characterized by a remnant polarization of equal to or greater than about 0.25 $\mu C/cm^2$, subsequent to removal of an applied electric field of 150 kV/cm.

A sixty-first aspect, which is the dielectric polymeric composition of any one of the forty-third through the sixtieth aspects, wherein the dielectric polymeric composition is characterized by a remnant polarization subsequent to removal of an applied electric field of 150 kV/cm that is increased by equal to or greater than about 50% when compared to a remnant polarization subsequent to removal of an applied electric field of 150 kV/cm of an otherwise similar dielectric polymeric composition (i) comprising a polymeric matrix and an ionic liquid and (ii) without the structural units derived from a polymerizable co-monomer.

A sixty-second aspect, which is the dielectric polymeric composition of any one of the forty-third through the sixty-first aspects, wherein the dielectric polymeric composition is characterized by a coercive field of equal to or greater than about 45 kV/cm, under an applied electric field of 150 kV/cm.

A sixty-third aspect, which is the dielectric polymeric composition of any one of the forty-third through the sixty-second aspects, wherein the dielectric polymeric composition is characterized by a coercive field under an applied electric field of 150 kV/cm that is increased by equal to or greater than about 75% when compared to a coercive field under an applied electric field of 150 kV/cm of an otherwise similar dielectric polymeric composition (i) comprising a polymeric matrix and an ionic liquid and (ii) without the structural units derived from a polymerizable co-monomer.

A sixty-fourth aspect, which is the dielectric polymeric composition of any one of the forty-third through the sixty-third aspects, wherein the dielectric polymeric composition is characterized by a polarization loss of less than about 10%.

A sixty-fifth aspect, which is a dielectric polymeric composition comprising (a) a crosslinked polymeric matrix, wherein the polymeric matrix comprises a crosslinking agent and structural units derived from at least one polymerizable vinyl monomer, and wherein the polymeric matrix comprises covalent crosslinks between the crosslinking agent and the structural units derived from at least one polymerizable vinyl monomer; and (b) an ionic liquid, wherein the ionic liquid comprises an organic cation and a balancing anion, wherein the ionic liquid is miscible or partially miscible with the at least one polymerizable vinyl monomer, and wherein the concentration of the ionic liquid in the dielectric polymeric composition ranges from about 0.5 wt. % to about 30 wt. %.

A sixty-sixth aspect, which is the dielectric polymeric composition of the sixty-fifth aspect, wherein the crosslinking agent comprises tetraethylene glycol diacrylate (TEGDA), tetraethylene glycol dimethacrylate (TEGDMA), ethylene glycol dimethacrylate (EGDMA), diethylene glycol dimethacrylate (DEGDMA), hexamethylene glycol dimethacrylate(HMGDMA), polyethylene glycol diacrylate (PEGDA), polyethylene glycol dimethacrylate (PEGDMA), trimethylol propane triacrylate (TMPTA), or combinations thereof.

A sixty-seventh aspect, which is the dielectric polymeric composition of any one of the sixty-fifth and the sixty-sixth aspects, wherein the crosslinking agent comprises tetraethylene glycol diacrylate (TEGDA).

A sixty-eighth aspect, which is the dielectric polymeric composition of any one of the sixty-fifth through the sixty-seventh aspects, wherein the crosslinking agent is present in the dielectric polymeric composition in an amount of from about 0.1 wt. % to about 10 wt. %.

A sixty-ninth aspect, which is the dielectric polymeric composition of any one of the sixty-fifth through the sixty-eighth aspects, wherein the dielectric polymeric composition comprises less than about 10 ppm of unreacted polymerizable vinyl monomer, based on the total weight of the dielectric polymeric composition, wherein an amount of unreacted polymerizable vinyl monomer in the dielectric polymeric composition is measured via high performance liquid chromatography (HPLC).

A seventieth aspect, which is the dielectric polymeric composition of any one of the sixty-fifth through the sixty-ninth aspects, wherein the dielectric polymeric composition comprises a continuous polymeric phase comprising the polymeric matrix having dispersed therein an ionic liquid dispersed phase, wherein the ionic liquid dispersed phase comprises the ionic liquid.

A seventy-first aspect, which is the dielectric polymeric composition of the seventieth aspect, wherein the dielectric polymeric composition is transparent.

A seventy-second aspect, which is the dielectric polymeric composition of any one of the sixty-fifth through the seventy-first aspects, wherein the dielectric polymeric composition is ferroelectric.

A seventy-third aspect, which is the dielectric polymeric composition of any one of the sixty-fifth through the seventy-second aspects, wherein the dielectric polymeric composition is characterized by a maximum polarization of equal to or greater than about 0.65 $\mu C/cm$, under an applied electric field of 150 kV/cm.

A seventy-fourth aspect, which is the dielectric polymeric composition of any one of the sixty-fifth through the seventy-third aspects, wherein the dielectric polymeric composition is characterized by a maximum polarization that is increased by equal to or greater than about 30% when compared to a maximum polarization of an otherwise similar dielectric polymeric composition (i) comprising a polymeric matrix and an ionic liquid and (ii) without the crosslinking agent.

A seventy-fifth aspect, which is the dielectric polymeric composition of any one of the sixty-fifth through the seventy-fourth aspects, wherein the dielectric polymeric composition is characterized by a remnant polarization of equal to or greater than about 0.25 $\mu C/cm^2$, subsequent to removal of an applied electric field of 150 kV/cm.

A seventy-sixth aspect, which is the dielectric polymeric composition of any one of the sixty-fifth through the seventy-fifth aspects, wherein the dielectric polymeric composition is characterized by a remnant polarization subsequent to removal of an applied electric field of 150 kV/cm that is increased by equal to or greater than about 50% when compared to a remnant polarization subsequent to removal of an applied electric field of 150 kV/cm of an otherwise similar dielectric polymeric composition (i) comprising a polymeric matrix and an ionic liquid and (ii) without the crosslinking agent.

A seventy-seventh aspect, which is the dielectric polymeric composition of any one of the sixty-fifth through the seventy-sixth aspects, wherein the dielectric polymeric composition is characterized by a coercive field of equal to or greater than about 40 kV/cm, under an applied electric field of 150 kV/cm.

A seventy-eighth aspect, which is the dielectric polymeric composition of any one of the sixty-fifth through the seventy-seventh aspects, wherein the dielectric polymeric composition is characterized by a coercive field under an applied electric field of 150 kV/cm that is increased by equal to or greater than about 60% when compared to a coercive field under an applied electric field of 150 kV/cm of an otherwise similar dielectric polymeric composition (i) comprising a polymeric matrix and an ionic liquid and (ii) without the crosslinking agent.

A seventy-ninth aspect, which is the dielectric polymeric composition of any one of the sixty-fifth through the seventy-eighth aspects, wherein the dielectric polymeric composition is characterized by a polarization loss of less than about 10%.

An eightieth aspect, which is a dielectric polymeric composition comprising (a) a polymeric matrix; wherein the polymeric matrix comprises structural units derived from at least one polymerizable vinyl monomer; wherein the polymeric matrix comprises a crosslinking agent, structural units derived from a polymerizable co-monomer, or both a crosslinking agent and structural units derived from a polymerizable co-monomer; wherein the crosslinking agent covalently crosslinks the polymeric matrix; and wherein the polymerizable co-monomer comprises at least one functional group that has the ability to form hydrogen bonds within the polymeric matrix; (b) an ionic liquid, wherein the ionic liquid comprises an organic cation and a balancing anion, wherein the ionic liquid is miscible or partially miscible with the at least one polymerizable vinyl monomer, wherein the ionic liquid is miscible or partially miscible with the polymerizable co-monomer, and wherein the concentration of the ionic liquid in the dielectric polymeric composition ranges from about 0.5 wt. % to about 30 wt. %; and (c) less than about 10 ppm of unreacted polymerizable vinyl monomer and unreacted polymerizable co-monomer, based on the total weight of the dielectric polymeric composition, wherein an amount of unreacted polymerizable vinyl monomer and unreacted polymerizable co-monomer in the dielectric polymeric composition is measured via high performance liquid chromatography (HPLC).

An eighty-first aspect, which is the dielectric polymeric composition of the eightieth aspect, wherein the dielectric polymeric composition is ferroelectric.

An eighty-second aspect, which is the dielectric polymeric composition of any one of the eightieth and the eighty-first aspects, wherein the dielectric polymeric composition is ionically non-conductive.

An eighty-third aspect, which is the dielectric polymeric composition of any one of the eightieth through the eighty-second aspects, wherein the dielectric polymeric composition is electrically non-conductive.

An eighty-fourth aspect, which is the dielectric polymeric composition of any one of the eightieth through the eighty-third aspects, wherein the polymeric matrix comprises covalent crosslinks between the crosslinking agent, and the structural units derived from the at least one polymerizable vinyl monomer and optionally the structural units derived from the polymerizable co-monomer.

An eighty-fifth aspect, which is the dielectric polymeric composition of any one of the eightieth through the eighty-fourth aspects, wherein the polymeric matrix comprises hydrogen bonds between the structural units derived from the polymerizable co-monomer and the structural units derived from at least one polymerizable vinyl monomer.

An eighty-sixth aspect, which is the dielectric polymeric composition of any one of the eightieth through the eighty-fifth aspects, wherein the ionic liquid is compatible with the polymeric matrix, and wherein a difference between a glass transition temperature ($T_g$) of the polymeric matrix and a $T_g$ of the dielectric polymeric composition is equal to or greater than about 25° C.

An eighty-seventh aspect, which is the dielectric polymeric composition of the eighty-sixth aspect, wherein the dielectric polymeric composition comprises a continuous polymeric phase comprising the polymeric matrix having dispersed therein an ionic liquid dispersed phase, wherein the ionic liquid dispersed phase comprises the ionic liquid, and the ionic liquid dispersed phase has an average cross section size of less than about 200 nm.

An eighty-eighth aspect, which is the dielectric polymeric composition of any one of the eightieth through the eighty-fifth aspects, wherein the ionic liquid is partially compatible with the polymeric matrix, and wherein a difference between a $T_g$ of the polymeric matrix and a $T_g$ of the dielectric polymeric composition is from about 5° C. to about 25° C.

An eighty-ninth aspect, which is the dielectric polymeric composition of the eighty-eighth aspect, wherein the dielectric polymeric composition comprises a continuous polymeric phase comprising the polymeric matrix having dispersed therein an ionic liquid dispersed phase, wherein the ionic liquid dispersed phase comprises the ionic liquid, and wherein the ionic liquid dispersed phase has an average cross section size of equal to or greater than about 200 nm.

A ninetieth aspect, which is the dielectric polymeric composition of any one of the eightieth through the eighty-ninth aspects, wherein the dielectric polymeric composition is characterized by a polarization loss of less than about 35%.

A ninety-first aspect, which is the dielectric polymeric composition of any one of the eightieth through the ninetieth aspects, wherein the dielectric polymeric composition is characterized by a polarization loss of less than about 10%.

A ninety-second aspect, which is an article formed from the dielectric polymeric composition of any one of the eightieth through the ninety-first aspects.

A ninety-third aspect, which is the article of the ninety-second aspect, wherein the article is a film or a sheet.

A ninety-fourth aspect, which is a piezoelectric device comprising the article of any one of the ninety-second and the ninety-third aspects.

A ninety-fifth aspect, which is the piezoelectric device of the ninety-fourth aspect, wherein the piezoelectric device is selected from the group consisting of a piezoelectric sensor, a piezoelectric transducer, a piezoelectric energy harvester, and a piezoelectric actuator.

A ninety-sixth aspect, which is a method for making a dielectric polymeric composition, the method comprising (a) subjecting a mixture comprising an ionic liquid and a polymerizable precursor comprising at least one polymerizable vinyl monomer to in situ polymerization conditions to form a precursor dielectric polymeric composition, wherein the ionic liquid comprises an organic cation and a balancing anion, wherein the precursor dielectric polymeric composition comprises a polymeric matrix, the ionic liquid, and unreacted polymerizable vinyl monomer, wherein the polymeric matrix comprises polymerized vinyl monomer, and wherein the ionic liquid is compatible or partially compatible with the polymeric matrix; and (b) removing at least a portion of the unreacted polymerizable vinyl monomer from the precursor dielectric polymeric composition to form the dielectric polymeric composition; wherein the dielectric polymeric composition comprises the polymeric matrix, the ionic liquid, and less than about 10 ppm of unreacted polymerizable vinyl monomer, based on the total weight of the dielectric polymeric composition, wherein an amount of unreacted polymerizable vinyl monomer in the dielectric polymeric composition is measured via high performance liquid chromatography (HPLC); and wherein the concentration of the ionic liquid in the dielectric polymeric composition ranges from about 0.5 wt. % to about 30 wt. %.

A ninety-seventh aspect, which is the method of the ninety-sixth aspect, wherein the ionic liquid is miscible or partially miscible with the at least one polymerizable vinyl monomer.

A ninety-eighth aspect, which is the method of any one of the ninety-sixth and the ninety-seventh aspects, wherein the mixture comprises the at least one polymerizable vinyl monomer dissolved in the ionic liquid prior to forming the precursor dielectric polymeric composition in step (a).

A ninety-ninth aspect, which is the method of any one of the ninety-sixth through the ninety-eighth aspects, wherein the mixture comprises a free radical initiator, wherein the free radical initiator is selected from a group consisting of azobisisobutyronitrile, benzoyl peroxide, di-tert-butyl peroxide, tert-amyl peroxybenzoate, phenyl-azo-triphenylmethane, cumyl peroxide, acetyl peroxide, lauroyl peroxide, tert-butylhydroperoxide, tert-butyl perbenzoate, and combinations thereof.

A hundredth aspect, which is the method of any one of the ninety-sixth through the ninety-ninth aspects, wherein the mixture comprises a free radical initiator, wherein the free radical initiator comprises azobisisobutyronitrile.

A hundred-and-first aspect, which is the method of the ninety-ninth aspect, wherein the mixture consists essentially of or consists of the ionic liquid, the polymerizable precursor, and the free radical initiator.

A hundred-and-second aspect, which is the method of any one of the ninety-sixth through the hundred-and-first aspects, wherein the polymerization conditions comprise a temperature ranging from about 30° C. to about 100° C.

A hundred-and-third aspect, which is the method of any one of the ninety-sixth through the hundred-and-second aspects, wherein the step (b) of removing at least a portion of the unreacted polymerizable vinyl monomer further comprises polymerizing a portion of the unreacted polymerizable vinyl monomer to form the polymerized vinyl monomer.

A hundred-and-fourth aspect, which is the method of any one of the ninety-sixth through the hundred-and-third aspects, wherein the step (b) of removing at least a portion of the unreacted polymerizable vinyl monomer comprises heating the precursor dielectric polymeric composition.

A hundred-and-fifth aspect, which is the method of the hundred-and-fourth aspect, wherein the precursor dielectric polymeric composition is heated to a first temperature of from about 50° C. to about 70° C. for a first time period of from about 12 h to about 30 h.

A hundred-and-sixth aspect, which is the method of the hundred-and-fifth aspect, wherein, subsequent to heating the precursor dielectric polymeric composition to the first temperature, the precursor dielectric polymeric composition is heated to a second temperature of from about 70° C. to about 200° C. for a second time period of from about 30 min to about 6 h, wherein the second temperature is greater than the first temperature.

A hundred-and-seventh aspect, which is the method of the hundred-and-sixth aspect, wherein the second temperature is lower than a boiling point of the ionic liquid, and wherein the second temperature is greater than a boiling point of the at least one polymerizable vinyl monomer.

A hundred-and-eighth aspect, which is the method of any one of the ninety-sixth through the hundred-and-seventh aspects, wherein the dielectric polymeric composition comprises a continuous polymeric phase comprising the polymeric matrix having dispersed therein an ionic liquid dispersed phase, wherein the ionic liquid dispersed phase comprises the ionic liquid.

A hundred-and-ninth aspect, which is the method of the hundred-and-eighth aspect, wherein the ionic liquid is compatible with the polymeric matrix, and wherein a difference between a glass transition temperature ($T_g$) of the polymeric matrix and a $T_g$ of the dielectric polymeric composition is equal to or greater than about 25° C.

A hundred-and-tenth aspect, which is the method of the hundred-and-ninth aspect, wherein the ionic liquid dispersed phase has an average cross section size of less than about 200 nm.

A hundred-and-eleventh aspect, which is the method of any one of the ninety-sixth through the hundred-and-tenth aspects, wherein the dielectric polymeric composition is transparent.

A hundred-and-twelfth aspect, which is the method of any one of the ninety-sixth through the hundred-and-eighth aspects, wherein the ionic liquid is partially compatible with the polymeric matrix, and wherein a difference between a $T_g$ of the polymeric matrix and a $T_g$ of the dielectric polymeric composition is from about 5° C. to about 25° C.

A hundred-and-thirteenth aspect, which is the method of the hundred-and-twelfth aspect, wherein the ionic liquid dispersed phase has an average cross section size of from equal to or greater than about 200 nm.

A hundred-and-fourteenth aspect, which is the method of any one of the ninety-sixth through the hundred-and-thirteenth aspects, wherein the dielectric polymeric composition is characterized by a polarization loss of less than about 10%.

A hundred-and-fifteenth aspect, which is the method of any one of the ninety-sixth through the hundred-and-fourteenth aspects, wherein the polymerizable precursor further comprises a polymerizable co-monomer, a crosslinking agent, or both a polymerizable co-monomer and a crosslinking agent, wherein the polymerizable co-monomer comprises at least one functional group that has the ability to form hydrogen bonds within the polymeric matrix, and wherein the crosslinking agent covalently crosslinks the polymeric matrix.

A hundred-and-sixteenth aspect, which is the method of the hundred-and-fifteenth aspect, wherein the polymeric matrix comprises covalent crosslinks between the crosslinking agent, and structural units derived from the at least one polymerizable vinyl monomer and optionally structural units derived from the polymerizable co-monomer.

A hundred-and-seventeenth aspect, which is the method of any one of the ninety-sixth through the hundred-and-sixteenth aspects, wherein the polymeric matrix comprises structural units derived from the at least one polymerizable vinyl monomer and structural units derived from the polymerizable co-monomer, and wherein the polymeric matrix comprises hydrogen bonds between the structural units derived from the polymerizable co-monomer and the structural units derived from at least one polymerizable vinyl monomer.

A hundred-and-eighteenth aspect, which is a method for making a dielectric polymeric composition, the method comprising subjecting a mixture comprising an ionic liquid and a polymerizable precursor to in situ polymerization conditions to form a dielectric polymeric composition; wherein the ionic liquid comprises an organic cation and a balancing anion; wherein the polymerizable precursor comprises at least one polymerizable vinyl monomer and a polymerizable constituent; wherein the polymerizable constituent comprises a polymerizable co-monomer, a crosslinking agent, or both a polymerizable co-monomer and a crosslinking agent; wherein the dielectric polymeric composition comprises a polymeric matrix and the ionic liquid; wherein the polymeric matrix comprises polymerized vinyl monomer an optionally polymerized co-monomer; wherein the ionic liquid is compatible or partially compatible with the polymeric matrix; wherein the polymerizable co-monomer comprises at least one functional group that has the ability to form hydrogen bonds within the polymeric matrix; wherein the crosslinking agent covalently crosslinks the polymeric matrix; and wherein the concentration of the ionic liquid in the dielectric polymeric composition ranges from about 0.5 wt. % to about 30 wt. %.

A hundred-and-nineteenth aspect, which is the method of the hundred-and-eighteenth aspect, wherein the ionic liquid is miscible or partially miscible with the at least one polymerizable vinyl monomer and the polymerizable co-monomer.

A hundred-and-twentieth aspect, which is the method of any one of the hundred-and-eighteenth and the hundred-and-nineteenth aspects, wherein the mixture comprises the at least one polymerizable vinyl monomer and the polymerizable co-monomer dissolved in the ionic liquid prior to forming the dielectric polymeric composition.

A hundred-and-twenty-first aspect, which is the method of any one of the hundred-and-eighteenth through the hundred-and-twentieth aspects, wherein the mixture comprises a free radical initiator.

A hundred-and-twenty-second aspect, which is the method of the hundred-and-twenty-first aspect, wherein the mixture consists essentially of or consists of the ionic liquid, the polymerizable precursor, and the free radical initiator.

A hundred-and-twenty-third aspect, which is the method of any one of the hundred-and-eighteenth through the hundred-and-twenty-second aspects, wherein the polymerization conditions comprise a temperature ranging from about 30° C. to about 100° C.

A hundred-and-twenty-fourth aspect, which is the method of any one of the hundred-and-eighteenth through the hundred-and-twenty-third aspects, wherein the ionic liquid is compatible with the polymeric matrix, and wherein a difference between a glass transition temperature ($T_g$) of the polymeric matrix and a $T_g$ of the dielectric polymeric composition is equal to or greater than about 25° C.

A hundred-and-twenty-fifth aspect, which is the method of any one of the hundred-and-eighteenth through the hundred-and-twenty-fourth aspects, wherein the dielectric polymeric composition is characterized by a polarization loss of less than about 25%.

A hundred-and-twenty-sixth aspect, which is the method of any one of the hundred-and-eighteenth through the hundred-and-twenty-fifth aspects further comprising removing at least a portion of unreacted polymerizable vinyl monomer and unreacted polymerizable co-monomer from the dielectric polymeric composition, wherein the dielectric polymeric composition comprises less than about 10 ppm of unreacted polymerizable vinyl monomer and unreacted polymerizable co-monomer, based on the total weight of the dielectric polymeric composition, subsequent to removing the unreacted monomer and unreacted co-monomer, wherein an amount of unreacted polymerizable vinyl monomer and unreacted polymerizable co-monomer in the dielectric polymeric composition is measured via high performance liquid chromatography (HPLC).

A hundred-and-twenty-seventh aspect, which is the method of any one of the hundred-and-eighteenth through the hundred-and-twenty-sixth aspects, wherein the polymeric matrix comprises covalent crosslinks between the crosslinking agent, and structural units derived from the at least one polymerizable vinyl monomer and optionally structural units derived from the polymerizable co-monomer.

A hundred-and-twenty-eighth aspect, which is the method of any one of the hundred-and-eighteenth through the hundred-and-twenty-seventh aspects, wherein the polymeric matrix comprises structural units derived from the at least one polymerizable vinyl monomer and structural units derived from the polymerizable co-monomer, and wherein the polymeric matrix comprises hydrogen bonds between the structural units derived from the polymerizable co-monomer and the structural units derived from at least one polymerizable vinyl monomer.

A hundred-and-twenty-ninth aspect, which is a method for making a dielectric polymeric composition, the method comprising (a) subjecting a mixture comprising an ionic liquid and a polymerizable precursor to in situ polymerization conditions to form a precursor dielectric polymeric composition; wherein the ionic liquid comprises an organic cation and a balancing anion; wherein the polymerizable precursor comprises at least one polymerizable vinyl monomer and a polymerizable constituent; wherein the polymerizable constituent comprises a polymerizable co-monomer, a crosslinking agent, or both a polymerizable co-monomer and a crosslinking agent; wherein the precursor dielectric polymeric composition comprises a polymeric matrix, the ionic liquid, unreacted polymerizable vinyl monomer, and optionally unreacted polymerizable co-monomer; wherein the polymeric matrix comprises polymerized vinyl monomer and optionally polymerized co-monomer; wherein the polymerizable co-monomer comprises at least one functional group that has the ability to form hydrogen bonds within the polymeric matrix; and wherein the crosslinking agent covalently crosslinks the polymeric matrix; and (b) removing at least a portion of the unreacted polymerizable vinyl monomer and optionally at least a portion of the unreacted polymerizable co-monomer from the precursor dielectric polymeric composition to form the dielectric polymeric composition; wherein the dielectric polymeric composition comprises the polymeric matrix, the ionic liquid, and less than about 10 ppm of unreacted polymerizable vinyl monomer and unreacted polymerizable co-monomer, based on the total weight of the dielectric polymeric composition, wherein an amount of unreacted polymerizable vinyl monomer and unreacted polymerizable co-monomer in the dielectric polymeric composition is measured via high performance liquid chromatography (HPLC); wherein the ionic liquid is compatible or partially compatible with the polymeric matrix; and wherein the concentration of the ionic liquid in the dielectric polymeric composition ranges from about 0.5 wt. % to about 30 wt. %.

A hundred-and-thirtieth aspect, which is the method of the hundred-and-twenty-ninth aspect, wherein the ionic liquid is miscible or partially miscible with the at least one polymerizable vinyl monomer and the polymerizable co-monomer.

A hundred-and-thirty-first aspect, which is the method of any one of the hundred-and-twenty-ninth and the hundred-and-thirtieth aspects, wherein the mixture consists essentially of or consists of the ionic liquid, the polymerizable precursor, and a free radical initiator.

A hundred-and-thirty-second aspect, which is the method of any one of the hundred-and-twenty-ninth through the hundred-and-thirty-first aspects, wherein the polymerization conditions comprise a temperature ranging from about 30° C. to about 100° C.

A hundred-and-thirty-third aspect, which is the method of any one of the hundred-and-twenty-ninth through the hundred-and-thirty-second aspects, wherein the ionic liquid is compatible with the polymeric matrix, and wherein a difference between a glass transition temperature ($T_g$) of the polymeric matrix and a $T_g$ of the dielectric polymeric composition is equal to or greater than about 25° C.

A hundred-and-thirty-fourth aspect, which is the method of any one of the hundred-and-twenty-ninth through the hundred-and-thirty-third aspects, wherein the dielectric polymeric composition is characterized by a polarization loss of less than about 25%.

A hundred-and-thirty-fifth aspect, which is the method of any one of the hundred-and-twenty-ninth through the hundred-and-thirty-fourth aspects, wherein the polymeric matrix is crosslinked, hydrogen bonded, or both crosslinked and hydrogen bonded.

A hundred-and-thirty-sixth aspect, which is the method of any one of the hundred-and-twenty-ninth through the hundred-and-thirty-fifth aspects, wherein the polymeric matrix is crosslinked, and wherein the polymeric matrix comprises covalent crosslinks between the crosslinking agent, and structural units derived from the at least one polymerizable vinyl monomer and optionally structural units derived from the polymerizable co-monomer.

A hundred-and-thirty-seventh aspect, which is the method of any one of the hundred-and-twenty-ninth through the hundred-and-thirty-sixth aspects, wherein the polymeric matrix comprises structural units derived from the at least one polymerizable vinyl monomer and structural units derived from the polymerizable co-monomer, and wherein the polymeric matrix comprises hydrogen bonds between the structural units derived from the polymerizable co-monomer and the structural units derived from at least one polymerizable vinyl monomer.

A hundred-and-thirty-eighth aspect, which is an apparatus comprising a mechanical sensor comprising a dielectric polymeric composition, the dielectric polymeric composition comprising (a) a polymeric matrix; wherein the polymeric matrix comprises structural units derived from at least one polymerizable vinyl monomer; wherein the polymeric matrix optionally comprises a crosslinking agent, structural units derived from a polymerizable co-monomer, or both a crosslinking agent and structural units derived from a polymerizable co-monomer; wherein the crosslinking agent covalently crosslinks the polymeric matrix; and wherein the polymerizable co-monomer comprises at least one functional group that has the ability to form hydrogen bonds within the polymeric matrix; (b) an ionic liquid, wherein the ionic liquid comprises an organic cation and a balancing anion, wherein the ionic liquid is miscible or partially miscible with the at least one polymerizable vinyl monomer, wherein the ionic liquid is miscible or partially miscible with the polymerizable co-monomer, and wherein the concentration of the ionic liquid in the dielectric polymeric composition ranges from about 0.5 wt. % to about 30 wt. %; and (c) less than about 10 ppm of unreacted polymerizable vinyl monomer and unreacted polymerizable co-monomer, based on the total weight of the dielectric polymeric composition, wherein an amount of unreacted polymerizable vinyl monomer and unreacted polymerizable co-monomer in the dielectric polymeric composition is measured via high performance liquid chromatography (HPLC).

A hundred-and-thirty-ninth aspect, which is the apparatus of the hundred-and-thirty-eighth aspect, wherein the polymeric matrix comprises covalent crosslinks between the crosslinking agent, and the structural units derived from the at least one polymerizable vinyl monomer and optionally the structural units derived from the polymerizable co-monomer.

A hundred-and-fortieth aspect, which is the apparatus of any one of the hundred-and-thirty-eighth and the hundred-and-thirty-ninth aspects, wherein the polymeric matrix comprises hydrogen bonds between the structural units derived from the polymerizable co-monomer and the structural units derived from at least one polymerizable vinyl monomer.

A hundred-and-forty-first aspect, which is the apparatus of any one of the hundred-and-thirty-eighth through the hundred-and-fortieth aspects, wherein the dielectric polymeric composition is piezoelectric.

A hundred-and-forty-second aspect, which is the apparatus of the hundred-and-forty-first aspect, wherein the dielectric polymeric composition is ferroelectric.

A hundred-and-forty-third aspect, which is the apparatus of any one of the hundred-and-thirty-eighth through the hundred-and-forty-second aspects, wherein the mechanical sensor is coupled to a read-out circuit configured to receive a voltage proportional to an electric charge generated across the dielectric polymeric composition in response to an applied stress on the mechanical sensor.

A hundred-and-forty-fourth aspect, which is the apparatus of the hundred-and-forty-third aspect further comprising a controller coupled to the read-out circuit, wherein the controller is configured to receive data from the read-out circuit, and wherein the controller is configured to determine the applied stress on the mechanical sensor based, at least in part, on the received data.

A hundred-and-forty-fifth aspect, which is the apparatus of the hundred-and-forty-fourth aspect, wherein the controller is configured to determine the applied stress based, at least in part, on the received data and on one or more parameters describing the dielectric polymeric composition of the mechanical sensor.

A hundred-and-forty-sixth aspect, which is the apparatus of any one of the hundred-and-thirty-eighth through the hundred-and-forty-fifth aspects, wherein the controller is further configured to determine a user input based, at least in part, on the received data.

A hundred-and-forty-seventh aspect, which is the apparatus of the hundred-and-forty-sixth aspect, wherein the controller is further configured to perform an action in response to the user input.

A hundred-and-forty-eighth aspect, which is the apparatus of the hundred-and-forty-seventh aspect, wherein the controller is configured to perform the action by controlling operation of an electronic device.

A hundred-and-forty-ninth aspect, which is the apparatus of any one of the hundred-and-thirty-eighth through the hundred-and-forty-eighth aspects, wherein the controller is configured to perform the action by switching on an electronic device.

A hundred-and-fiftieth aspect, which is the apparatus of any one of the hundred-and-thirty-eighth through the hundred-and-forty-ninth aspects, wherein the controller is configured to perform the action by switching on a wall light.

A hundred-and-fifty-first aspect, which is the apparatus of any one of the hundred-and-thirty-eighth through the hundred-and-forty-ninth aspects, wherein the controller is configured to perform the action by switching on an automobile component.

A hundred-and-fifty-second aspect, which is the apparatus of any one of the hundred-and-thirty-eighth through the hundred-and-forty-seventh aspects, wherein the controller is configured to perform the action by transmitting a wireless signal to control a television.

A hundred-and-fifty-third aspect, which is the apparatus of any one of the hundred-and-thirty-eighth through the hundred-and-fifty-second aspects further comprising (i) a plurality of mechanical sensors, wherein each mechanical sensor of the plurality of mechanical sensors comprises the dielectric polymeric composition; and (ii) a read-out circuit coupled to the plurality of mechanical sensors, wherein the read-out circuit is configured to receive a plurality of voltages, wherein each voltage is proportional to an electric charge generated across each dielectric polymeric composition of the plurality of mechanical sensors in response to an applied stress on the respective mechanical sensor.

A hundred-and-fifty-fourth aspect, which is the apparatus of the hundred-and-fifty-third aspect further comprising a controller coupled to the read-out circuit, wherein the controller is configured to receive data from the read-out circuit, and wherein the controller is configured to determine the applied stress on each mechanical sensor of the plurality of mechanical sensors based, at least in part, on the received data.

A hundred-and-fifty-fifth aspect, which is the apparatus of the hundred-and-fifty-fourth aspect, wherein the controller is further configured to determine a user input based, at least in part, on the received data.

A hundred-and-fifty-sixth aspect, which is the apparatus of the hundred-and-fifty-fifth aspect, wherein the controller is further configured to determine a gesture motion input by a user as the user input by processing the received data over a predetermined period of time.

A hundred-and-fifty-seventh aspect, which is the apparatus of any one of the hundred-and-thirty-eighth through the hundred-and-fifty-sixth aspects, wherein the controller is further configured to perform an action in response to the user input.

A hundred-and-fifty-eighth aspect, which is the apparatus of the hundred-and-fifty-seventh aspect, wherein the controller is configured to perform the action by controlling operation of an electronic device.

A hundred-and-fifty-ninth aspect, which is the apparatus of any one of the hundred-and-thirty-eighth through the hundred-and-fifty-eighth aspects, wherein the controller is configured to perform the action by adjusting a brightness of a wall light.

A hundred-and-sixtieth aspect, which is the apparatus of any one of the hundred-and-thirty-eighth through the hundred-and-fifty-eighth aspects, wherein the controller is configured to perform the action by adjusting a control setting in an automobile.

A hundred-and-sixty-first aspect, which is the apparatus of any one of the hundred-and-thirty-eighth through the hundred-and-fifty-eighth aspects, wherein the controller is configured to perform the action by transmitting a wireless signal to change channels on a television.

A hundred-and-sixty-second aspect, which is the apparatus of any one of the hundred-and-thirty-eighth through the hundred-and-fifty-eighth aspects, wherein the controller is configured to perform the action by turning pages on a display of a mobile computing device.

A hundred-and-sixty-third aspect, which is an apparatus comprising a mechanical actuator comprising a dielectric polymeric composition, the dielectric polymeric composition comprising (a) a polymeric matrix; wherein the polymeric matrix comprises structural units derived from at least one polymerizable vinyl monomer; wherein the polymeric matrix optionally comprises a crosslinking agent, structural units derived from a polymerizable co-monomer, or both a crosslinking agent and structural units derived from a polymerizable co-monomer; wherein the crosslinking agent covalently crosslinks the polymeric matrix; and wherein the polymerizable co-monomer comprises at least one functional group that has the ability to form hydrogen bonds within the polymeric matrix; (b) an ionic liquid, wherein the ionic liquid comprises an organic cation and a balancing anion, wherein the ionic liquid is miscible or partially miscible with the at least one polymerizable vinyl monomer, wherein the ionic liquid is miscible or partially miscible with the polymerizable co-monomer, and wherein the concentration of the ionic liquid in the dielectric polymeric composition ranges from about 0.5 wt. % to about 30 wt. %; and (c) less than about 10 ppm of unreacted polymerizable vinyl monomer and unreacted polymerizable co-monomer, based on the total weight of the dielectric polymeric composition, wherein an amount of unreacted polymerizable vinyl monomer and unreacted polymerizable co-monomer in the dielectric polymeric composition is measured via high performance liquid chromatography (HPLC).

A hundred-and-sixty-fourth aspect, which is the apparatus of the hundred-and-sixty-third aspect, wherein the polymeric matrix comprises covalent crosslinks between the crosslinking agent, and the structural units derived from the at least one polymerizable vinyl monomer and optionally the structural units derived from the polymerizable co-monomer.

A hundred-and-sixty-fifth aspect, which is the apparatus of any one of the hundred-and-sixty-third and the hundred-and-sixty-fourth aspects, wherein the polymeric matrix comprises hydrogen bonds between the structural units derived from the polymerizable co-monomer and the structural units derived from at least one polymerizable vinyl monomer.

A hundred-and-sixty-sixth aspect, which is the apparatus of any one of the hundred-and-sixty-third through the hundred-and-sixty-fifth aspects, wherein the dielectric polymeric composition is piezoelectric.

A hundred-and-sixty-seventh aspect, which is the apparatus of the hundred-and-sixty-sixth aspect, wherein the dielectric polymeric composition is ferroelectric.

A hundred-and-sixty-eighth aspect, which is the apparatus of any one of the hundred-and-sixty-third through the hundred-and-sixty-seventh aspects, wherein the mechanical actuator is coupled to a drive circuit, wherein the drive circuit is configured to apply a voltage proportional to a desired stress to be applied to the dielectric polymeric composition.

A hundred-and-sixty-ninth aspect, which is the apparatus of the hundred-and-sixty-eighth aspect further comprising a controller coupled to the drive circuit, wherein the controller is configured to control the drive circuit to provide touch feedback to a user.

A hundred-and-seventieth aspect, which is the apparatus of the hundred-and-sixty-ninth aspect, wherein the controller is configured to provide the touch feedback to the user in response to receiving user input.

A hundred-and-seventy-first aspect, which is the apparatus of any one of the hundred-and-sixty-third through the hundred-and-seventieth aspects, wherein the mechanical actuator is part of an array of mechanical actuators, wherein the apparatus further comprises a drive circuit, wherein the drive circuit is configured to apply a voltage to each mechanical actuator of the array of mechanical actuators.

A hundred-and-seventy-second aspect, which is the apparatus of the hundred-and-seventy-first aspect, wherein the array of mechanical actuators is integrated into a display of an electronic device, wherein the apparatus further comprises a controller, and wherein the controller is configured to control the array of mechanical actuators to provide touch feedback through the display to a user of the electronic device.

A hundred-and-seventy-third aspect, which is an electronic device comprising (i) a display device; and (ii) an array of electronic components, wherein the array of electronic components is proximal to the display device, and wherein each electronic component of the array of electronic components comprises a dielectric polymeric composition, the dielectric polymeric composition comprising (a) a polymeric matrix; wherein the polymeric matrix comprises structural units derived from at least one polymerizable vinyl monomer; wherein the polymeric matrix optionally comprises a crosslinking agent, structural units derived from a polymerizable co-monomer, or both a crosslinking agent and structural units derived from a polymerizable co-monomer; wherein the crosslinking agent covalently crosslinks the polymeric matrix; and wherein the polymerizable co-monomer comprises at least one functional group that has the ability to form hydrogen bonds within the polymeric matrix; (b) an ionic liquid, wherein the ionic liquid comprises an organic cation and a balancing anion, wherein the ionic liquid is miscible or partially miscible with the at least one polymerizable vinyl monomer, wherein the ionic liquid is miscible or partially miscible with the polymerizable co-monomer, and wherein the concentration of the ionic liquid in the dielectric polymeric composition ranges from about 0.5 wt. % to about 30 wt. %; and (c) less than about 10 ppm of unreacted polymerizable vinyl monomer and unreacted polymerizable co-monomer, based on the total weight of the dielectric polymeric composition, wherein an amount of unreacted polymerizable vinyl monomer and unreacted polymerizable co-monomer in the dielectric polymeric composition is measured via high performance liquid chromatography (HPLC).

A hundred-and-seventy-fourth aspect, which is the electronic device of the hundred-and-seventy-third aspect, wherein the polymeric matrix comprises covalent crosslinks between the crosslinking agent, and the structural units derived from the at least one polymerizable vinyl monomer and optionally the structural units derived from the polymerizable co-monomer.

A hundred-and-seventy-fifth aspect, which is the electronic device of any one of the hundred-and-seventy-third and the hundred-and-seventy-fourth aspects, wherein the polymeric matrix comprises hydrogen bonds between the structural units derived from the polymerizable co-monomer and the structural units derived from at least one polymerizable vinyl monomer.

A hundred-and-seventy-sixth aspect, which is the electronic device of any one of the hundred-and-seventy-third through the hundred-and-seventy-fifth aspects, wherein the dielectric polymeric composition is piezoelectric.

A hundred-and-seventy-seventh aspect, which is the electronic device of the hundred-and-seventy-sixth aspect, wherein the dielectric polymeric composition is ferroelectric.

A hundred-and-seventy-eighth aspect, which is the electronic device of the hundred-and-seventy-third through the hundred-and-seventy-seventh aspects, wherein the array of electronic components comprises an array of mechanical sensors.

A hundred-and-seventy-ninth aspect, which is the electronic device of the hundred-and-seventy-eighth aspect, wherein the array of mechanical sensors is located on a side of the display device that is facing towards the outside of the electronic device, wherein the electronic device further comprises a controller coupled to the array of mechanical sensors, wherein the controller is configured to receive user input through the array of mechanical sensors, and wherein the controller is configured to correlate the received user input to a position on the display device.

A hundred-and-eightieth aspect, which is the electronic device of any one of the hundred-and-seventy-third through the hundred-and-seventy-ninth aspect, wherein the array of electronic components comprises an array of mechanical actuators.

A hundred-and-eighty-first aspect, which is the electronic device of the hundred-and-eightieth aspect further comprising a controller, wherein the controller is coupled to the array of mechanical actuators, and wherein the controller is configured to generate touch feedback for a user through the array of mechanical actuators.

A hundred-and-eighty-second aspect, which is a dielectric polymeric composition comprising (a) a polymeric matrix, wherein the polymeric matrix comprises structural units derived from at least one polymerizable vinyl monomer; (b) an ionic additive, wherein the ionic additive comprises a cation and a balancing anion, and wherein the concentration of the ionic additive in the dielectric polymeric composition ranges from about 0.5 wt. % to about 30 wt. %; and (c) less than about 10 ppm of unreacted polymerizable vinyl monomer, based on the total weight of the dielectric polymeric composition, wherein an amount of unreacted polymerizable vinyl monomer in the dielectric polymeric composition is measured via high performance liquid chromatography (HPLC).

A hundred-and-eighty-third aspect, which is the dielectric polymeric composition of the hundred-and-eighty-second aspect, wherein the dielectric polymeric composition is ferroelectric.

A hundred-and-eighty-fourth aspect, which is the dielectric polymeric composition of any one of the hundred-and-eighty-second and the hundred-and-eighty-third aspects, wherein the at least one polymerizable vinyl monomer comprises at least one polymerizable acrylate monomer and wherein the at least one polymerizable acrylate monomer comprises methyl acrylate, ethyl acrylate, methacrylate, methyl methacrylate (MMA), butyl methacrylate, or combinations thereof.

A hundred-and-eighty-fifth aspect, which is the dielectric polymeric composition of any one of the hundred-and-eighty-second through the hundred-and-eighty-fourth aspects, wherein the dielectric polymeric composition is characterized by a low polarization loss, and wherein the polarization loss is less than about 35%.

A hundred-and-eighty-sixth aspect, which is the dielectric polymeric composition of any one of the hundred-and-eighty-second through the hundred-and-eighty-fifth aspects, wherein the dielectric polymeric composition is characterized by a maximum polarization of equal to or greater than about 0.4 μC/cm², under an applied electric field of 150 kV/cm.

A hundred-and-eighty-seventh aspect, which is the dielectric polymeric composition of any one of the hundred-and-eighty-second through the hundred-and-eighty-sixth aspects, wherein the dielectric polymeric composition is characterized by a remnant polarization of equal to or greater than about 0.1 μC/cm², subsequent to removal of an applied electric field of 150 kV/cm.

A hundred-and-eighty-eighth aspect, which is the dielectric polymeric composition of any one of the hundred-and-eighty-second through the hundred-and-eighty-seventh aspects, wherein the dielectric polymeric composition is characterized by a coercive field of equal to or greater than about 20 kV/cm, under an applied electric field of 150 kV/cm.

A hundred-and-eighty-ninth aspect, which is the dielectric polymeric composition of any one of the hundred-and-eighty-second through the hundred-and-eighty-eighth aspects, wherein the polymeric matrix further comprises structural units derived from a polymerizable co-monomer, and wherein the polymerizable co-monomer comprises at least one functional group that has the ability to form hydrogen bonds within the polymeric matrix.

A hundred-and-ninetieth aspect, which is the dielectric polymeric composition of any one of the hundred-and-eighty-second through the hundred-and-eighty-ninth aspects, wherein the polymeric matrix further comprises a crosslinking agent, and wherein the polymeric matrix comprises covalent crosslinks between the crosslinking agent and the structural units derived from the at least one polymerizable vinyl monomer.

A hundred-and-ninety-first aspect, which is the dielectric polymeric composition of any one of the hundred-and-eighty-second through the hundred-and-ninetieth aspects, wherein the ionic additive comprises an ionic liquid, and wherein the ionic liquid is miscible or partially miscible with the at least one polymerizable vinyl monomer.

A hundred-and-ninety-second aspect, which is the dielectric polymeric composition of the hundred-and-ninety-first aspect, wherein the ionic liquid comprises an organic cation comprising a substituted or unsubstituted imidazolium cation, a substituted or unsubstituted N-alkyl pyridinium cation, a substituted or unsubstituted N,N-dialkyl pyrrolidinium cation, a substituted or unsubstituted piperidinium cation, a substituted or unsubstituted morpholinium cation, a trialkyl sulfonium cation, a tetraalkyl phosphonium cation, an aryl phosphonium cation, or combinations thereof.

A hundred-and-ninety-third aspect, which is the dielectric polymeric composition of any one of the hundred-and-eighty-second through the hundred-and-ninetieth aspects, wherein the ionic additive comprises a metal salt of an unsaturated carboxylic acid.

A hundred-and-ninety-fourth aspect, which is the dielectric polymeric composition of the hundred-and-ninety-third aspect, wherein the metal salt of an unsaturated carboxylic acid comprises zinc diacrylate, zinc dimethacrylate, zinc dicinnamate, or combinations thereof.

A hundred-and-ninety-fifth aspect, which is the dielectric polymeric composition of any one of the hundred-and-ninety-third and the hundred-and-ninety-fourth aspects, wherein the dielectric polymeric composition comprises ionic crosslinks between metal cation of the metal salt of an unsaturated carboxylic acid and structural units derived from the unsaturated carboxylic acid.

A hundred-and-ninety-sixth aspect, which is a method for making a dielectric polymeric composition, the method comprising (a) subjecting a mixture comprising an ionic additive and a polymerizable precursor comprising at least one polymerizable vinyl monomer to in situ polymerization conditions to form a precursor dielectric polymeric composition, wherein the ionic additive comprises a cation and a balancing anion, wherein the precursor dielectric polymeric composition comprises a polymeric matrix, the ionic additive, and unreacted polymerizable vinyl monomer, and wherein the polymeric matrix comprises polymerized vinyl monomer, and wherein the ionic additive is compatible or partially compatible with the polymeric matrix; and (b) removing at least a portion of the unreacted polymerizable vinyl monomer from the precursor dielectric polymeric composition to form the dielectric polymeric composition of any one of the hundred-and-eighty-second through the hundred-and-ninety-fifth aspects; wherein the dielectric polymeric composition comprises the polymeric matrix, the ionic additive, and less than about 10 ppm of unreacted polymerizable vinyl monomer, based on the total weight of the dielectric polymeric composition, wherein an amount of unreacted polymerizable vinyl monomer in the dielectric polymeric composition is measured via high performance liquid chromatography (HPLC); and wherein the concentration of the ionic additive in the dielectric polymeric composition ranges from about 0.5 wt. % to about 30 wt. %.

A hundred-and-ninety-seventh aspect, which is an apparatus comprising a mechanical sensor comprising the dielectric polymeric composition of any one of the hundred-and-eighty-second through the hundred-and-ninety-fifth aspects.

A hundred-and-ninety-eighth aspect, which is an apparatus comprising a mechanical actuator comprising the dielectric polymeric composition of any one of the hundred-and-eighty-second through the hundred-and-ninety-fifth aspects.

A hundred-and-ninety-ninth aspect, which is an electronic device comprising (i) a display device; and (ii) an array of electronic components, wherein the array of electronic components is proximal to the display device, and wherein each electronic component of the array of electronic components comprises the dielectric polymeric composition of any one of the hundred-and-eighty-second through the hundred-and-ninety-fifth aspects.

While embodiments of the disclosure have been shown and described, modifications thereof can be made without departing from the spirit and teachings of the invention. The embodiments and examples described herein are exemplary only, and are not intended to be limiting. Many variations and modifications of the invention disclosed herein are possible and are within the scope of the invention.

Accordingly, the scope of protection is not limited by the description set out above but is only limited by the claims which follow, that scope including all equivalents of the subject matter of the claims. Each and every claim is incorporated into the specification as an embodiment of the present invention. Thus, the claims are a further description and are an addition to the detailed description of the present invention. The disclosures of all patents, patent applications, and publications cited herein are hereby incorporated by reference.

What is claimed is:
1. A dielectric polymeric composition comprising:
(a) a polymeric matrix, wherein the polymeric matrix comprises structural units derived from at least one polymerizable vinyl monomer and (ii) a crosslinking agent, structural units derived from a polymerizable co-monomer, or both a crosslinking agent and struc- tural units derived from a polymerizable co-monomer; wherein the polymerizable co-monomer comprises at least one functional group that has the ability to form hydrogen bonds within the polymeric matrix; and wherein, when the crosslinking agent is present, the polymeric matrix comprises covalent crosslinks between the crosslinking agent and the structural units derived from the at least one polymerizable vinyl monomer;

(b) an ionic liquid, wherein the ionic liquid comprises an organic cation and a balancing anion, wherein the ionic liquid is miscible or partially miscible with the at least one polymerizable vinyl monomer, and wherein the concentration of the ionic liquid in the dielectric polymeric composition ranges from about 0.5 wt. % to about 30 wt. %; and (c) less than about 10 ppm of unreacted polymerizable vinyl monomer, based on the total weight of the dielectric polymeric composition, wherein an amount of unreacted polymerizable vinyl monomer in the dielectric polymeric composition is measured via high performance liquid chromatography (HPLC).

2. The dielectric polymeric composition of claim 1, wherein the dielectric polymeric composition comprises a continuous polymeric phase comprising the polymeric matrix having dispersed therein an ionic liquid dispersed phase, wherein the ionic liquid dispersed phase comprises the ionic liquid.

3. The dielectric polymeric composition of claim 2, wherein the ionic liquid is compatible with the polymeric matrix, and wherein a difference between a glass transition temperature ($T_g$) of the polymeric matrix and a $T_g$ of the dielectric polymeric composition is equal to or greater than about 25° C.

4. The dielectric polymeric composition of claim 3, wherein the ionic liquid dispersed phase has an average cross section size of less than about 200 nm; and wherein the dielectric polymeric composition is transparent.

5. The dielectric polymeric composition of claim 2, wherein the ionic liquid is partially compatible with the polymeric matrix, and wherein a difference between a $T_g$ of the polymeric matrix and a $T_g$ of the dielectric polymeric composition is from about 5° C. to about 25° C.

6. The dielectric polymeric composition of claim 5, wherein the ionic liquid dispersed phase has an average cross section size of equal to or greater than about 200 nm.

7. The dielectric polymeric composition of claim 1, wherein the concentration of the ionic liquid in the dielectric polymeric composition ranges from about 1 wt. % to about 10 wt. %.

8. The dielectric polymeric composition of claim 1, wherein the ionic liquid imparts flexibility to the dielectric polymeric composition, wherein the dielectric polymeric composition is characterized by a storage modulus that is lower than the storage modulus of the polymeric matrix in the absence of the ionic liquid.

9. The dielectric polymeric composition of claim 1, wherein the at least one polymerizable vinyl monomer comprises at least one polymerizable acrylate monomer and wherein the at least one polymerizable acrylate monomer comprises methyl acrylate, ethyl acrylate, methacrylate, methyl methacrylate (MMA), butyl methacrylate, or combinations thereof.

10. The dielectric polymeric composition of claim 1, wherein the dielectric polymeric composition is ferroelectric.

11. The dielectric polymeric composition of claim 1, wherein the dielectric polymeric composition is characterized by a low polarization loss, and wherein the polarization loss is less than about 35%.

12. The dielectric polymeric composition of claim 1, wherein the dielectric polymeric composition is characterized by a maximum polarization of equal to or greater than about 0.4 µC/cm$^2$, under an applied electric field of 150 kV/cm.

13. The dielectric polymeric composition of claim 1, wherein the dielectric polymeric composition is characterized by a remnant polarization of equal to or greater than about 0.1 µC/cm$^2$, subsequent to removal of an applied electric field of 150 kV/cm.

14. The dielectric polymeric composition of claim 1, wherein the dielectric polymeric composition is characterized by a coercive field of equal to or greater than about 20 kV/cm, under an applied electric field of 150 kV/cm.

15. A method for making a dielectric polymeric composition, the method comprising:

(a) subjecting a mixture comprising an ionic liquid and a polymerizable precursor comprising at least one polymerizable vinyl monomer to in situ polymerization conditions to form a precursor dielectric polymeric composition, wherein the polymerizable precursor comprises a polymerizable co-monomer, a crosslinking agent, or both a polymerizable co-monomer and a crosslinking agent, wherein the ionic liquid comprises an organic cation and a balancing anion, wherein the precursor dielectric polymeric composition comprises a polymeric matrix, the ionic liquid, unreacted polymerizable vinyl monomer and optionally unreacted polymerizable co-monomer, wherein the polymeric matrix comprises polymerized vinyl monomer and optionally polymerized co-monomer, wherein the polymerizable co-monomer comprises at least one functional group that has the ability to form hydrogen bonds within the polymeric matrix, wherein the crosslinking agent, when present, covalently crosslinks the polymeric matrix, and wherein the ionic liquid is compatible or partially compatible with the polymeric matrix; and (b) removing at least a portion of the unreacted polymerizable vinyl monomer from the precursor dielectric polymeric composition to form the dielectric polymeric composition; wherein the dielectric polymeric composition comprises the polymeric matrix, the ionic liquid, and less than about 10 ppm of unreacted polymerizable vinyl monomer, based on the total weight of the dielectric polymeric composition, wherein an amount of unreacted polymerizable vinyl monomer in the dielectric polymeric composition is measured via high performance liquid chromatography (HPLC); and wherein the concentration of the ionic liquid in the dielectric polymeric composition ranges from about 0.5 wt. % to about 30 wt. %.

16. The method of claim 15, wherein the ionic liquid is miscible or partially miscible with the at least one polymerizable vinyl monomer.

17. The dielectric polymeric composition of claim 1, wherein the at least one functional group that has the ability to form hydrogen bonds within the polymeric matrix is selected from the group consisting of a hydroxyl group, a carboxyl group, an amino group, an imino group, and combinations thereof.

18. The dielectric polymeric composition of claim 1, wherein the crosslinking agent comprises tetraethylene glycol diacrylate (TEGDA), tetraethylene glycol dimethacrylate (TEGDMA), ethylene glycol dimethacrylate (EGDMA), diethylene glycol dimethacrylate (DEGDMA), hexamethylene glycol dimethacrylate(HMGDMA), polyethylene glycol diacrylate (PEGDA), polyethylene glycol dimethacrylate (PEGDMA), trimethylol propane triacrylate (TMPTA), or combinations thereof.

* * * * *